(12) United States Patent
Kurokawa

(10) Patent No.: US 7,675,808 B2
(45) Date of Patent: Mar. 9, 2010

(54) SEMICONDUCTOR DEVICE

(75) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/802,462

(22) Filed: May 23, 2007

(65) Prior Publication Data

US 2007/0280028 A1 Dec. 6, 2007

(30) Foreign Application Priority Data

May 25, 2006 (JP) ............................. 2006-145970

(51) Int. Cl.
*G11C 8/00* (2006.01)
(52) U.S. Cl. .................. 365/230.03; 345/536; 345/537; 345/538; 711/100
(58) Field of Classification Search ............ 365/230.03; 345/536, 537, 538; 711/100
See application file for complete search history.

(56) References Cited

U.S. PATENT DOCUMENTS

| | | | |
|---|---|---|---|
| 5,093,809 A | 3/1992 | Schmitt-Landsiedel et al. | |
| 6,029,006 A | 2/2000 | Alexander et al. | |
| 6,031,781 A | 2/2000 | Tsuji et al. | |
| 6,498,396 B1 | 12/2002 | Arimoto | |
| 6,826,705 B2 | 11/2004 | Tani | |
| 7,287,115 B2 * | 10/2007 | Otani et al. ..................... | 711/5 |
| 2003/0098875 A1 * | 5/2003 | Kurokawa et al. .......... | 345/698 |
| 2003/0103025 A1 | 6/2003 | Kurokawa et al. | |
| 2005/0091550 A1 | 4/2005 | Tani | |
| 2006/0011846 A1 | 1/2006 | Ozaki | |
| 2007/0028194 A1 | 2/2007 | Kurokawa | |

FOREIGN PATENT DOCUMENTS

EP 0851336 7/1998

(Continued)

OTHER PUBLICATIONS

Dembo H. et al., "RFCPUs on Glass and Plastic Substrates fabricated by TFT Transfer Technology",IEEE, Technical Digest of International Electronic Devices Meeting, Dec. 5, 2005, pp. 1067-1069.

(Continued)

*Primary Examiner*—Amir Zarabian
*Assistant Examiner*—Fernando N Hidalgo
(74) *Attorney, Agent, or Firm*—Eric J. Robinson; Robinson Intellectual Property Law Office, P.C.

(57) ABSTRACT

An object is to realize high-capacity of a memory while reducing power consumption and making the power consumption even throughout the memory. A memory includes a plurality of memory block arranged to be symmetrically to each other. Also, a specific combination of signals among address signals supplied to the memory, a memory block including a memory cell to be read from or written to is specified. Further, signals supplied to other memory blocks than the above memory block is maintained at a constant value. Consequently, a wiring length of a bit line in a memory array can be shortened, and current consumption can be made to be even among data reading or writing from/to memory cells of a variety of addresses within the memory, at the same time as reducing load capacitance.

12 Claims, 27 Drawing Sheets

FOREIGN PATENT DOCUMENTS

| | | |
|---|---|---|
| JP | 10-199253 | 7/1998 |
| JP | 11-296627 | 10/1999 |
| JP | 2001-189347 | 7/2001 |
| JP | 2002-026803 | 1/2002 |
| WO | WO2005-073904 | 8/2005 |

OTHER PUBLICATIONS

Kurokawa Y. et al., "UHF RFCPUs on Flexible and Glass Substrates for Secure RFID Systems", ISSCC 2007 (Digest of Technical Papers. IEEE International Solid-State Circuits Conference), Feb. 14, 2007, pp. 574-575.

International Search Report (Application No. PCT/JP2007/060655) Dated Sep. 11, 2007.

Written Opinion (Application No. PCT/JP2007/060655) Dated Sep. 11, 2007.

Dembo et al., "RFCPUs on Glass and Plastic Substrates Fabricated by TFT Transfer Technology", IEDM 05: Technical Digest of International Electron Devices Meeting, Dec. 5, 2005, pp. 1067-1069.

* cited by examiner 1601
1602

1601  1603

1601
1604

1601
1605

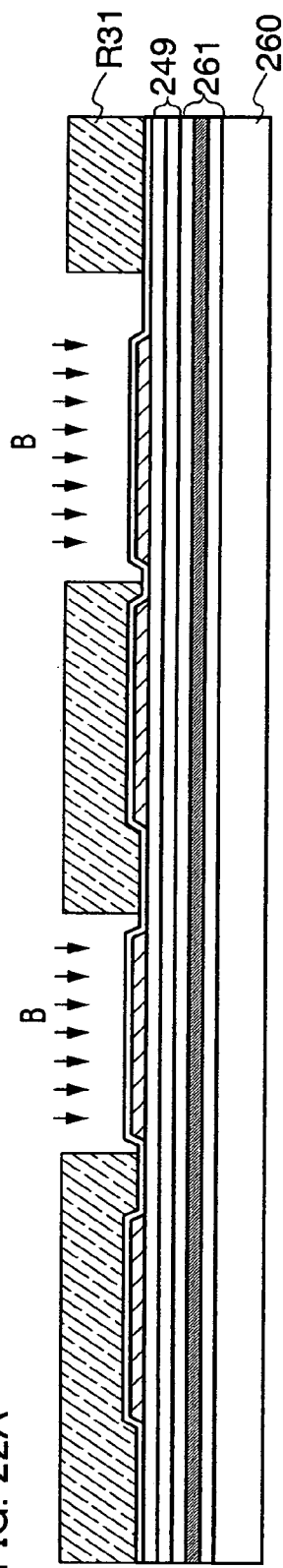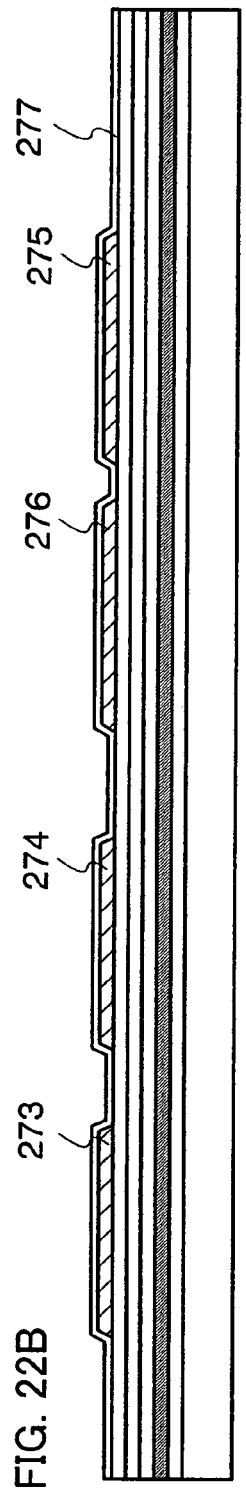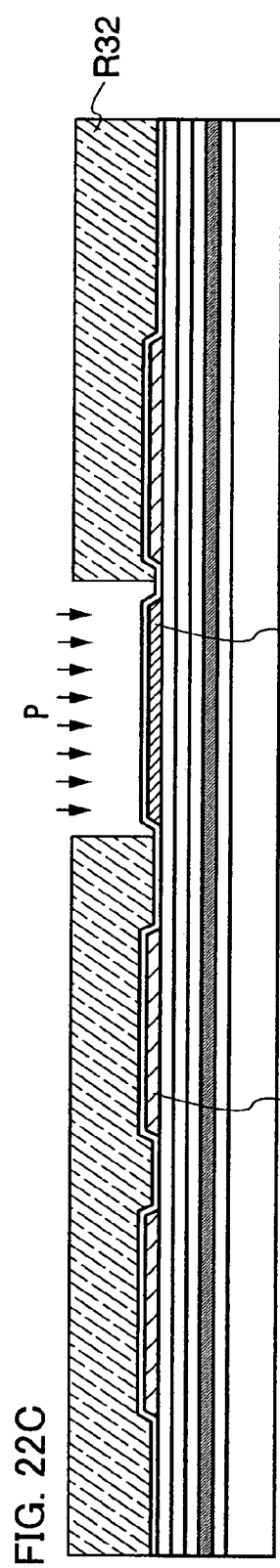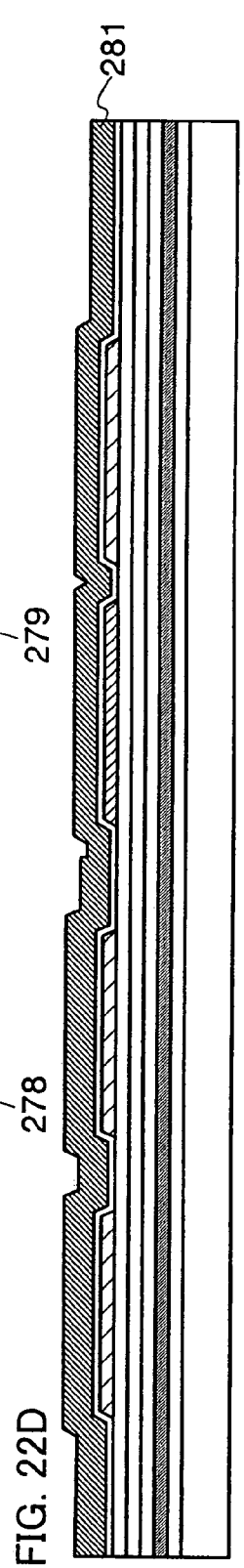

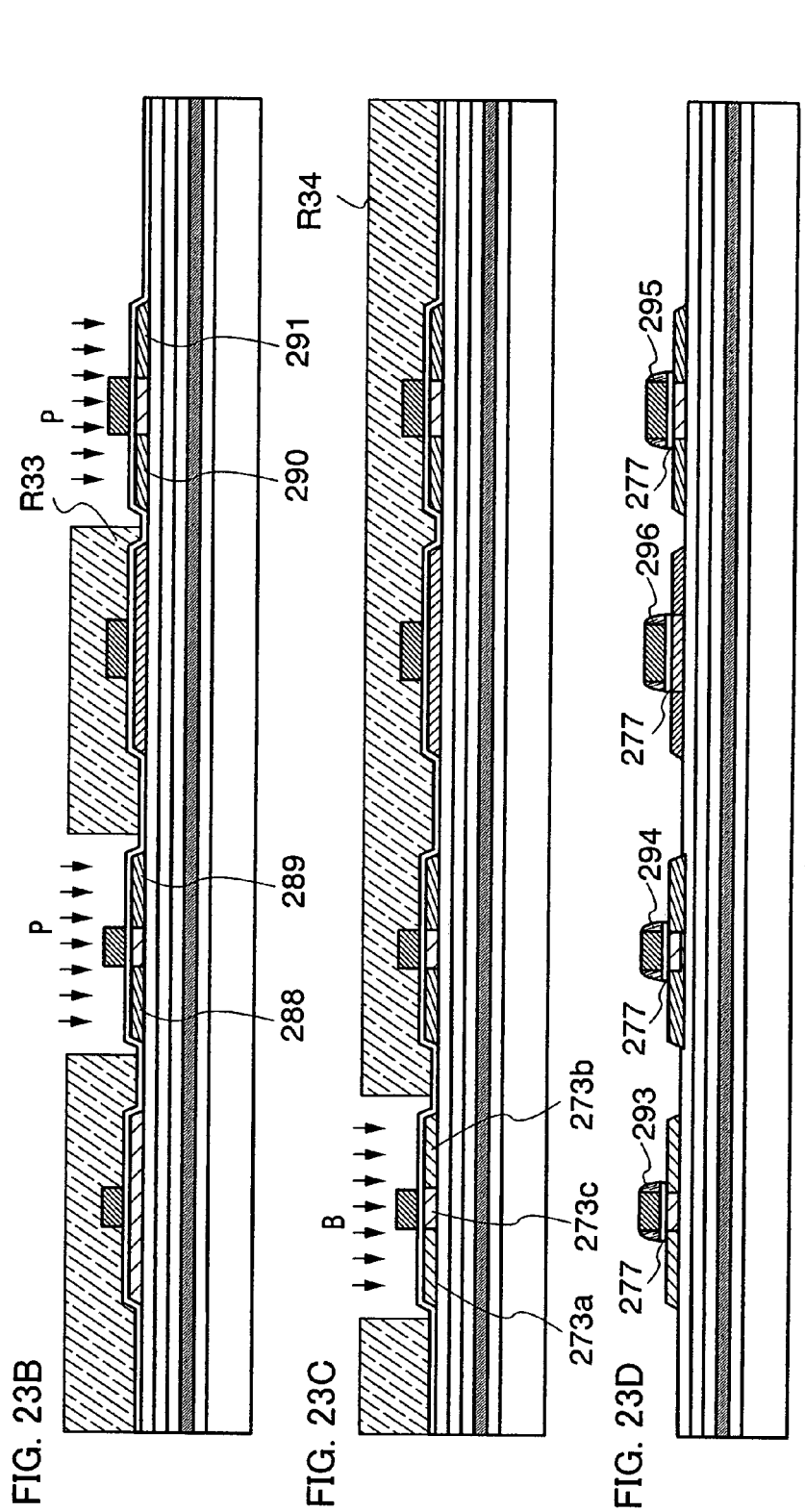

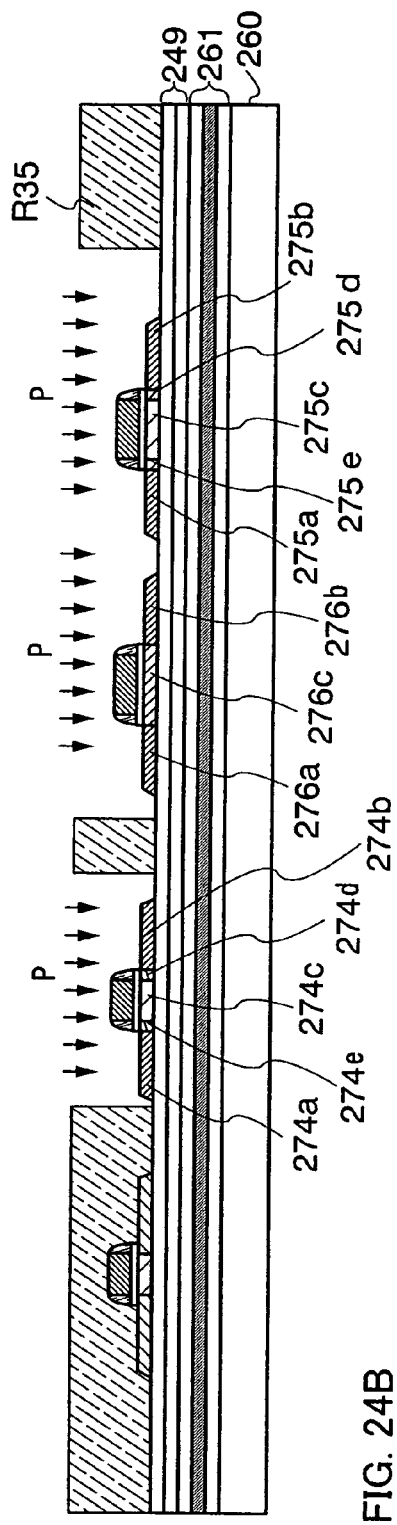
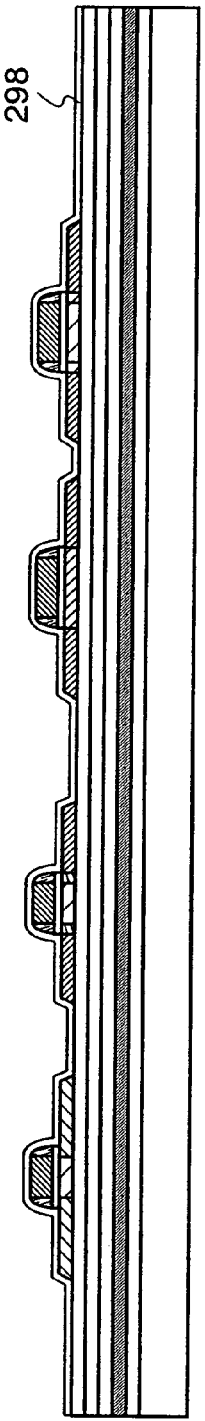

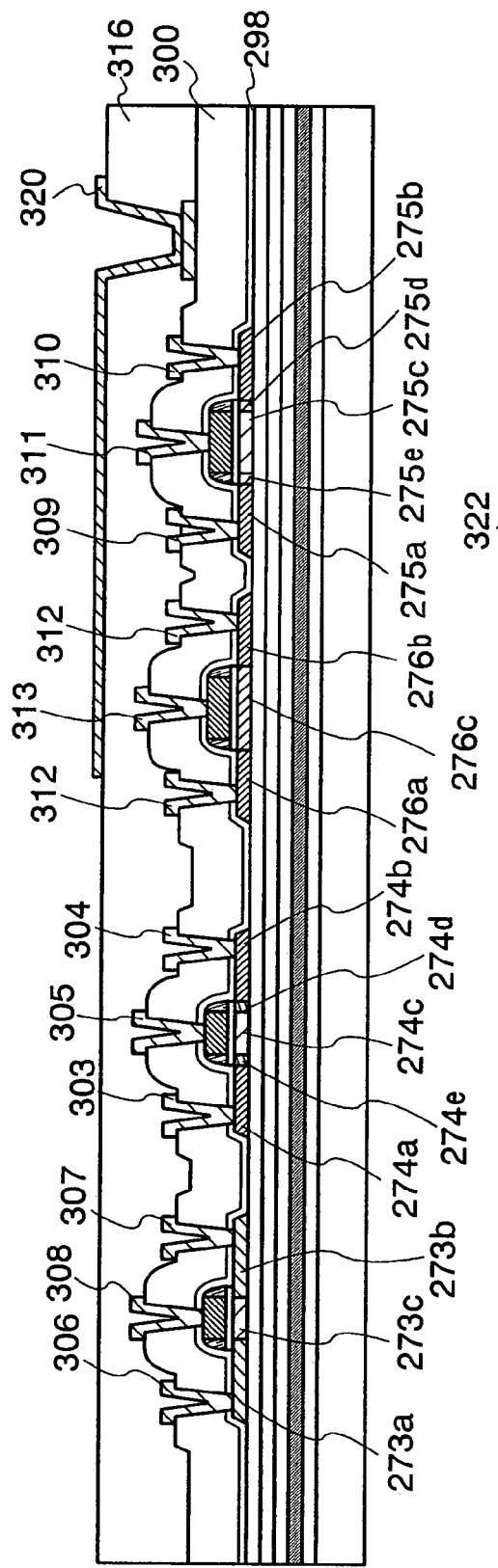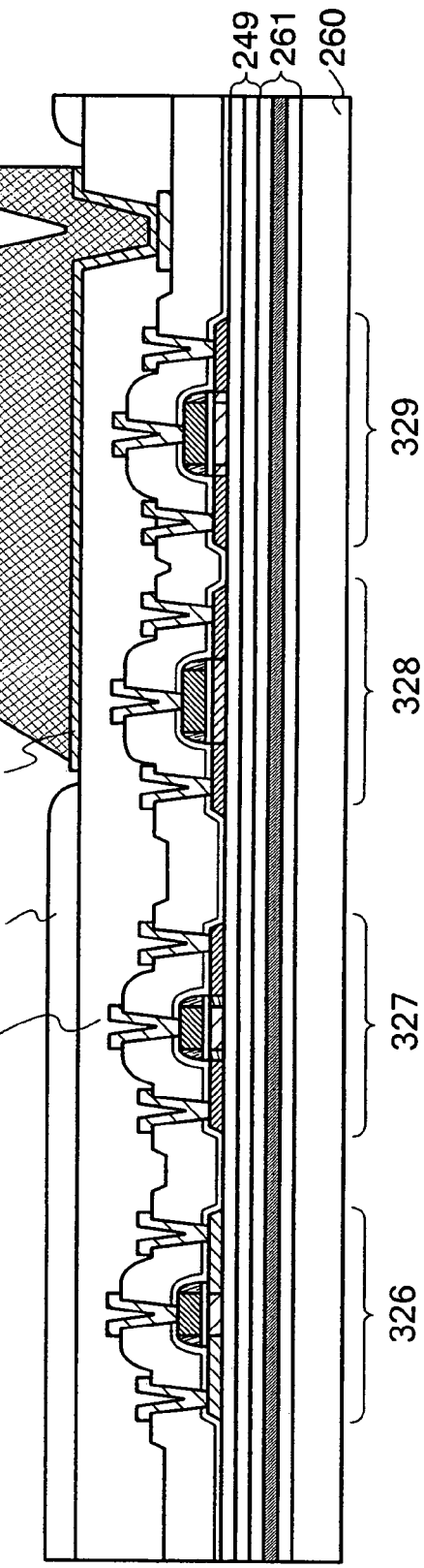
FIG. 25A
FIG. 25B

3000

3000

3000

3000

3000

3000

SEMICONDUCTOR DEVICE

TECHNICAL FIELD

The present invention relates to a semiconductor device. In particular, the present invention relates to a semiconductor device mounted with a memory.

BACKGROUND ART

In a semiconductor device mounted with a memory, the performance of the memory is extremely important in determining the performance of the semiconductor device. For example, in a semiconductor device mounted with a CPU and a memory, commands to be processed by the CPU and data necessary for the processing need to be stored in the memory. Also, processing by the CPU is progressed by sequential reading of the data in the memory. In other words, in a semiconductor device mounted with a CPU and a memory, in order to achieve higher performance, the CPU needs to be able to handle more complicated processes, and this calls for a high-capacity memory. Furthermore, in a semiconductor device mounted with a memory, the power consumption of the memory accounts for a large share of the power consumption of the semiconductor device, in many cases.

In Non-Patent Document 1, which one of the present inventors co-wrote, an RFID mounted with a CPU and a memory is disclosed. For such an RFID, a difficult performance of achieving both an increase in memory capacity and reduction in power consumption is called for in order to achieve higher performance.

[Non-Patent Document 1]
Hiroki Dembo, et al. "RFCPUs on Glass and Plastic Substrates fabricated by TFT Transfer Technology" IEEE, TECHNICAL DIGEST OF INTERNATIONAL ELECTRONIC DEVICES MEETING, Dec. 5, 2005, pp. 1067-1069.

DISCLOSURE OF INVENTION

In order to provide a high-performance semiconductor device with low power consumption, it is necessary to realize a high-capacity memory with low power consumption. However, a high-capacity memory generally has high power consumption. In other words, there is a trade-off between performance and power consumption in a semiconductor device mounted with a memory. Also, in a high-capacity memory, power consumption differs depending on a physical address of a memory cell to be read from or written to. Therefore, in consideration of the maximum power consumption of a memory, it is necessary to provide measures for power source allotment and heat dissipation in designing a semiconductor device mounted with a memory. Accordingly, in order to provide a high-performance semiconductor device with low power consumption, it is necessary to mount a high-capacity memory with which power consumption can be reduced as well as with which power consumption can be made to be constant throughout the memory.

The present invention is made in view of the above problems, and a memory mounted to a semiconductor device includes a plurality of memory blocks, each including memory cells arranged in a matrix form. Note that the plurality of memory blocks included in the memory are arranged to be symmetrical. By arranging them in this manner, a wiring length of a bit line in a memory array can be shortened, and current consumption can be made to be even among data reading or writing from/to memory cells of a variety of addresses within the memory, at the same time as reducing load capacitance.

Also, a memory block including a memory cell to be read from or written to can be specified by a combination of some potentials among a plurality of address signals supplied to the memory. In such a memory, by the combination of the potentials of the address signals that can specify the memory block, at least one of address signals, reading control signals, writing control signals, and writing data signals supplied to memory blocks other than the above memory block has a constant value that is not dependent on a value of address signals, reading control signals, writing control signals, and writing data signals supplied to the memory. Accordingly, power consumption by a memory block that is irrelevant to data reading or writing can be reduced.

Note that the memory blocks can also have a hierarchical structure. That is, in a memory including first to n-th tiers ($n \geq 1$), a plurality of memory blocks are arranged in an m-th tier ($1 \leq m \leq n-1$) to form a memory block in an (m+1)-th tier, and a plurality of memory blocks in the n-th tier are arranged to form the memory. Note that the memory block in the (m+1)-th tier includes memory blocks in the m-th tier which are arranged symmetrically. Also, the memory includes the memory blocks in the n-th tier which are arranged symmetrically. Accordingly, current consumption can be made to be even among data reading or writing from/to memory cells of a variety of addresses within the memory.

Also, in the first to n-th tiers, each memory block including a memory cell from/to which data reading or writing is carried out can be specified by a combination of some potentials among a plurality of address signals supplied to the memory. In such a memory, in the first to n-th tiers, by the combination of the potentials of the address signals that can specify the memory block in each of the first to n-th tiers, at least one of address signals, reading control signals, writing control signals, and writing data signals supplied to memory blocks other than the memory block in the first to n-th tiers has a constant value that is not dependent on a value of address signals, reading control signals, writing control signals, and writing data signals supplied to the memory. Accordingly, power consumption by a memory block that is irrelevant to data reading or writing can be reduced.

With a structure such as the foregoing, a high-performance and low and even power consumption semiconductor device including a high-capacity memory that has low and even power consumption can be provided.

Note that in this specification, a semiconductor device is a device in general that function by utilizing a semiconductor characteristic.

Further, in addition to a predetermined connection relationship, electrical connection may also be a case in which another element capable of electrical connection, such as a switch, a transistor, a capacitor, an inductor, a resistor, or a diode is provided.

A structure of the present invention disclosed in this specification is a semiconductor device mounted with a plurality of first-tier memory blocks and a second-tier memory block. The second-tier memory block includes a second-tier memory block operation control circuit, a second-tier memory block input signal control circuit, a second-tier memory block output signal control circuit, a second-tier memory block address signal line, a second-tier memory block reading data signal line, a second-tier memory block writing data signal line, a second-tier memory block reading control signal line, and a second-tier memory block writing control signal line.

In the present invention, each first-tier memory block includes a plurality of memory cells having a function of retaining a potential and a function of outputting the retained potential; a first-tier memory block address signal line; a first-tier memory block reading data signal line; a first-tier memory block writing data signal line; a first-tier memory block reading control signal line; and a first-tier memory block writing control signal line. Further, each first-tier memory block has a function of outputting a potential stored in a memory cell that is determined by a state of a potential supplied from the first-tier memory block address signal line, to the first-tier memory block reading data signal line, depending on a potential supplied from the first-tier memory block reading control signal line; and a function of storing a potential of the first-tier memory block writing data signal line in the memory cell that is determined by a state of a potential supplied form the first-tier memory block address signal line, depending on a potential supplied from the first-tier memory block writing control signal line.

In the present invention, the second-tier memory block operation control circuit has a function of generating a potential to be supplied to the second-tier memory block operation control signal line depending on a state of a potential supplied from the second-tier memory block address signal line. Also, the second-tier memory block input signal control circuit has a function of generating a potential of the first-tier memory block address signal line from a potential supplied from the second-tier memory block address signal line, depending on a state of a potential of the second-tier memory block operation control signal line; a function of generating a potential to be supplied to the first-tier memory block writing data signal line from a potential supplied from the second-tier memory block writing data signal line; a function of generating a potential to be supplied to the first-tier memory block reading control signal line from a potential supplied from the second-tier memory block reading control signal line; and a function of generating a potential supplied to the first-tier memory block writing control signal line from a potential supplied from the second-tier memory block writing control signal line.

Also, the second-tier memory block output signal control circuit has a function of generating a potential to be supplied to the second-tier memory block reading data signal line from a potential supplied to the first-tier memory block reading data signal line, depending on a state of a potential of the second-tier memory block operation control signal line.

Further, another structure of the present invention disclosed in this specification is a semiconductor device mounted with a plurality of the first-tier memory blocks, a plurality of the second-tier memory blocks, and a third-tier memory block. Each second-tier memory block includes the second-tier memory block operation control circuit, the second-tier memory block input signal control circuit, the second-tier memory block output signal control circuit, the second-tier memory block address signal line, the second-tier memory block reading data signal line, the second-tier memory block writing data signal line, the second-tier memory block reading control signal line, and the second-tier memory block writing control signal line. Also, the third-tier memory block includes a third-tier memory block operation control circuit, a third-tier memory block input signal control circuit, a third-tier memory block output signal control circuit, a third-tier memory block address signal line, a third-tier memory block reading data signal line, a third-tier memory block writing data signal line, a third-tier memory block reading control signal line, and a third-tier memory block writing control signal line.

In the foregoing structure, each first-tier memory block includes a plurality of memory cells each having a function of retaining a potential and a function of outputting the retained potential; the first-tier memory block address signal line; the first-tier memory block reading data signal line; the first-tier memory block writing data signal line; the first-tier memory block reading control signal line; and the first-tier memory block writing control signal line. Further, each first-tier memory block has a function of outputting a potential stored in a memory cell that is determined by a state of a potential supplied from the first-tier memory block address signal line, to the first-tier memory block reading data signal line, depending on a potential supplied from the first-tier memory block reading control signal line; and a function of storing a potential of the first-tier memory block writing data signal line in a memory cell that is determined by a state of a potential supplied from the first-tier memory block address signal line, depending on a potential supplied from the first-tier memory block writing control signal line.

The second-tier memory block operation control circuit has a function of generating a potential to be supplied to the second-tier memory block operation control signal line depending on a state of a potential supplied from the second-tier memory block address signal line. Also, the second-tier memory block input signal control circuit has a function of generating a potential of the first-tier memory block address signal line from a potential supplied from the second-tier memory block address signal line depending on a state of a potential of the second-tier memory block operation control signal line; a function of generating a potential to be supplied to the first-tier memory block writing data signal line from a potential supplied from the second-tier memory block writing data signal line; a function of generating a potential to be supplied to the first-tier memory block reading control signal line from a potential supplied from the second-tier memory block reading control signal line; and a function of generating a potential to be supplied to the first-tier memory block writing control signal line from a potential supplied from the second-tier memory block writing control signal line.

Furthermore, the second-tier memory block output signal control circuit has a function of generating a potential to be supplied to the second-tier memory block reading data signal line from a potential supplied from the first-tier memory block reading data signal line, depending on a state of a potential of the second-tier memory block operation control signal line.

In addition, the third-tier memory block operation control circuit has a function of generating a potential to be supplied to the third-tier memory block operation control signal line depending on a state of a potential supplied from the third-tier memory block address signal line.

The third-tier memory block input signal control circuit has a function of generating a potential of the second-tier memory block address signal line from a potential supplied from the third-tier memory block address signal line, depending on a state of a potential of the third-tier memory block operation control signal line; a function of generating a potential to be supplied to the second-tier memory block writing data signal line from a potential supplied from the third-tier memory block writing data signal line; a function of generating a potential to be supplied to the second-tier memory block reading control signal line from a potential supplied from the third-tier memory block reading control signal line; and a function of generating a potential to be supplied to the second-tier memory block writing control signal line from a potential supplied from the third-tier memory block writing control signal line.

Also, the third-tier memory block output signal control circuit has a function of generating a potential to be supplied to the third-tier memory block reading data signal line from a potential supplied to the second-tier memory block reading data signal line, depending on a state of a potential of the third-tier memory block operation control signal line.

Further, in the foregoing structure, the third-tier memory includes the second-tier memory blocks that are arranged to be physically symmetrical to each other.

Furthermore, in the foregoing structure, the second-tier memory block may also include the first-tier memory blocks that are arranged to be physically symmetrical to each other.

In addition, the semiconductor device according to the present invention can be formed using a thin film transistor having as an active layer a semiconductor thin film formed over a substrate with an insulating surface. Note that the substrate having an insulating surface may also be any of a glass substrate, a quartz substrate, and a plastic substrate.

Also, the semiconductor device according to the present invention may be formed using an SOI substrate.

By the present invention, since a memory can be divided into a plurality of memory blocks and memory blocks other than that which includes a memory cell to be read from or written to can be in a waiting state, power consumption can be suppressed even if capacity of the memory is increased. Further, by dividing the memory into a plurality of memory blocks and arranging the memory blocks to be symmetrical to each other, load capacitance of a bit line in a memory array can be reduced, and power consumption can be made to be even among data reading or writing from/to memory cells of a variety of addresses within the memory. In other words, a high-performance and low power consumption semiconductor device including a high-capacity memory, that has low and even power consumption can be provided.

BRIEF DESCRIPTION OF DRAWINGS

In the accompanying drawings:

FIGS. 22A to 22D are cross-sectional diagrams for describing manufacturing steps of a wireless chip of the present invention;

FIGS. 23A to 23D are cross-sectional diagrams for describing manufacturing steps of a wireless chip of the present invention;

FIGS. 24A to 24C are cross-sectional diagrams for describing manufacturing steps of a wireless chip of the present invention;

FIGS. 25A and 25B are cross-sectional diagrams for describing manufacturing steps of a wireless chip of the present invention;

BEST MODE FOR CARRYING OUT THE INVENTION

Figure 1:
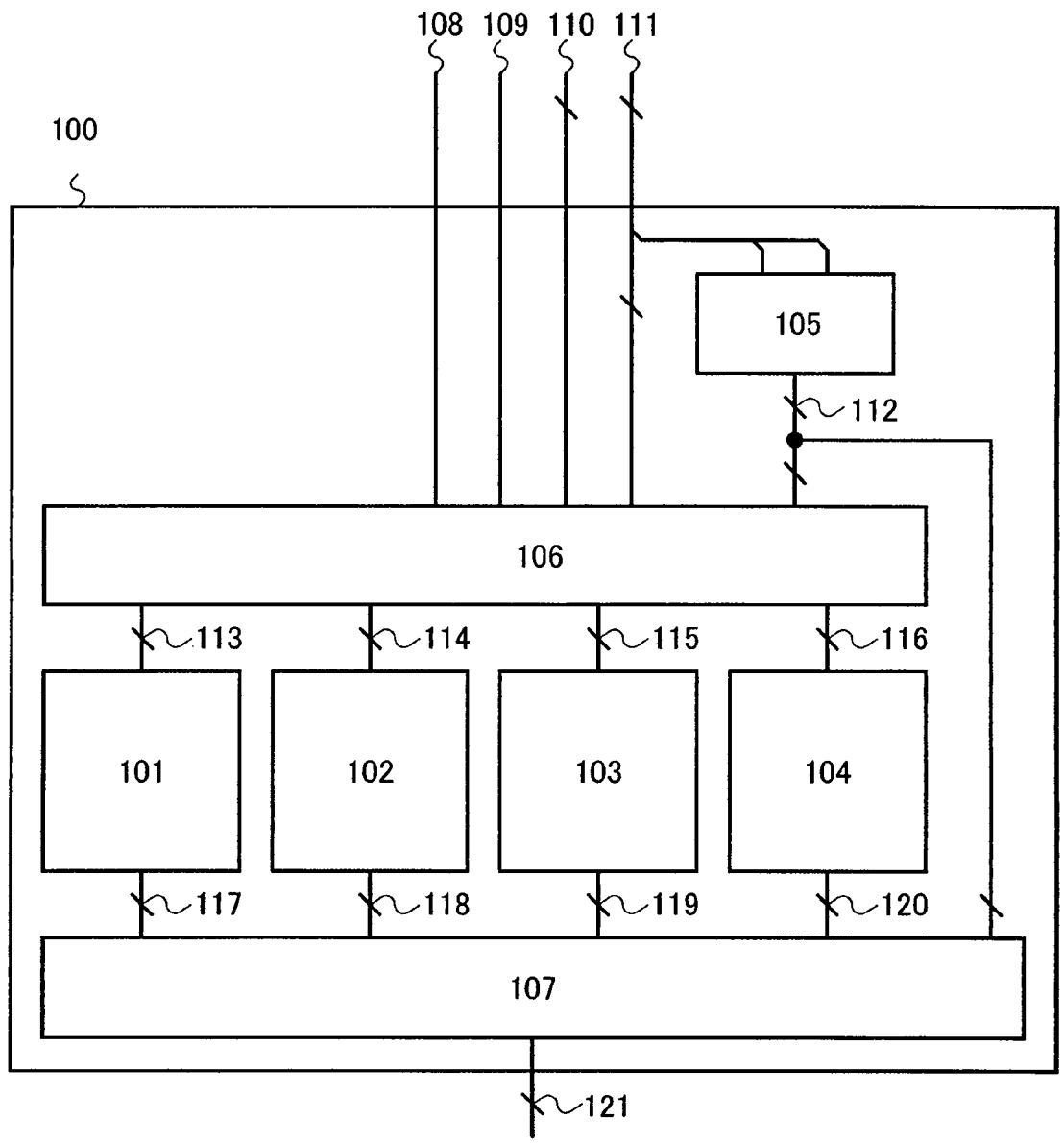
FIG. 1 is a block diagram of a memory mounted to a semiconductor device in the present invention.

Embodiment modes and embodiments of the present invention will hereinafter be described with reference to drawings. However, the present invention can be carried out in many different modes, and it is easily understood by those skilled in the art that modes and details herein disclosed can be modified in various ways without departing from the spirit and the scope of the present invention. Therefore, the present invention should not be interpreted as being limited to the description of the embodiment modes and embodiments to be given below. Note that in all drawings for describing the embodiment modes and embodiments, the same reference numerals are used for the same portions or the portions having similar functions, and repeated description thereof is omitted.

EMBODIMENT MODE 1

Figure 2:
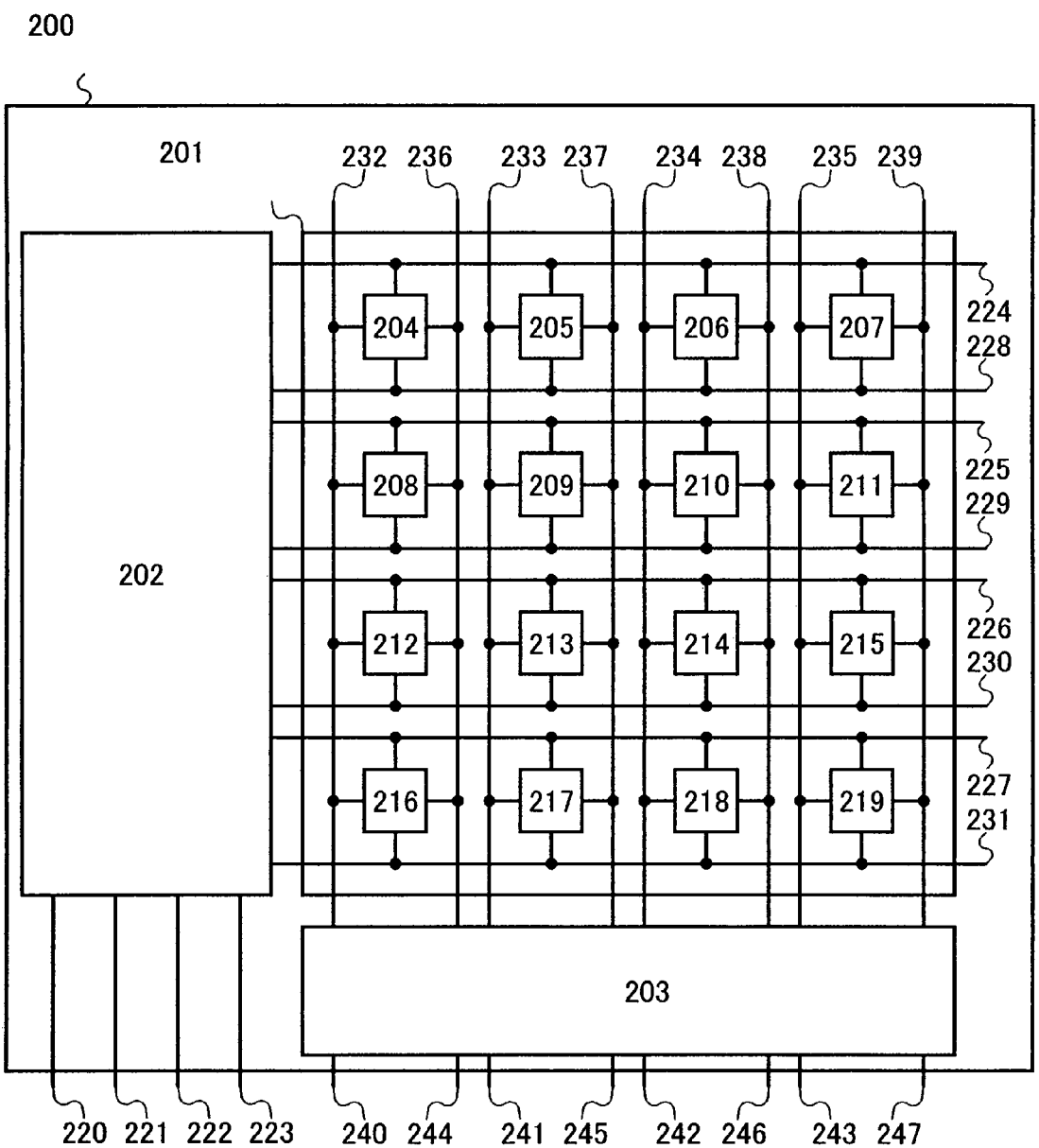
FIG. 2 is a block diagram of a memory block forming a memory mounted to a semiconductor device in the present invention.
Figure 3:
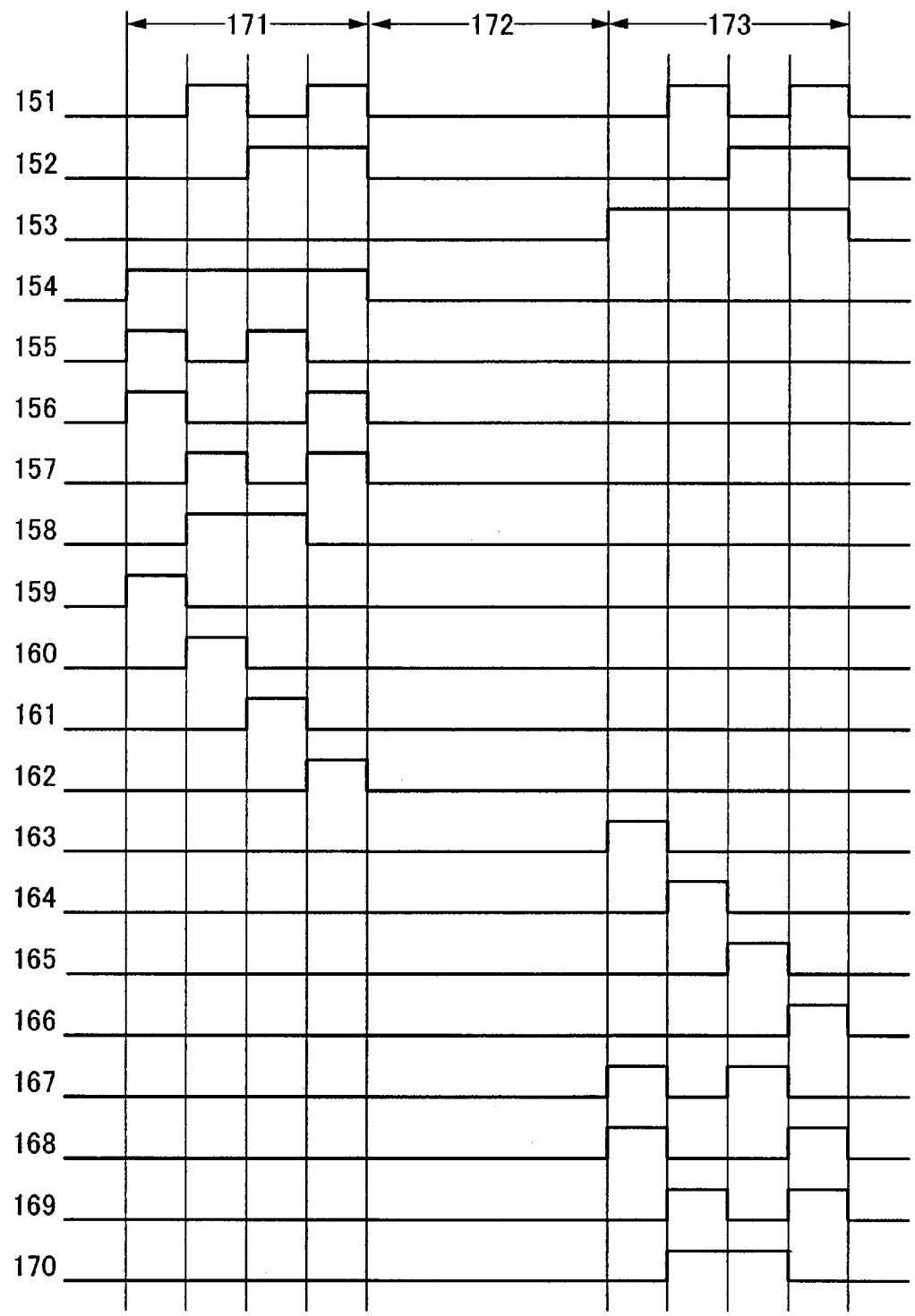
FIG. 3 is a timing chart of a memory block forming a memory mounted to a semiconductor device in the present invention.
Figure 4:
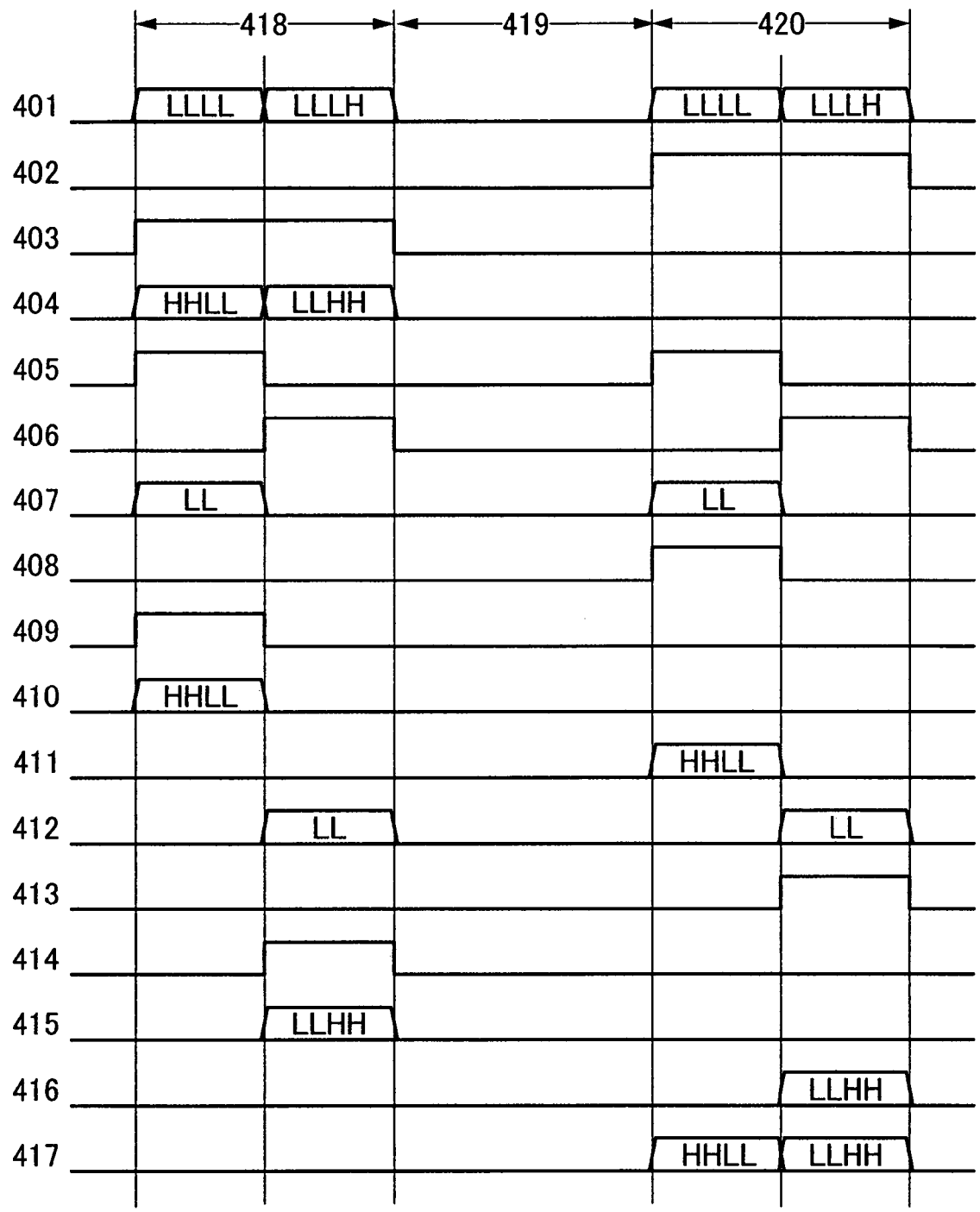
FIG. 4 is a timing chart of a memory mounted to a semiconductor device in the present invention.

A first embodiment mode of a memory mounted to a semiconductor device of the present invention is described with reference to FIGS. 1 to 4. FIG. 1 is a block diagram of a memory of this embodiment mode; FIG. 2 is a block diagram of a memory block included in the memory of this embodiment mode; FIG. 3 is a timing chart of the memory block included in the memory of this embodiment mode; and FIG. 4 is a timing chart of the memory of this embodiment mode.

As shown in FIG. 1, a memory 100 of this embodiment mode includes first to fourth memory blocks 101 to 104, an operation control circuit 105, an input signal control circuit 106, and an output signal control circuit 107. Note that each of the first to fourth memory blocks 101 to 104 is a memory block 200 in FIG. 2.

Note that in this embodiment mode, a case of a memory including four memory blocks is described, in which a memory address signal is 4 bits, that is, 16 words, and a memory reading/writing data signal is 4 bits. In general, a memory with a memory address signal of a bits (a≧1), a memory reading data signal of b bits (b≧1), and a memory writing data signal of c bits (c≧1) can include d pieces (d≧1) of memory blocks.

In FIG. 2, the memory block 200 includes a memory array 201, a row decoder 202, and an RW circuit 203.

The memory array 201 includes first to sixteenth memory cells 204 to 219, which are arranged in a four-by-four matrix.

In the memory array 201, a first reading word signal line 224 and a first writing word signal line 228 are each electrically connected to the first to fourth memory cells 204 to 207; a second reading word signal line 225 and a second writing word signal line 229 are each electrically connected to the fifth to eighth memory cells 208 to 211; a third reading word signal line 226 and a third writing word signal line 230 are each electrically connected to the ninth to twelfth memory cells 212 to 215; and a fourth reading word signal line 227 and a fourth writing word signal line 231 are each electrically connected to the thirteenth to sixteenth memory cells 216 to 219.

Also, in the memory array 201, a first reading bit signal line 232 and a first writing bit signal line 236 are each electrically connected to the first, fifth, ninth, and thirteenth memory cells 204, 208, 212, and 216; a second reading bit signal line 233 and a second writing bit signal line 237 are each electrically connected to the second, sixth, tenth, and fourteenth memory cells 205, 209, 213, and 217; a third reading bit signal line 234 and a third writing bit signal line 238 are each electrically connected to the third, seventh, eleventh, and fifteenth memory cells 206, 210, 214, and 218; and a fourth reading bit signal line 235 and a fourth writing bit signal line 239 are each electrically connected to the fourth, eighth, twelfth, and sixteenth memory cells 207, 211, 215, and 219.

Here, for example, when a potential of the first reading word signal line 224 is "H," the first to fourth reading bit signal lines 232 to 235 come to have high potentials or low potentials depending on data stored in the first to fourth memory cells 204 to 207. Also, when a potential of the first writing word signal line 228 is "H," data is stored in the first to fourth memory cells 204 to 207, depending on potentials of the first to fourth writing bit signal lines 236 to 239.

The row decoder 202 has a function of generating first to fourth reading word signals supplied to the first to fourth reading word signal lines 224 to 227 and first to fourth writing word signals supplied to the first to fourth writing word signal lines 228 to 231, in response to first and second memory block address signals, a memory block reading control signal, and a memory block writing control signal supplied from first and second memory block address signal lines 220 and 221, a memory block reading control signal line 222, and a memory block writing control signal line 223, respectively.

In a case where, for example, the row decoder 202 has a function of making the first, second, third, and fourth reading word signals be "H," when the memory block reading control signal is "H" and combinations of potentials of the first memory block address signal and the second memory block address signal are "LL," "LH," "HL," and "HH," respectively. For example, in a case where the memory block reading control signal is "H," a potential of the first memory block address signal is "L," and a potential of the second memory block address signal is "H," the second reading word signal is made to be "H."

Also, in a case where, for example, the row decoder 202 has a function of making the first, second, third, and fourth writing word signals be "H," when the memory block writing control signal is "H" and combinations of potentials of the first memory block address signal and the second memory block address signal are "LL," "LH," "HL," and "HH," respectively. For example, in a case where the memory block writing control signal is "H," a potential of the first memory block address signal is "L," and a potential of the second memory block address signal is "H," the second writing word signal is made to be "H."

Note that in this specification, "H" denotes a high potential and "L" denotes a low potential.

The RW circuit 203 has a function of generating first to fourth memory block reading data signals, which are to be supplied to the first to fourth memory block reading data signal lines 240 to 243, from first to fourth reading bit signals supplied to the first to fourth reading bit signal lines 232 to 235, depending on data stored in the memory cells. Also, the RW circuit 203 has a function of generating first to fourth writing bit signals, which are to be supplied to the first to fourth writing bit signal lines 236 to 239, from first to fourth memory block writing data signals supplied from first to fourth memory block writing data signal lines 244 to 247.

For example, the RW circuit 203 quickly detects with a sense amplifier whether the first to fourth reading bit signal lines 232 to 235 have high potentials or low potentials, and generates the first to fourth memory block reading data signals to be supplied to the first to fourth memory block reading data signal lines 240 to 243, through a latch and a buffer. Further, the RW circuit 203 generates the first to fourth writing bit signals to be supplied to the first to fourth writing bit signal lines 236 to 239, depending on potentials of the first to fourth memory block writing data signal lines 244 to 247.

FIG. 3 is a timing chart relating to an input/output signal of the memory block 200. A timing chart of the first memory block address signal supplied from the first memory block address signal line 220 in FIG. 2 is shown by a first signal 151 in FIG. 3. Similarly, a timing chart of the second memory block address signal supplied from the second memory block address signal line 221 in FIG. 2 is shown by a second signal 152 in FIG. 3. Also, a timing chart of the memory block reading control signal supplied from the memory block reading control signal line 222 and a timing chart of the memory block writing control signal supplied from the memory block writing control signal line 223 in FIG. 2 are shown by a third signal 153 and a fourth signal 154 in FIG. 3, respectively. Further, timing charts of the first to fourth memory block writing data signals, which are supplied from the first to fourth memory block writing data signal lines 244 to 247 in FIG. 2, respectively, are shown by fifth to eighth signals 155 to 158 in FIG. 3, respectively.

Note that the RW circuit 203 has a function of generating the first to fourth writing bit signals from the first to fourth memory block writing data signals, via a buffer. In this case, timing charts of the first to fourth writing bit signals supplied to the first to fourth writing bit signal lines 236 to 239 are similar to the timing charts of the fifth to eighth signals 155 to 158 in FIG. 3.

Here, a period in which a memory block writing control signal is "H," that is, a first period 171 in FIG. 3, is to be a memory block writing period. Also, a period in which the memory block reading control signal is "H," that is, a third period 173 in FIG. 3, is to be a memory block reading period. Further, a period in which the memory block reading control signal and the memory block writing control signal are both "L," that is, a second period 172 in FIG. 3, is to be a memory block waiting period.

In the memory block writing period 171, in a case where the memory block writing control signal supplied from the memory block writing control signal line 223 in FIG. 2 is "H" and combinations of potentials of the first memory block address signal and the second memory block address signal, which are supplied from the first memory block address signal line 220 and the second memory block address signal line 221, respectively, are "LL," "LH," "HL," and "HH," respectively, the first, second, third, and fourth writing word signals become "H.". Note that the first, second, third, and fourth writing word signals refer to signals supplied from the first, second, third, and fourth writing word signal lines 228, 229, 230, and 231, respectively. Accordingly, timing charts of the first to fourth writing word signals become like those of ninth to twelfth signals 159 to 162 in FIG. 3.

Further, in a period in which the first writing word signal is "H," potentials of the first to fourth writing bit signal lines 236 to 239, that is, potentials of the first to fourth memory block writing data signals, are stored in the first to fourth memory cells 204 to 207. In other words, "H," "H," "L," and "L" are stored in the first to fourth memory cells 204 to 207 in FIG. 2, respectively. In a similar manner, "L," "L," "H," and "H" are stored in the fifth to eighth memory cells 208 to 211, respectively, in a period in which the second writing word signal is "H;" "H," "L," "L," and "H" are stored in the ninth to twelfth memory cells 212 to 215, respectively, in a period in which the third writing word signal is "H;" and "L," "H," "H," and "L" are stored in the thirteenth to sixteenth memory cells 216 to 219, respectively, in a period in which the fourth writing word signal is "H."

In a memory block reading period 173, in a case where the memory block reading control signal supplied from the memory block reading control signal line 222 in FIG. 2 is "H," the first, second, third, and fourth reading word signals become "H" when the first memory block address signal and the second memory block address signal, which are supplied from the first memory block address signal line 220 and the second memory block address signal line 221, respectively, are "LL," "LH," "HL," and "HH," respectively. Note that the first, second, third, and fourth reading word signals refer to signals supplied from the first, second, third, and fourth reading word signal lines 224, 225, 226, and 227, respectively. Accordingly, timing charts of the first to fourth reading word signals become like those of thirteenth to sixteenth signals 163 to 166 in FIG. 3.

In a period in which the first reading word signal is "H," the first to fourth reading bit signals are supplied to the first to fourth reading bit signal lines 232 to 235, depending on potentials stored in the first to fourth memory cells 204 to 207 in FIG. 2. Here, by a potential stored in the memory block writing period 171, the first to fourth reading bit signals become "H," "H," "L," and "L."

Similarly, in a period in which the second reading word signal is "H," the first to fourth reading bit signals are supplied to the first to fourth reading bit signal lines 232 to 235, depending on potentials stored in the fifth to eighth memory cells 208 to 211 in FIG. 2. Here, by a potential stored in the memory block writing period 171, the first to fourth reading bit signals become "L," "L," "H," and "H."

Further, in a period in which the third reading word signal is "H," the first to fourth reading bit signals are supplied to the first to fourth reading bit signal lines 232 to 235, depending on potentials stored in the ninth to twelfth memory cells 212 to 215 in FIG. 2. Here, by a potential stored in the memory block writing period 171, the first to fourth reading bit signals become "H," "L," "L," and "H."

Furthermore, in a period in which the fourth reading word signal is "H," the first to fourth reading bit signals are supplied to the first to fourth reading bit signal lines 232 to 235, depending on potentials stored in the thirteenth to sixteenth memory cells 213 to 219 in FIG. 2. Here, by a potential stored in the memory block writing period 171, the first to fourth reading bit signals become "L," "H, " "H," and "L."

In other words, timing charts of the first to fourth reading bit signals are seventeenth to twentieth signals 167 to 170 in FIG. 3.

Note that the RW circuit 203 has a function of generating the first to fourth memory block reading data signals from the first to fourth reading bit signals, via a buffer. In this case, timing charts of the first to fourth memory block reading data signals supplied to the first to fourth memory block reading data signal lines 240 to 243 are also similar to timing charts of the seventeenth to twentieth signals 167 to 170 in FIG. 3.

As shown in FIG. 3, in the memory block waiting period 172, signals input to the memory block, that is, the first and second memory block address signals, the memory block reading control signal, the memory block writing control signal, and the memory block writing data signal, have a constant value. In this case, since operation of the memory block is stopped, power consumption can be significantly reduced.

Here, the first to fourth memory blocks 101 to 104 in FIG. 1 are the memory block 200 in FIG. 2. Note that an input signal line of the first memory block 101 is a first memory block input signal line 113 in FIG. 1, which is the first and second memory block address signals 220 and 221, the memory block reading control signal line 222, the memory block writing control signal line 223, and the first to fourth memory block writing data signal lines 244 and 247 in FIG. 2. Also, an output signal line of the first memory block 101 is a first memory block output signal line 117 in FIG. 1, which is the first to fourth memory block reading data signal lines 240 to 243 in FIG. 2.

Similarly, input signal lines of the second to fourth memory blocks 102 to 104 are second to fourth memory block input signal lines 114 to 116 in FIG. 1, which are each the first and second memory block address signals 220 and 221, the memory block reading control signal line 222, the memory block writing control signal line 223, and the first to fourth memory block writing data signal lines 244 and 247 in FIG. 2. Also, output signal lines from the second to fourth memory blocks 102 to 104 are the second to fourth memory block output signal lines 118 to 120 in FIG. 1, which are each the first to fourth memory block reading data signal lines 240 to 243 in FIG. 2.

The operation control circuit 105 has a function of generating first to fourth memory block operation control signals from the third and the fourth memory address signals among first to fourth memory address signals supplied from a memory address bus signal line 111 including the first to fourth memory address signal lines. According to a potential of each of the foregoing first to fourth memory block operation control signals, operation of each of the first to fourth memory blocks 101 to 104 is controlled. Note that the first to fourth memory block operation control signals are supplied to a memory block operation control bus signal line 112 including first to fourth memory block operation control signal lines.

For example, in a case where the third memory address signal and the fourth memory address signal are "LL," a memory cell to be read from or written to is included in the first memory block 101. Also, in a similar manner, in a case where the third memory address signal and the fourth memory address signal are "LH," "HL," and "HH," a memory cell to be read from or written to is included in the second memory block 102, the third memory block 103, and the fourth memory block 104, respectively. That is, in a case where the third memory address signal is "L" and the fourth memory address signal is "H," the memory cell to be read from or written to is in the second memory block 102.

Here, in a case where a combination of the third memory address signal and the fourth memory address signal is "LL," the first memory block operation control signal is "H," and each of the second, third, and fourth memory block operation control signals is "L." Also, in a similar manner, in cases where combinations of the third memory address signal and the fourth memory address signal are "LH," "HL," and "HH," the second, third, and fourth memory block operation control signals are "H," respectively, while other memory block operation control signals are "L." For example, in a case where the third memory address signal is "L" and the fourth memory address signal is "L," the first memory block operation control signal is "H" and the rest of the second to fourth memory block operation control signals are each "L."

The input signal control circuit 106 has a function of generating first to fourth memory block input signals, from a memory reading control signal; a memory writing control signal; first to fourth memory writing data signals; the first and second memory address signals; and the first to fourth memory block operation control signals, supplied from a memory reading control signal line 108; a memory writing control signal line 109; a memory writing data bus signal line 110 including the first to fourth memory writing data signal lines; the memory address bus signal line 111, and the memory block operation control bus signal line 112; respectively. The first to fourth memory block input signals are supplied to the first to fourth memory block input signal lines 113 to 116, respectively.

For example, in a case where the first memory block operation control signal is "H," that is, in a case where a memory cell to be read from or written to is included in the first memory block 101, potentials corresponding to the memory reading control signal, the memory writing control signal, the first to fourth memory writing data signals, and the first and second memory address signals become the first memory block input signal. Meanwhile, the second, third, and fourth memory block input signals are to have a constant value independent of values of the memory reading control signal, the memory writing control signal, the memory writing data signals, and the memory address signals. Also in a similar manner, for example, the potentials corresponding to the memory reading control signal, the memory writing control signal, the first to fourth memory writing data signal, and the first and second memory address signals are the second memory block input signal when the second memory block operation control signal is "H," the third memory block input signal when the third memory block operation control signal is "H," and the fourth memory block input signal when the fourth memory block operation control signal is "H". Meanwhile, other memory block input signals are to have a constant value independent of values of the memory reading control signal, the memory writing control signal, the memory writing data signal, and the memory address signal.

The output signal control circuit 107 has a function of generating first to fourth memory reading data signals to be supplied to a memory reading data bus signal line 121 including first to fourth memory reading data signal lines, from first to fourth memory block output signals supplied from the first to fourth memory block output signal lines 117 to 120 and first to fourth memory block operation control signals supplied from the memory block operation control bus signal line 112.

For example, any one of the first to fourth memory block output signals is selected depending on the first to fourth memory block operation control signals, and via a buffer, the memory block output signal is supplied to the memory reading data bus signal line 121 as a memory reading data signal.

FIG. 4 is a timing chart relating to an input/output signal of a memory in an embodiment mode of the present invention. The timing charts of the first to fourth memory address signals; the memory reading control signal; the memory writing control signal; and the first to fourth memory writing data signals supplied from the memory address bus signal line 111; the memory reading control signal line 108; the memory writing control signal line 109; and the memory writing data bus signal line 110 in FIG. 1, respectively, are first to fourth signals 401 to 404 in FIG. 4, respectively. Note that potentials of the first to fourth memory address signals are sequentially marked to represent the first signal 401. Similarly, potentials of the first to fourth memory writing data signals are sequentially marked to represent the fourth signal 404.

Here, a period in which a memory writing control signal is "H," that is, a first period 418 in FIG. 4, is to be a memory writing period. Also, a period in which the memory reading control signal is "H," that is, a third period 420 in FIG. 4, is to be a memory reading period. Further, a period in which the memory reading control signal and the memory writing control signal are both "L," that is, a second period 419 in FIG. 4, is to be a memory waiting period.

In a case where a combination of potentials of the third memory address signal and the fourth memory address signal is "LL," the first memory block operation control signal becomes "H," and each of the second, third, and fourth memory block operation control signals becomes "L." In a similar manner, the second, third, and fourth memory block operation control signals become "H" in a case where combinations of potentials of the third memory address signal and the fourth memory address signal are "LH," "HL," and "HH," respectively, while other memory block operation control signals become "L." Accordingly, timing charts of the first and second memory block operation control signals become like those of fifth and sixth signals 405 and 406 in FIG. 4. Note that although timing charts of the third and fourth memory block operation control signals are not shown in FIG. 4, they are constantly "L."

Here, the input signal control circuit 106 in FIG. 1 generates the first to fourth memory block input signals by carrying out a logical AND operation with respect to the memory reading control signal, the memory writing control signal, the first to fourth memory writing data signals, and the first and second memory address signals, with the first, second, third, and fourth memory block operation control signals, respectively. That is, in a period in which the first memory block operation control signal is "H," the memory reading control signal, the memory writing control signal, the first to fourth memory writing data signals, and the first and second memory address signals become the first memory block input signal, and all of the second to fourth memory block input signals become "L."

Accordingly, timing charts of the first and second memory block address signals in the first memory block 101 are a seventh signal 407 in FIG. 4, a timing chart of the memory block reading control signal is an eighth signal 408 in FIG. 4, a timing chart of the memory block writing control signal is a ninth signal 409 in FIG. 4, and timing charts of the first to fourth memory block writing data signals are a tenth signal 410 in FIG. 4.

Note that potentials of the first and second memory block address signals are sequentially marked to represent the seventh signal 407. In a similar manner, potentials of the first to fourth block writing data signals are sequentially marked to represent the tenth signal 410. Data stored in the first memory block 101 during a memory writing period is read during a memory reading period. Accordingly, a timing chart of the first memory block reading data signal is an eleventh signal 411 in FIG. 4.

Similarly, timing charts of the first and second memory block address signals in the second memory block 102 are a twelfth signal 412 in FIG. 4, a timing chart of the memory block reading control signal is a thirteenth signal 413 in FIG. 4, a timing chart of the memory block writing control signal is a fourteenth signal 414 in FIG. 4, and timing chart of the first to fourth memory block writing data signals are a fifteenth signal 415 in FIG. 4.

Note that potentials of the first and second memory block address signals are sequentially marked to represent the twelfth signal 412. In a similar manner, potentials of the first to fourth memory block writing data signals are sequentially marked to represent the fifteenth signal 415. Note that data stored in the second memory block 102 during a memory writing period is read during a memory reading period. Accordingly, a timing chart of the second memory block reading data signal is a sixteenth signal 416 in FIG. 4.

Here, the output signal control circuit 107 in FIG. 1 selects the first memory block output signal when the first memory block operation control signal is "H"; the second memory block output signal when the second memory block operation control signal is "H"; the third memory block output signal when the third memory block operation control signal is "H"; and the fourth memory block output signal when the fourth memory block operation control signal is "H"; and makes the selected signals the first to fourth memory reading data signals, respectively. In this case, timing charts of the first to fourth memory reading data signals are a seventeenth signal 417 in FIG. 4.

Note that in a period in which the first memory block operation control signal is "H," all of the second to fourth memory block input signals are to be "L." Accordingly, potentials of memory block input signals in the second to fourth memory blocks 102 to 104 are equivalent to a potential of the memory block waiting period 172 in FIG. 3. That is, power consumption in the second to fourth memory blocks 102 to 104 is equal to power consumption in a waiting period. Similarly, in a period in which the second memory block operation control signal is "H," the first, third, and fourth memory block input signals are all "L." Accordingly, potentials of input signals in the first, third, and fourth memory blocks 101, 103, and 104 are equivalent to a potential of the memory block waiting period 172 in FIG. 3. That is, power consumption in the first, third, and fourth memory blocks 101, 103, and 104 are equal to power consumption in a waiting period. Consequently, at least three-fourths of the entire memory is constantly in a waiting state, and power consumption of the entire memory can be reduced significantly.

By having a structure as the above, only an input signal of a memory block including a memory cell to be read from or written to is changed, and input signals of other memory blocks are not changed. That is, power consumption in the memory blocks other than the memory block including the memory cell is the power consumption in a waiting period. Specifically, in a case of an example in this embodiment mode, at least three-fourths of the entire memory can be made to be in a state similar to that in a waiting period. Consequently, power consumption of the entire memory can be reduced significantly. Note that the memory includes the memory blocks which are arranged symmetrically. Accordingly, wiring length of a reading bit line or a writing bit line in a memory array can be shortened; therefore, current consumption can be made to be even among data reading or writing from/to memory cells of a variety of addresses within the memory block, at the same time as reducing load capacitance.

With a structure such as the foregoing, a high-performance and low power consumption semiconductor device including a high-capacity memory that has and even low power consumption can be provided.

EMBODIMENT MODE 2

Figure 5:
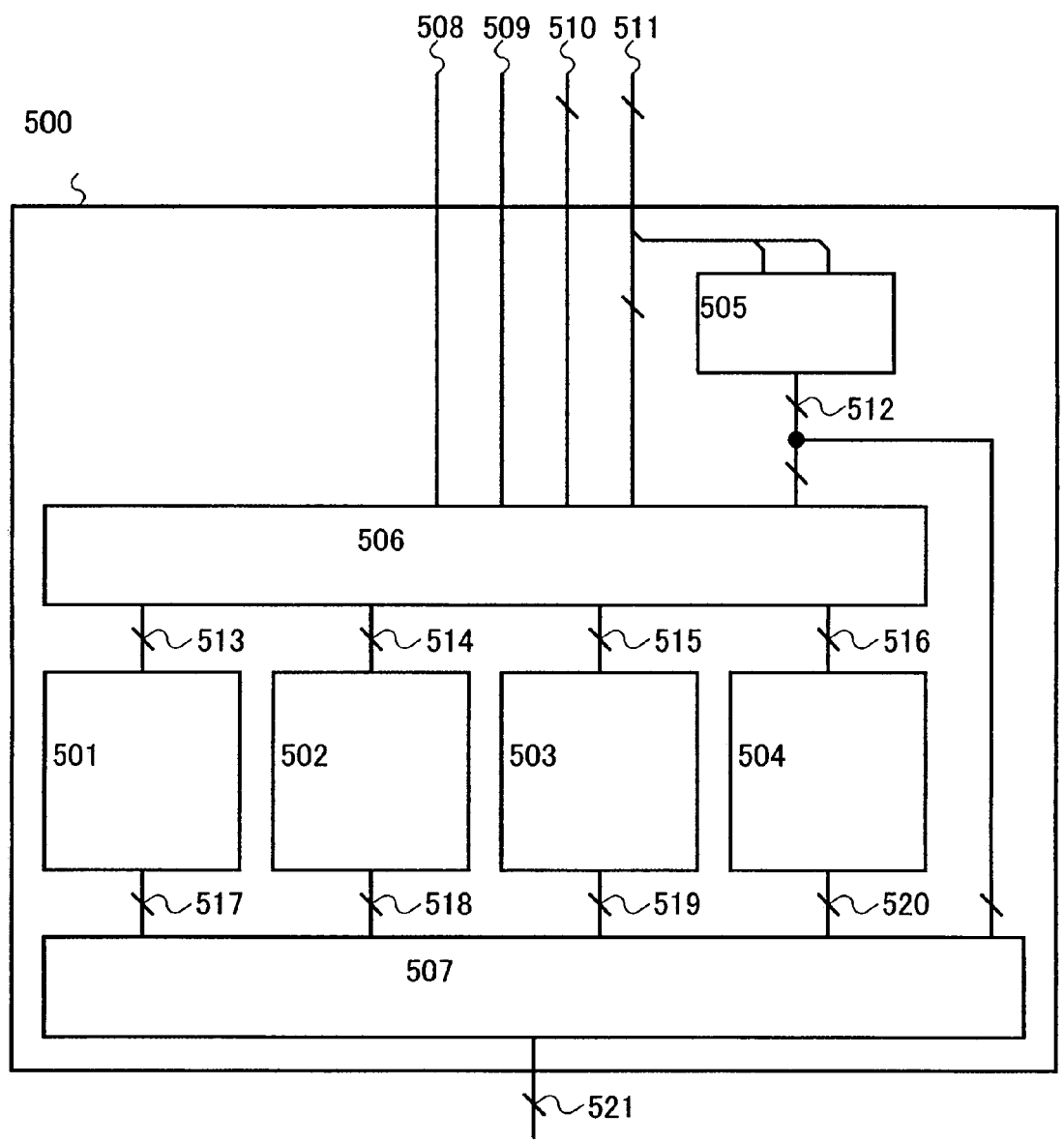
FIG. 5 is a block diagram of a memory block forming a memory mounted to a semiconductor device in the present invention.
Figure 6:
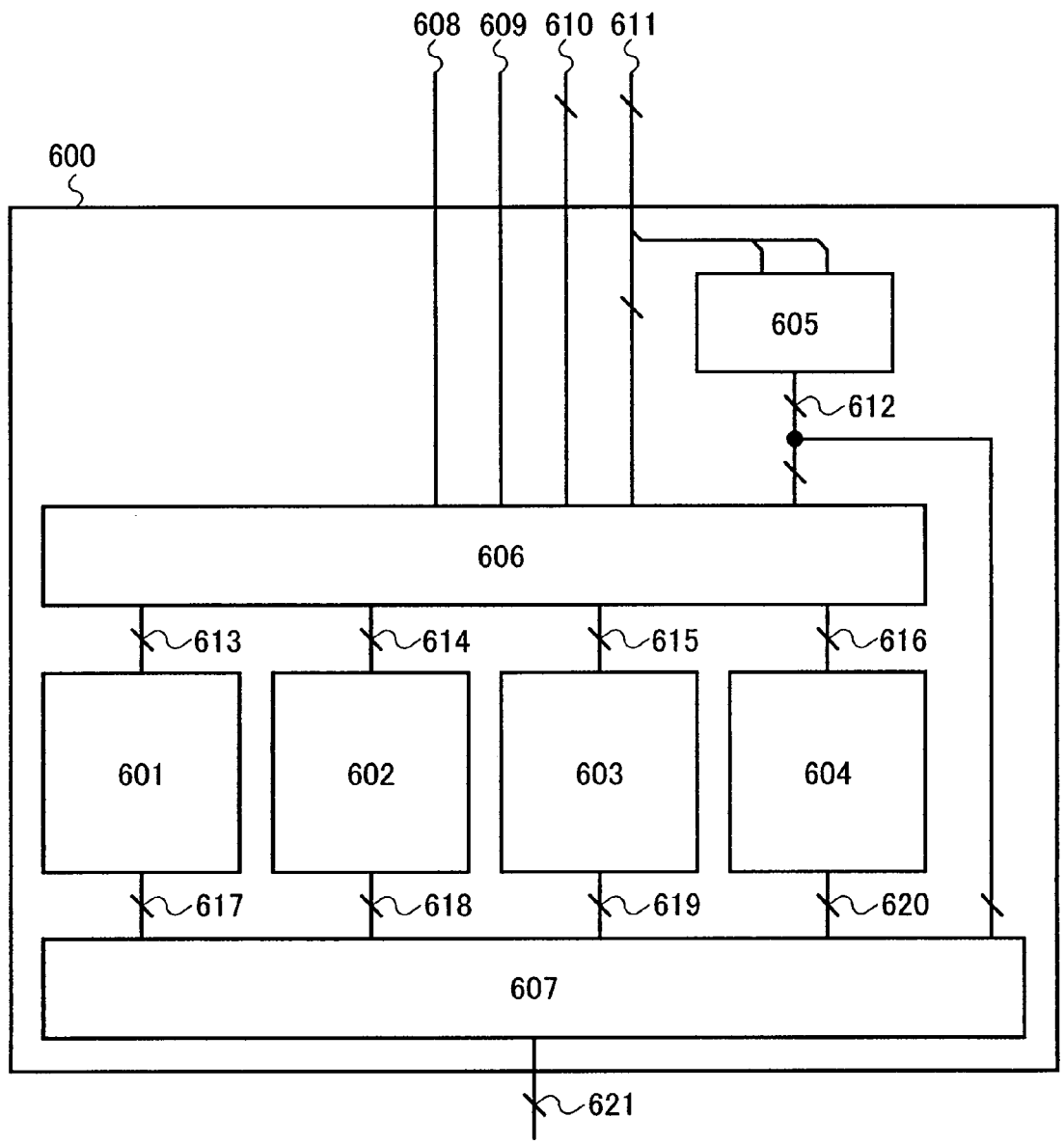
FIG. 6 is a block diagram of a memory mounted to a semiconductor device in the present invention.
Figure 7:
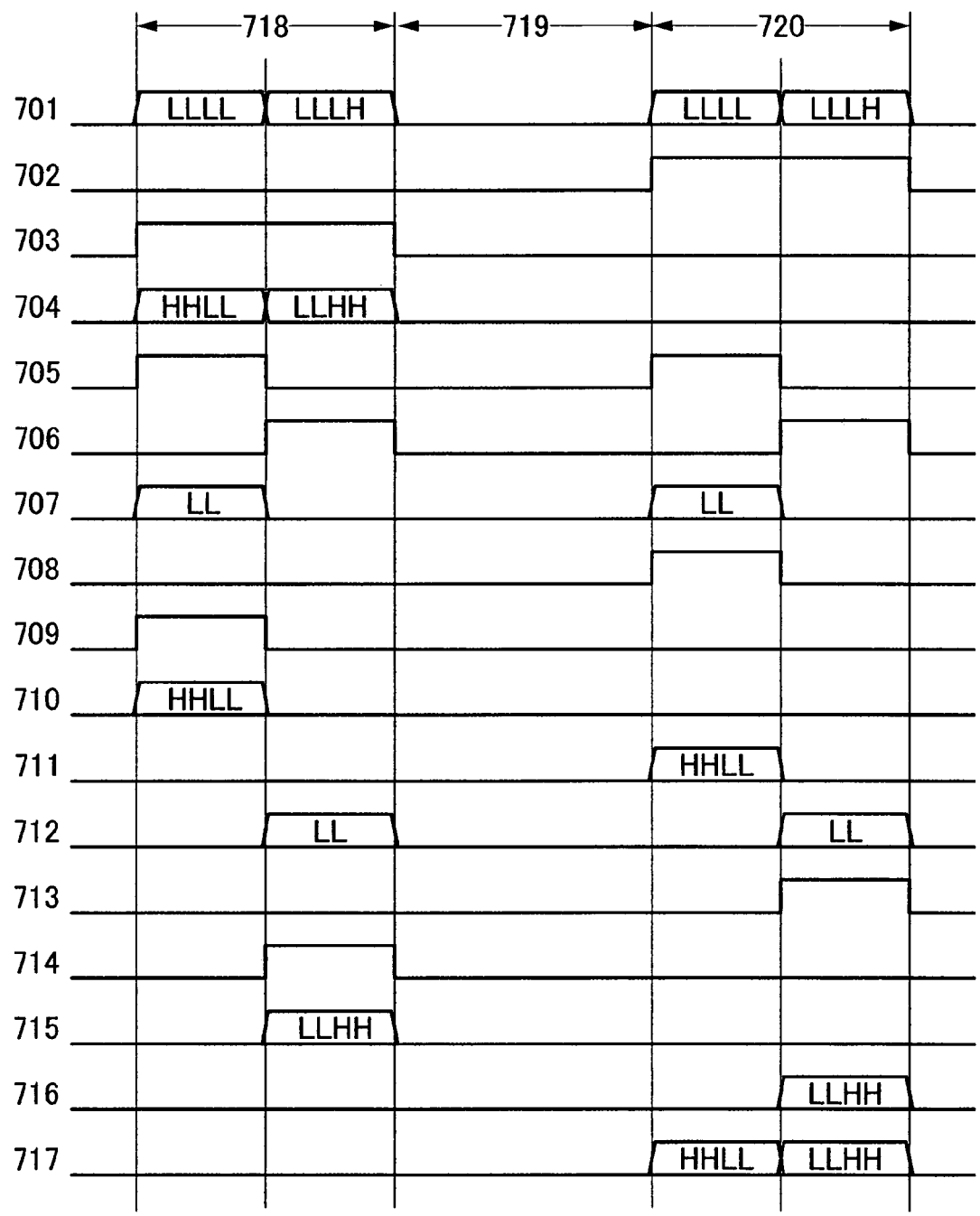
FIG. 7 is a timing chart of a memory block forming a memory mounted to a semiconductor device in the present invention.
Figure 8:
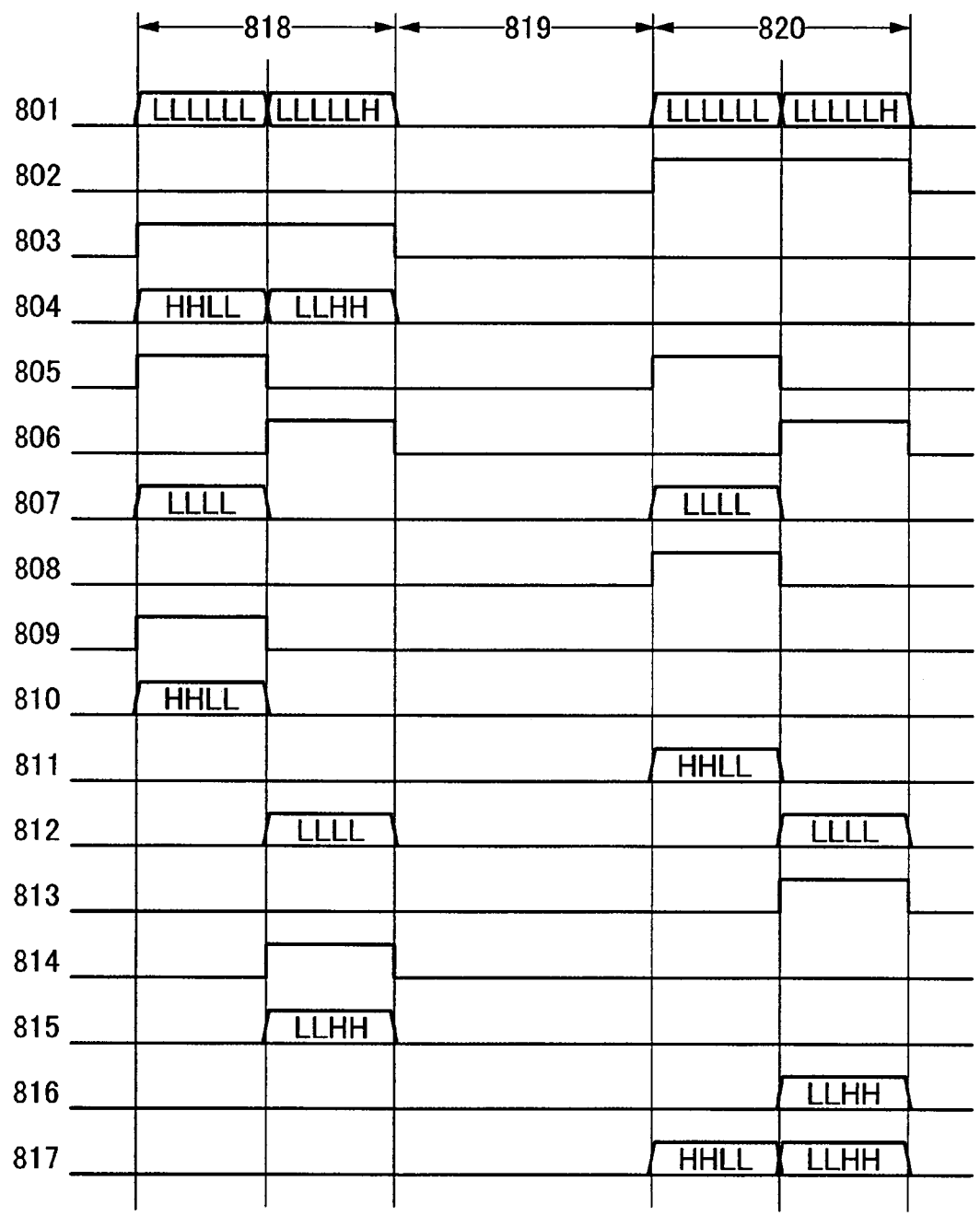
FIG. 8 is a timing chart of a memory mounted to a semiconductor device in the present invention.

As a second embodiment mode of a memory mounted to a semiconductor device in the present invention, a memory having a hierarchical structure is described with reference to FIGS. 2, 3, and 5 to 8. FIG. 2 is a block diagram of a memory block also used in the description of Embodiment Mode 1, and is a block diagram of a first-tier memory block in this embodiment mode. FIG. 3 is a timing chart of a memory block also used in the description of Embodiment Mode 1, and is a timing chart of the first-tier memory block in this embodiment mode. FIG. 5 is a block diagram of a memory block included in a memory in this embodiment mode, and is a block diagram of a second-tier memory block. FIG. 6 is a block diagram of a memory in this embodiment mode. FIG. 7 is a timing chart of the second-tier memory block in this embodiment mode. FIG. 8 is a timing chart of a memory in this embodiment mode.

In this embodiment mode, a case of a memory with a memory address signal of 6 bits, that is, 64 words, and a memory reading/writing data signal of 4 bits, where the second-tier memory block includes four first-tier memory blocks and the memory includes four second-tier memory blocks, is described. In general, a memory with an address signal of a bits ($a \geq 1$), a memory reading data signal of b bits ($b \geq 1$), and a memory writing data signal of c bits ($c \geq 1$) can include n-tiered memory block ($n \geq 1$).

Note that since the same description in Embodiment Mode 1 can be applied to the memory block 200 in FIG. 2 that is the first-tier memory block in this embodiment mode and to the timing chart of the memory block 200 shown in FIG. 3, description thereof is omitted.

In FIG. 5, a second-tier memory block 500 in this embodiment mode includes first to fourth first-tier memory blocks 501 to 504, a second-tier operation control circuit 505, a second-tier input signal control circuit 506, and a second-tier output signal control circuit 507.

Here, the first to fourth first-tier memory blocks 501 to 504 are the memory block 200 in FIG. 2. Note that, an input signal line of the first first-tier memory block 501 is a first first-tier memory block input signal line 513 in FIG. 5, which is the first and second memory block address signal lines 220 and 221, the memory block reading control signal line 222, the memory block writing control signal line 223, and the first to fourth memory block writing data signal lines 244 to 247. Also, an output signal line of the first first-tier memory block 501 is a first first-tier memory block output signal line 517 in FIG. 5, which includes the first to fourth memory block reading data signal lines 240 to 243.

Similarly, input signal lines of the second to fourth first-tier memory blocks 502 to 504 are second to fourth first-tier memory block input signal lines 514 to 516 in FIG. 5, which are each the first and second memory block address signal lines 220 and 221, the memory block reading control signal line 222, the memory block writing control signal line 223, and the first to fourth memory block writing data signal lines 244 to 247. Also, output signal lines of the second to fourth first-tier memory blocks 502 to 504 are second to fourth first-tier memory block output signal lines 518 to 520 in FIG. 5, which are each the first to fourth memory block reading data signal lines 240 to 243.

The second-tier operation control circuit 505 has a function of generating first to fourth second-tier memory block operation control signals to be supplied to a second-tier memory block operation control bus signal line 512 including first to fourth second-tier memory block operation control signal lines, from a third and fourth second-tier memory block address signals among first to fourth second-tier memory block address signals supplied from a second-tier memory block address bus signal line 511 including first to fourth second-tier memory block address signal lines.

For example, in a case where a combination of potentials of the third second-tier memory block address signal and the fourth second-tier memory block address signal is "LL," a memory cell to be read from or written to is included in the first first-tier memory block 501. Also, in a similar manner, a memory cell to be read from or written to is included in the second first-tier memory block 502, the third first-tier memory block 503, and the fourth first-tier memory block 504, in a case where combinations of potentials of the third second-tier memory block address signal and the fourth second-tier memory block address signal are "LH," "HL," and "HH," respectively. For example, when the third second-tier memory block address signal is "L" and the fourth second-tier memory address signal is "H," the memory cell to be read from or written to is included in the second first-tier memory block 502.

Also, in a case where the third second-tier memory block address signal and the fourth second-tier memory block address signal are "LL," the first second-tier memory block operation control signal is to be "H" and the second, third, and fourth second-tier memory block operation control signals are to be "L." In a similar manner, in a case where the third second-tier memory block address signal and the fourth second-tier memory block address signal are "LH," "HL," and "HH," the second, third, and fourth second-tier memory block operation control signals are to be "H," respectively, while other second-tier memory block operation control signals are to be "L."

The second-tier input signal control circuit 506 has a function of generating first to fourth first-tier memory block input signals to be supplied to the first to fourth first-tier memory block input signal lines 513 to 516, from a second-tier memory block reading control signal; a second-tier memory block writing control signal; first to fourth second-tier memory block writing data signals; the first and second second-tier memory block address signals; and the first to fourth second-tier memory block operation control signals, supplied from a second-tier memory block reading control signal line 508; a second-tier memory block writing control signal line 509; a second-tier memory block writing data bus signal line 510 including first to fourth second-tier memory block writing data signal lines; the second-tier memory block address bus signal line 511; and the second-tier memory block operation control bus signal line 512; respectively.

For example, in a case where the first second-tier memory block operation control signal is "H," potentials corresponding to the second-tier memory block reading control signal, the second-tier memory block writing control signal, the first to fourth second-tier memory block writing data signals, and the first and second second-tier memory block address signals are to be the first first-tier memory block input signal. Meanwhile, the second, third, and fourth first-tier memory block input signals are to have a constant value independent of values of the second-tier memory block reading control signal, the second-tier memory block writing control signal, the second-tier memory block writing data signals, and the second-tier memory block address signals. Also, in a similar manner, potentials corresponding to the second-tier memory block reading control signal, the second-tier memory block writing control signal, the first to fourth second-tier memory block writing data signals, and the first and second second-tier memory block address signals are the second first-tier memory block input signal when the second second-tier memory block operation control signal is "H," the third first-tier memory block input signal when the third second-tier memory block operation control signal is "H," and the fourth first-tier memory block input signal when the fourth second-tier memory block operation control signal is "H." Meanwhile, other first memory block input signals are to have a constant value independent of values of the second-tier memory block reading control signal, the second-tier memory block writing control signal, the second-tier memory block writing data signals, and the second-tier memory block address signals.

The second-tier output signal control circuit 507 has a function of generating first to fourth second-tier memory block reading data signals to be supplied to a second-tier memory block reading data bus signal line 521 including first to fourth second-tier memory block reading data signals lines, from first to fourth first-tier memory block output signals supplied from the first to fourth first-tier memory block output signal lines 517 to 520 and the first to fourth second-tier memory block operation control signals supplied from the second-tier memory block operation control bus signal line 512.

For example, one of the first to fourth first-tier memory block output signals is selected depending on the first to fourth second-tier memory block operation control signals, and via a buffer, the memory block output signal is supplied to the second-tier memory block reading data bus signal line 521 as a second-tier memory block reading data signal.

FIG. 7 is a timing chart relating to an input/output signal of a second-tier memory block. Timing charts of the first to fourth second-tier memory block address signals; the second-tier memory block reading control signal; the second-tier memory block writing control signal; and the first to fourth second-tier memory block writing data signals, supplied from the second-tier memory block address bus signal line 511, the second-tier memory block reading control signal line 508, the second-tier memory block writing control signal line 509, and the second-tier memory block writing data bus signal line 510 in FIG. 5, respectively, are first to fourth signals 701 to 704 in FIG. 7, respectively. Note that potentials of the first to fourth second-tier memory block address signals are sequentially marked to represent the first signal 701. In a similar manner, potentials of the first to fourth second-tier memory block writing data signals are sequentially marked to represent the fourth signal 704.

Here, a period in which the second-tier memory block writing control signal is "H," that is, a first period 718 in FIG. 7, is to be a second-tier memory block writing period. Also, a period in which the second-tier memory block reading control signal is "H," that is, a third period 720 in FIG. 7, is to be a second-tier memory block reading period. Further, a period in which the second-tier memory block reading control signal and the second-tier memory block writing control signal are both "L," that is, a second period 719 in FIG. 7, is to be a second-tier memory block waiting period.

In a case where the third second-tier memory block address signal and the fourth second-tier memory block address signal are "LL," the first second-tier memory block operation control signal becomes "H," and the second, third, and fourth second-tier memory block operation control signals become "L." In a similar manner, the second, third, and fourth second-tier memory block operation control signals become "H," in a case where the third second-tier memory block address signal and the fourth second-tier memory block address signal are "LH," "HL," and "HH," respectively, while other second-tier memory block operation control signals become "L." Accordingly, timing charts of the first and second second-tier memory block operation control signals become like those of fifth and sixth signals 705 and 706 in FIG. 7. Note that although timing charts of the third and fourth second-tier memory block operation control signals are not shown in FIG. 7, they are constantly "L."

Here, the second-tier input signal control circuit 506 in FIG. 5 generates the first to fourth first-tier memory block input signals by carrying out a logical AND operation with respect to the second-tier memory block reading control signal, the second-tier memory block writing control signal, the first to fourth second-tier memory block writing data signals, and the first and second second-tier memory block address signals, with the first, second, third, and fourth second-tier memory block operation control signals, respectively. That is, in a period in which the first first-tier memory block operation control signal is "H," the second-tier memory block reading control signal, the second-tier memory block writing control signal, the first to fourth second-tier memory block writing data signals, and the first and second second-tier memory block address signals become the first first-tier memory block input signal, and all of the second to fourth first-tier memory block input signals become "L."

Accordingly, timing charts of the first and second second-tier memory block address signals in the first first-tier memory block 501 are a seventh signal 707 in FIG. 7, a timing chart of the second-tier memory block reading control signal is an eighth signal 708 in FIG. 7, a timing chart of the second-tier memory block writing control signal is a ninth signal 709 in FIG. 7, and timing charts of the first to fourth second-tier memory block writing data signals are a tenth signal 710 in FIG. 7.

Note that potentials of the first and second second-tier memory block address signals are sequentially marked to represent the seventh signal 707. In a similar manner, potentials of the first to fourth second-tier memory block writing data signals are sequentially marked to represent the tenth signal 710. Data stored in the first first-tier memory block 501 during the second-tier memory block writing period is read during a second-tier memory block reading period. Accordingly, a timing chart of the first second-tier memory block reading data signal is an eleventh signal 711 in FIG. 7.

In a similar manner, timing charts of the first and second second-tier memory block address signals in the second first-tier memory block 502 are a twelfth signal 712 in FIG. 7, a timing chart of the second-tier memory block reading control signal is a thirteenth signal 713 in FIG. 7, a timing chart of the second-tier memory block writing control signal is a fourteenth signal 714 in FIG. 7, and a timing chart of the first to fourth second-tier memory block writing data signals is a fifteenth signal 715 in FIG. 7.

Note that potentials of the first and second second-tier memory block address signals are sequentially marked to represent the twelfth signal 712. In a similar manner, potentials of the first to fourth second-tier memory block writing data signals are sequentially marked to represent the fifteenth signal 715. Note that data stored in the second first-tier memory block 502 during the second-tier memory block writing period is read during the second-tier memory block reading period. Accordingly, a timing chart of the second second-tier memory block reading data signal is a sixteenth signal 716 in FIG. 7.

Here, the second-tier output signal control circuit 507 in FIG. 5 selects the first first-tier memory block output signal when the first second-tier memory block operation control signal is "H"; the second first-tier memory block output signal when the second second-tier memory block operation control signal is "H"; the third first-tier memory block output signal when the third second-tier memory block operation control signal is "H"; and the fourth first-tier memory block output signal when the fourth second-tier memory block operation control signal is "H," and makes the first to fourth first-tier memory block output signals the first to fourth second-tier memory reading data signals, respectively. In this case, the timing chart of the first to fourth second-tier memory block reading data signals are a seventeenth signal 717 in FIG. 7.

Note that in a period in which the first first-tier memory block operation control signal is "H," all of the second to fourth first-tier memory block input signals are to be "L." Potentials of block input signals in the second to fourth first-tier memory blocks 502 to 504 is equivalent to a potential of the memory block waiting period 172 in FIG. 3. That is, power consumption in the second to fourth first-tier memory block 502 to 504 are equal to power consumption in a waiting period. In a similar manner, in a period in which the second first-tier memory block operation control signal is "H," all of the first, third, and fourth first-tier memory block input signals are "L." Potentials of input signals in the first, third, and fourth first-tier memory blocks 501, 503, and 504 are equivalent to a potential of the memory block waiting period 172 in FIG. 3. In other words, power consumption of the first, third, and fourth first-tier memory blocks 501, 503, and 504 is equal to power consumption in a waiting period. Accordingly, in the second-tier memory block 500, at least three-fourths of the entire memory block is constantly in a waiting state, and power consumption of the entire memory can be reduced significantly.

In FIG. 6, a memory 600 in this embodiment mode includes first to fourth second-tier memory blocks 601 to 604, an operation control circuit 605, an input signal control circuit 606, and an output signal control circuit 607. Here, the first to fourth second-tier memory blocks 601 to 604 are the second-tier memory block 500 in FIG. 5. In other words, the memory 600 of this embodiment mode includes a plurality of the second-tier memory blocks 500 each having the same block diagram as the memory 600 itself.

Note that, an input signal line of the first second-tier memory block 601 is a first second-tier memory block input signal line 613 in FIG. 6, which is the second-tier memory block address bus signal line 511, the second-tier memory block reading control signal line 508, the second-tier memory block writing control signal line 509, and the second-tier memory block writing data bus signal line 510 in FIG. 5. Also, an output signal line of the first second-tier memory block 601 is a first second-tier memory block output signal line 617 in FIG. 6, which is the second-tier memory block reading data bus signal line 521 in FIG. 5.

In a similar manner, an input signal line of the second to fourth second-tier memory blocks 602 to 604 are second to fourth second-tier memory block input signal lines 614 to 616 in FIG. 6, which are each the second-tier memory block address bus signal line 511, the second-tier memory block reading control signal line 508, the second-tier memory block writing control signal line 509, and the second-tier memory block writing data bus signal line 510 in FIG. 5. Also, output signal lines of the second to fourth second-tier memory blocks 602 to 604 are second to fourth second-tier memory block output signal lines 618 to 620 in FIG. 6, which are each the second-tier memory block reading data bus signal line 521 in FIG. 5.

The operation control circuit 605 has a function of generating the first to fourth memory block operation control signals to be supplied to a memory block operation control bus signal line 612 including first to fourth memory block operation control signal lines, from a fifth and sixth memory address signals among first to sixth memory address signals supplied from a memory address bus signal line 611 including first to fourth memory address signal lines.

For example, in a case where the fifth memory address signal and the sixth memory address signal are "LL," a memory cell to be read from or written to is included in the first second-tier memory block 601. Also, in a similar manner, in a case where the fifth memory address signal and the sixth memory address signal are "LH," "HL," and "HH," the memory cell to be read from or written to is included in the second second-tier memory block 602, the third second-tier memory block 603, and the fourth second-tier memory block 604, respectively.

Here, in cases where combinations of the fifth memory address signal and the sixth memory address signal are "LL," "LH," "HL," and "HH," the first, second, third, and fourth memory block operation control signals are to be "H," respectively, while other memory block operation control signals are to be "L." For example, in a case where potentials of both the fifth memory address signal and the sixth memory address signal are "L," the first memory block operation control signal is to be "H" and the rest of the second to fourth memory block operation control signals are to be "L."

The input signal control circuit 606 has a function of generating first to fourth second-tier memory block input signals to be supplied to the first to fourth second-tier memory block input signal lines 613 to 616, from a memory reading control signal; a memory writing control signal; first to fourth memory writing data signals; the first and second memory address signals; and the first to fourth second-tier memory block operation control signals, supplied from a memory reading control signal line 608; a memory writing control signal line 609; a memory writing data bus signal line 610 including first to fourth memory writing data signal lines; the memory address bus signal line 611, and the memory block operation control bus signal line 612; respectively.

For example, in a case where the first memory block operation control signal line is "H," potentials corresponding to the memory reading control signal, the memory writing control signal, the first to fourth memory writing data signals, the first and second memory address signals become the first second-tier memory block input signal. Meanwhile, the second, third, and fourth second-tier memory block input signals are to have a constant value independent of values of the memory reading control signal, the memory writing control signal, the memory writing data signals, and the memory address signals. Also in a similar manner, for example, the potentials corresponding to the memory reading control signal, the memory writing control signal, the first to fourth memory writing data signal, and the first and second memory address signals become the second second-tier memory block input signal when the second memory block operation control signal line is "H," the third second-tier memory block input signal when the third memory block operation control signal line is "H," and the fourth second-tier memory block input signal when the fourth memory block operation control signal line is "H." Meanwhile, other second-tier memory block input signals are to have a constant value independent of values of the memory reading control signal, the memory writing control signal, the memory writing data signal, and the memory address signal.

The output signal control circuit 607 has a function of generating first to fourth memory reading data signals to be supplied to a memory reading data bus signal line 621 including first to fourth memory reading data signal lines, from first to fourth second-tier memory block output signals supplied from the first to fourth second-tier memory block output signal lines 617 to 620 and first to fourth memory block operation control signals supplied from the memory block operation control bus signal line 612.

For example, one of the first to fourth second-tier memory block output signals is selected depending on the first to fourth memory block operation control signals, and via a buffer, the block output signal is supplied to the memory reading data bus signal line 621 as a memory reading data signal.

FIG. 8 is a timing chart relating to an input/output signal of a memory in an embodiment mode of the present invention. Timing charts of the first to sixth memory address signals, the memory reading control signal, the memory writing control signal, and the first to fourth memory writing data signals supplied from the memory address bus signal line 611, the memory reading control signal line 608, the memory writing control signal line 609, and the memory writing data bus signal line 610 in FIG. 6, respectively, are first to fourth signals 801 to 804 in FIG. 8, respectively. Note that potentials of the first to sixth memory address signals are sequentially marked to represent the first signal 801. Similarly, potentials of the first to fourth memory writing data signals are sequentially marked to represent the fourth signal 804.

Here, a period in which the memory writing control signal is "H," that is, a first period 818 in FIG. 8, is to be a memory writing period. Also, a period in which the memory reading control signal is "H," that is, a third period 820 in FIG. 8, is to be a memory reading period. Further, a period in which the memory reading control signal and the memory writing control signal are both "L," that is, a second period 819 in FIG. 8, is to be a memory waiting period.

In a case where the fifth memory address signal and the sixth memory address signal are "LL," the first memory block operation control signal becomes "H," and the second, third, and fourth memory block operation control signals become "L." In a similar manner, in cases where the fifth memory address signal and the sixth memory address signal are "LH," "HL," and "HH," the second, third, and fourth memory block operation control signals becomes "H," respectively, while other memory block operation control signals become "L"

Accordingly, timing charts of the first and second memory block operation control signals become like those of fifth and sixth signals 805 and 806 in FIG. 8. Note that although timing charts of the third and fourth memory block operation control signals are not shown in FIG. 8, they are constantly "L."

Here, the input signal control circuit 606 in FIG. 6 generates the first to fourth second-tier memory block input signals by carrying out a logical AND operation with respect to the memory reading control signal, the memory writing control signal, the first to fourth memory writing data signals, and the first to fourth memory address signals, with the first, second, third, and fourth memory block operation control signals, respectively. That is, in a period in which the first memory block operation control signal is "H," the memory reading control signal, the memory writing control signal, the first to fourth memory writing data signals, and the first to fourth memory address signals become the first second-tier memory block input signal, and all of the second to fourth second-tier memory block input signals become "L."

Accordingly, a timing chart of the first to fourth second-tier memory block address signals in the first second-tier memory block 601 are a seventh signal 807 in FIG. 8, a timing chart of the second-tier memory block reading control signal is an eighth signal 808 in FIG. 8, a timing chart of the second-tier memory block writing control signal is a ninth signal 809 in FIG. 8, and a timing chart of the first to fourth second-tier memory block writing data signals are a tenth signal 810 in FIG. 8.

Note that potentials of the first to fourth second-tier memory block address signals are sequentially marked to represent the seventh signal 807. In a similar manner, potentials of the first to fourth second-tier memory block writing data signals are sequentially marked to represent the tenth signal 810. Data stored in the first second-tier memory block 601 during a memory writing period is read during a memory reading period. Accordingly, a timing chart of the first second-tier memory block reading data signal is an eleventh signal 811 in FIG. 8.

In a similar manner, timing charts of the first to fourth second-tier memory block address signals in the second second-tier memory block 602 are a twelfth signal 812 in FIG. 8, a timing chart of the second-tier memory block reading control signal is a thirteenth signal 813 in FIG. 8, a timing chart of the second-tier memory block writing control signal is a fourteenth signal 814 in FIG. 8, and timing charts of the first to fourth second-tier memory block writing data signals are a fifteenth signal 815 in FIG. 8.

Note that potentials of the first to fourth second-tier memory block address signals are sequentially marked to represent the twelfth signal 812. In a similar manner, potentials of the first to fourth second-tier memory block writing data signals are sequentially marked to represent the fifteenth signal 815. Note that data stored in the second second-tier memory block 602 during a memory writing period is read during a memory reading period. Accordingly, a timing chart of the second second-tier memory block reading data signal is a sixteenth signal 816 in FIG. 8.

Here, the output signal control circuit 607 in FIG. 6 selects the first second-tier memory block output signal when the first memory block operation control signal is "H"; the second second-tier memory block output signal when the second memory block operation control signal is "H"; the third second-tier memory block output signal when the third memory block operation control signal is "H"; and the fourth second-tier memory block output signal when the fourth memory block operation control signal is "H"; and makes the first to fourth second-tier memory block output signals the first to fourth memory reading data signals, respectively. In this case, a timing chart of the first to fourth memory reading data signals is a seventeenth signal 817 in FIG. 8.

Note that in a period in which the first second-tier memory block operation control signal is "H," all of the second to fourth second-tier memory block input signals are to be "L." Accordingly, potentials of the second-tier memory block input signals in the second to fourth second-tier memory blocks 602 to 604 are equivalent to a potential of the second-tier memory block waiting period 719 in FIG. 7. That is, power consumption in the second to fourth second-tier memory blocks 602 to 604 is equal to power consumption in a waiting period. Similarly, in a period in which the second second-tier memory block operation control signal is "H," the first, third, and the fourth second-tier memory block input signals are all "L." Accordingly, potentials of input signals in the first, third, and fourth second-tier memory blocks 601, 603, and 604 are equivalent to a potential of the second-tier memory block waiting period 719. That is, power consumption in the first, third, and fourth second-tier memory blocks 601, 603, and 604 is equal to power consumption in a waiting period. Consequently, at least three-fourths of the entire memory 600 is constantly in a waiting state, and power consumption of the entire memory can be reduced significantly.

Further, as previously mentioned, in each second-tier memory block, at least three-fourths of the entire memory block is constantly in a waiting state. Accordingly, at least fifteenth-sixteenths of the entire memory 600 is constantly in a waiting state and power consumption of the entire memory can be reduced significantly.

By having a structure as the above, only an input signal of a memory block including a memory cell to be read from or written to is changed, and input signals of other memory blocks are not changed. That is, power consumption in the memory blocks other than the memory block including the memory cell is the power consumption in a waiting period. Specifically, in a case of an example in this embodiment mode, at least fifteenth-sixteenths of the entire memory can be made to be in a state similar to that in a waiting period. Consequently, overall power consumption can be reduced significantly. Note that the memory includes the memory blocks which are arranged symmetrically. Accordingly, wiring length of a reading bit line or a writing bit line in a memory array can be shortened; therefore, current consumption can be made to be even among data reading or writing from/to memory cells of a variety of addresses within the memory block, at the same time as reducing load capacitance.

With a structure such as the foregoing, a high-performance and low power consumption semiconductor device including a high-capacity memory that has low and even power consumption can be provided.

EMBODIMENT 1

Figure 9A:
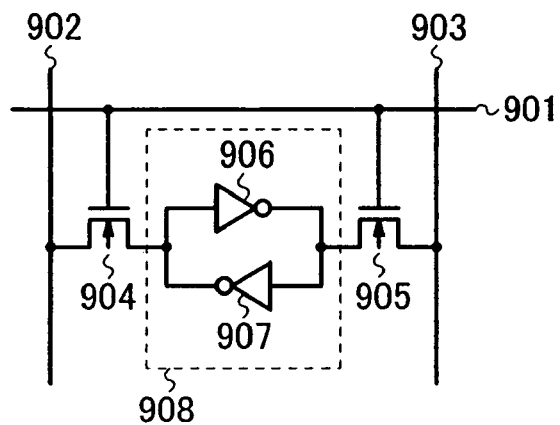
FIGS. 9A to 9D are examples of a memory cell and an RW circuit forming a memory mounted to a semiconductor device in the present invention.
Figure 9C:
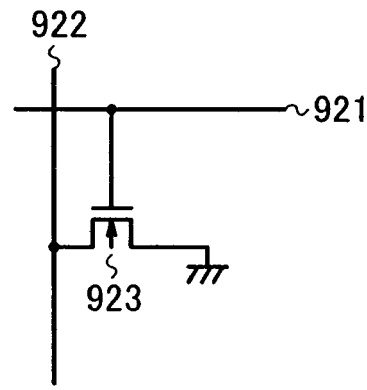
Figure 9B:
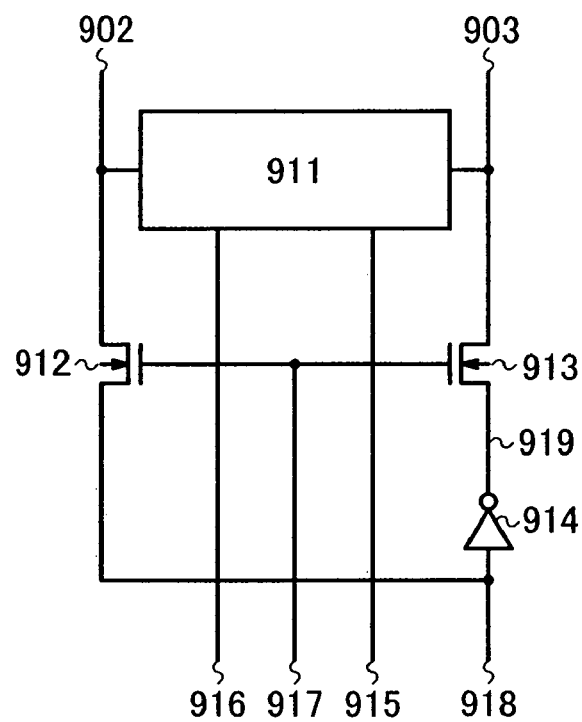
Figure 9D:
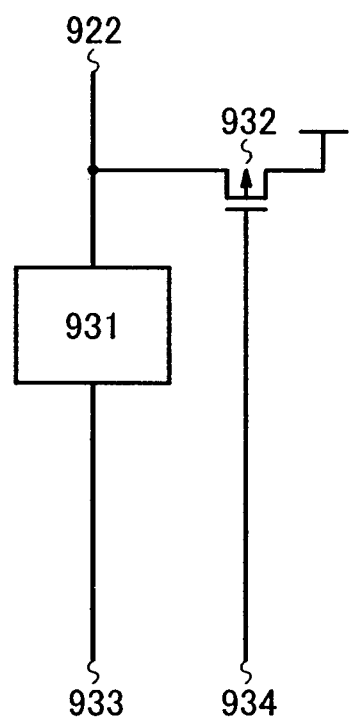

In this embodiment, an example of a memory mounted to a semiconductor device of the present invention is described with reference to FIGS. 9A to 9D. FIGS. 9A and 9B are examples of a memory cell and a row RW circuit, respectively, in a case where the memory mounted to the semiconductor device of the present invention is an SRAM (Static RAM). Also, FIGS. 9C and 9D are examples of a memory cell and a row RW circuit, respectively, in a case where the memory mounted to the semiconductor device of the present invention is a mask ROM.

First, a case where a memory of the present invention includes the memory cell in FIG. 9A and the row RW circuit in FIG. 9B is described.

In FIG. 9A, the memory cell includes a word signal line 901, first and second bit signal lines 902 and 903, first and second switch transistors 904 and 905, and first and second inverters 906 and 907. A gate electrode of each of the first and second switch transistors 904 and 905 is electrically connected to the word signal line 901. Also, drain electrodes of the first and second switch transistors 904 and 905 are electrically connected to the first and second bit signal lines 902 and 903, respectively. An input terminal of the first inverter 906, an output terminal of the second inverter 907, and a source electrode of the first switch transistor 904 are electrically connected to one another. An input terminal of the second inverter 907, an output terminal of the first inverter 906, and a source electrode of the second switch transistor 905 are electrically connected to one another. A latch 908 includes the first and second inverters 906 and 907.

Note that the memory cell shown in FIG. 9A corresponds to each of the first to sixteenth memory cells 204 to 219 in FIG. 2. Note that the word signal line 901 collectively represents both a writing word signal line and a reading word signal line. Also, a reading bit signal line and a writing bit signal line are collectively represented, and the first and second bit signal lines 902 and 903 are a pair of signal lines supplying a positive signal and a negative signal.

In FIG. 9B, the row RW circuit includes the first and second bit signal lines 902 and 903, a sense amplifier 911, first and second transistors 912 and 913, an inverter 914, a reading control signal line 915, a reading data signal line 916, a writing control signal line 917, a writing data signal line 918, and an inverted writing data signal line 919.

The sense amplifier 911 is electrically connected to the first and second bit signal lines 902 and 903, the reading control signal line 915, and the reading data signal line 916. Gate electrodes of the first and second transistors 912 and 913 are electrically connected to the writing control signal line 917, drain electrodes thereof are electrically connected to the first and second bit signal lines 902 and 903, respectively, and source electrodes thereof are electrically connected to the writing data signal line 918 and the inverted writing data signal line 919, respectively. An input terminal and an output terminal of the inverter 914 are electrically connected to the writing data signal line 918 and the inverted writing data signal line 919, respectively.

The row RW circuit shown in FIG. 9B corresponds to one row in the RW circuit 203 in FIG. 2. Note that a reading bit signal line and a writing bit signal line are collectively represented and the first and second bit signal lines 902 and 903 are a pair of signal lines supplying a positive signal and a negative signal.

The sense amplifier 911 operates when a potential of the reading control signal line 915 is "H," and has a function of detecting at high speed a potential of each of a first bit signal and a second bit signal supplied from the first bit signal line 902 and the second bit signal line 903, respectively, from a minute potential difference between the first and second bit signals, and supplying a reading data signal to the reading data signal line 916. Also, a writing data signal supplied from the writing data signal line 918 is supplied to the inverted writing data signal line 919 by the inverter 914 as an inverted writing data signal.

Next, an operation of the memory is described.

A memory writing operation is described. First, a writing control signal supplied to the writing control signal line 917 in FIG. 9B is to be "H." Next, a writing data signal is supplied from the writing data signal line 918. Here, the signal is "H," as an example. At this time, an inverted writing data signal supplied from the inverted writing signal line 919 becomes "L." The writing data signal is supplied to the first bit signal line 902 as a first bit signal via the first transistor 912, and becomes "H," and the inverted writing data signal is supplied to the second bit signal line 903 as a second bit signal via the second transistor 913, and becomes "L."

Subsequently, a word signal supplied to the word signal line 901 in FIG. 9A is to be "H." At this time, in the latch 908, input to the first inverter 906 and output from the second inverter 907 are "H," and output from the first inverter 906 and input to the second inverter 907 are "L," thereby completing data writing to the memory cell.

Next, a memory reading operation is described. First, a writing control signal supplied to the writing control signal line 917 shown in FIG. 9B is to be "L," and potentials of the first and second bit signal lines 902 and 903 are in a floating state. Subsequently, a word signal supplied to the word signal line 901 is to be "H." At this time, a potential held in the latch 908 is supplied to the first and second bit signal lines 902 and 903, as the first and second bit signals. For example, in the latch 908, when data that is "H" is stored in input of the first inverter 906 and output of the second inverter 907 and data that is "L" is stored in output of the first inverter 906 and input of the second inverter 907, the first and second bit signals are "H" and "L," respectively. Here, a reading control signal supplied to the reading control signal line 915 is "H." At this time, "H" is supplied to the reading data signal line 916 by the sense amplifier 911 as a reading data signal. That is, data is read.

Subsequently, a case where a memory of the present invention includes the memory cell in FIG. 9C and the row RW circuit in FIG. 9D is described.

In FIG. 9C, the memory cell includes a word signal line 921, a bit signal line 922, and a memory transistor 923. A gate electrode of the memory transistor 923 is electrically connected to the word signal line 921. A drain electrode of the memory transistor 923 is electrically connected to the bit signal line 922. A source electrode of the memory transistor 923 is electrically connected to a grounding line. Note that in FIG. 9C, an example where data "L" is stored in the memory cell is shown. In an example where data "H" is stored, a source electrode of the memory transistor 923 may be in a floating state. That is, depending on whether or not the source electrode of the memory transistor 923 is electrically connected to the grounding line, data "L" or data "H" can be stored.

Note that the memory cell shown in FIG. 9C corresponds to each of the first to sixteenth memory cells 204 to 219 in FIG. 2. However, since the memory cell does not have a writing function, there is no writing word signal line or writing bit signal line.

In FIG. 9D, the row RW circuit includes the bit signal line 922, a latch circuit 931, a transistor 932, a reading data signal line 933, and a reading control signal line 934.

The latch 931 is electrically connected to the bit signal line 922 and the reading data signal line 933. A gate electrode, a source electrode and a drain electrode of the transistor 932 is electrically connected to the reading control signal line 934, a power source line, and the bit signal line 922, respectively.

Note that the row RW circuit shown in FIG. 9D corresponds to one row in the RW circuit 203 in FIG. 2. However, since the row RW circuit does not have a writing function, there is no writing data signal line or writing control signal line.

Next, an operation of the memory is described.

First, a reading control signal supplied to the reading control signal line 934 shown in FIG. 9D is to be "L." At this time, a potential "H" is supplied to the bit signal line 922 from the transistor 932, and potential of the bit signal line 922 becomes "H." Also, "H" is stored in the latch circuit 931. Further, "H" is supplied to the reading data signal line 933 as a reading data signal. Subsequently, the reading control signal is to be "H." At this time, potential of the bit signal line 922 remains as "H" by the latch circuit 931. Also, the reading data signal remains as "H."

Then, a word signal supplied to the word signal line 921 shown in FIG. 9C is to be "H." At this time, "L" is supplied to the bit signal line 922 from the memory transistor 923 as a bit signal. Consequently, "L" is stored in the latch circuit 931 and the reading data signal also becomes "L."

Note that here, an example where data "L" is stored in the memory cell is shown. In a case where data "H" is stored in the memory cell, when a word signal supplied to the word signal line 921 is "H," the memory transistor 923 does not have an ability to drive the bit signal. That is, "H" remains stored in the latch circuit 931 and the reading data also remains as "H." In other words, data is read.

With a structure such as the foregoing, a high-performance and low power consumption semiconductor device including a high-capacity memory that has low and even power consumption can be provided.

EMBODIMENT 2

Figure 10:
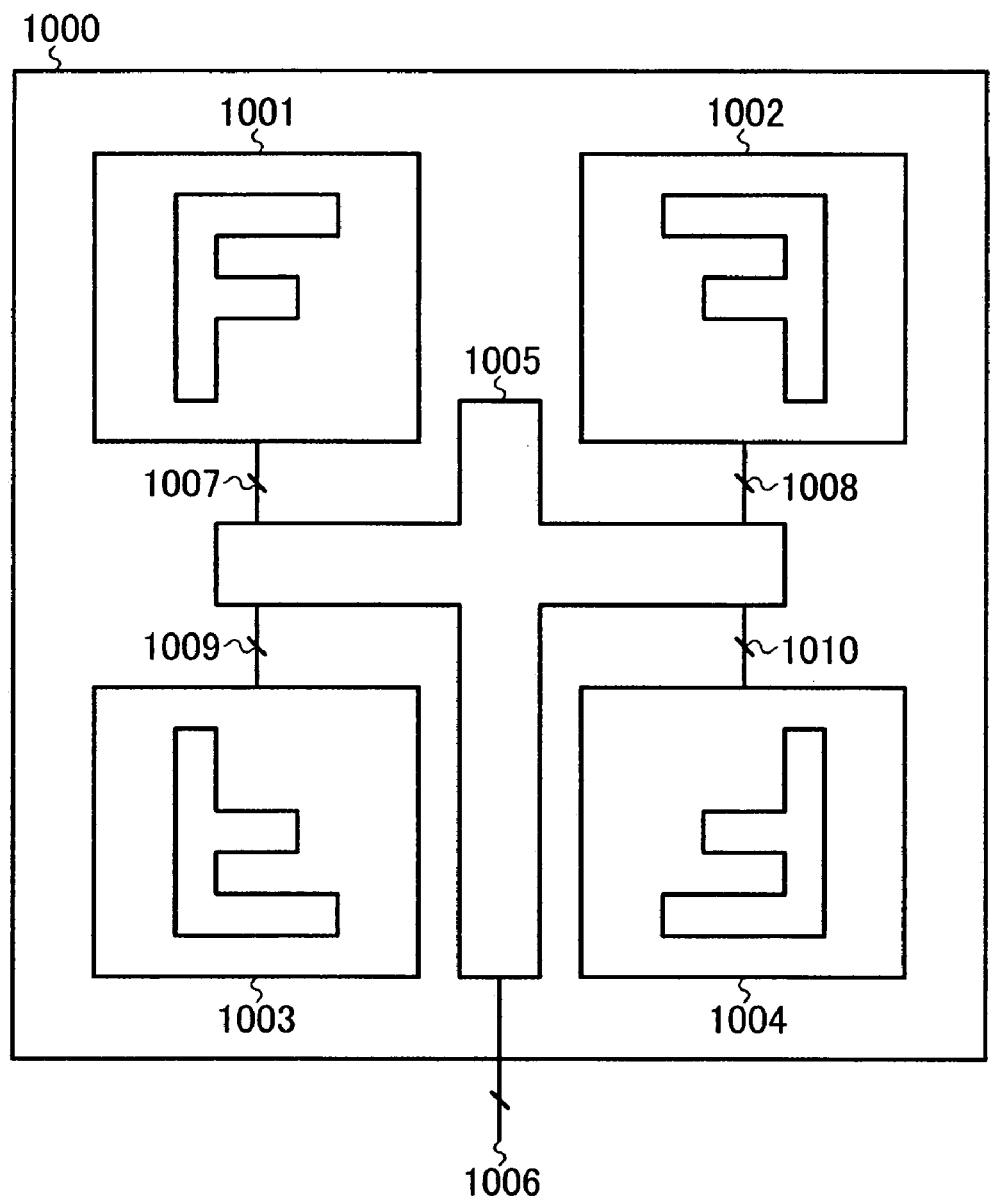
FIG. 10 is a layout example of a memory mounted to a semiconductor device in the present invention.

In this embodiment, an arrangement example of a memory mounted to a semiconductor device of the present invention is described with reference to FIG. 10. FIG. 10 is an arrangement example in a case where the memory mounted to the semiconductor device of the present invention includes four memory blocks.

In FIG. 10, a memory 1000 includes first to fourth memory blocks 1001 to 1004, a control circuit 1005, a memory input/output bus signal line 1006, and first to fourth memory block input/output bus signal lines 1007 to 1010. Here, the memory input/output bus signal line 1006 is a signal line collectively representing an input signal line and an output signal line of the memory 1000. For example, it is a signal line collectively representing the memory reading control signal line 108, the memory writing control signal line 109, the memory writing data bus signal line 110, the memory address bus signal line 111, and the memory reading data bus signal line 121 of the memory 100 in FIG. 1. Also, the first to fourth memory block input/output bus signal lines 1007 to 1010 are each a signal line collectively representing an input signal line and an output signal line of each of the first to fourth memory blocks 1001 to 1004. For example, each signal line collectively represents the first to fourth memory block input signal lines 113 to 116 and the first to fourth memory block output signal lines 117 to 120 of the memory 100 in FIG. 1.

The control circuit 1005 is a circuit collectively representing circuits other than the memory blocks. For example, in the memory 100 in FIG. 1, it is a circuit collectively representing the operation control circuit 105, the input signal control circuit 106, and the output signal control circuit 107.

In FIG. 10, the second memory block 1002 is placed to be axisymmetric to the first memory block 1001 with respect to a vertical axis. Also, the third memory block 1003 is placed to be axisymmetric to the first memory block 1001 with respect to a horizontal axis. Further, the fourth memory block 1004 is placed to be point-symmetric to the first memory block 1001.

Accordingly, by placing the first to fourth memory blocks 1001 to 1004, the first to fourth memory block input/output bus signal lines 1007 to 1010 can have nearly equal lengths. That is, capacitance that is loaded to each of the memory block input/output bus signal lines can be made to be nearly equal to one another. Therefore, when data reading and data writing is carried out with respect to each memory block, power consumption in charging and discharging each of the memory block input/output bus signal lines can be made to be nearly equal to one another.

In a design of a semiconductor device mounted with a memory, it is necessary to make power source allotment and to apply a heat dissipation measure. That is, in a case where power consumption differs depending on a physical address of a memory cell to be read from or written to, design cost increases. Meanwhile, in a semiconductor device mounted with the memory of this embodiment, power consumption can be reduced without dependence on the physical address of the memory cell.

Note that the memory of this embodiment can have a hierarchical structure. That is, each of the first to fourth memory blocks 1001 to 1004 in FIG. 10 can be a second-tier memory block that includes a plurality of first-tier memory blocks. In this case, first to fourth first-tier memory blocks may be arranged in a similar manner to the first to fourth memory blocks 1001 to 1004 in the memory 1000 in FIG. 10.

Also, in general, the memory can have n (n≧2) tiers. That is, the memory can include an n-th tier memory block and an m-th (2≦m≦n) tier memory block can include an (m−1)-th tier memory block. In this case, for the m-th tier memory block, first to fourth (m−1)-th tier memory blocks may be arranged in a similar manner to the first to fourth memory blocks 1001 to 1004 in the memory 1000 in FIG. 10.

Note that even when the number of tiers is increased, by symmetrically arranging memory blocks, power consumption can be made to be close to even throughout a memory without dependence on a physical address of a memory cell to be read from or written to.

With a structure such as the foregoing, a high-performance and low power consumption semiconductor device including a high-capacity memory that has low and even power consumption can be provided.

EMBODIMENT 3

A memory of the present invention can be used for electronic appliances of a variety of fields that are equipped with a memory. That is, the present invention includes electronic appliances equipped with a memory. For example, a camera such as a video camera or a digital camera; a goggle-type display (head-mounted display); a navigation system; a sound reproduction system (a car audio system, an audio component, and the like); a computer; a game machine; a portable information terminal (a mobile computer, a portable phone, a portable game machine, an electronic book, and the like); an image reproduction device equipped with a recording medium (specifically, a device that can reproduce a recording medium such as a DVD (digital versatile disc) and that is equipped with a display that can display the image); and the like can be given as electronic appliances to which the memory of the present invention is applied. Specific examples of such electronic appliances are shown in FIGS. 11A to 11E.

Figure 11A:
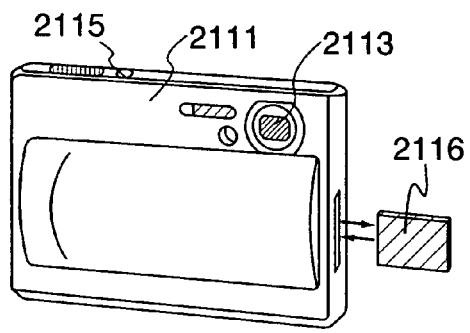
FIGS. 11A to 11E are each a diagram showing an example of a use of a non-volatile semiconductor storage device of the present invention.
Figure 11B:
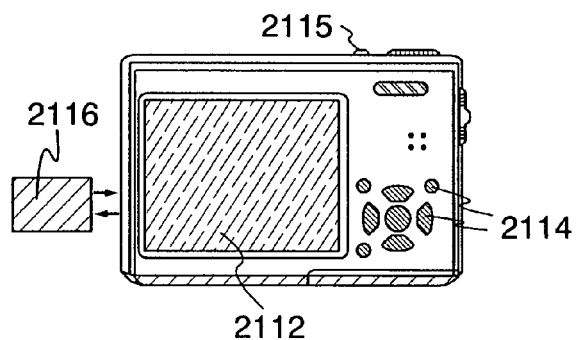

FIGS. 11A and 11B show a digital camera. FIG. 11B is a rear view of the camera in FIG. 11A. This digital camera includes a housing 2111, a display portion 2112, a lens 2113, an operation key 2114, and a shutter-release button 2115. The digital camera also includes a nonvolatile memory 2116 that can be taken out, and data taken by this digital camera is stored in the memory 2116. The memory of the present invention can be applied to the nonvolatile memory 2116.

Figure 11C:
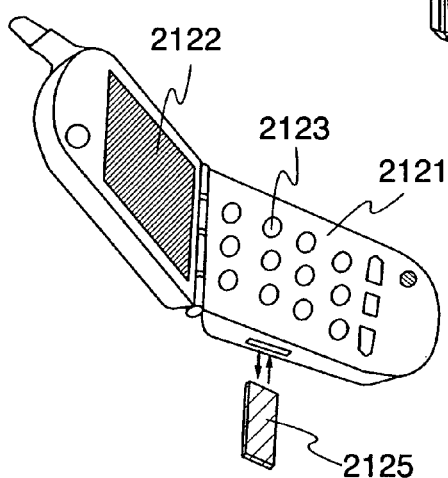

Also, FIG. 11C shows a portable phone, which is a typical example of the portable information terminal. This portable phone includes a housing 2121, a display portion 2122, an operation key 2123, and the like. Also, the portable phone includes a nonvolatile memory 2125 that can be taken out, and data such as telephone number of the portable phone, an image, music data, or the like can be stored in the memory 2125 and reproduced. The memory of the present invention can be applied to the memory 2125.

Figure 11D:
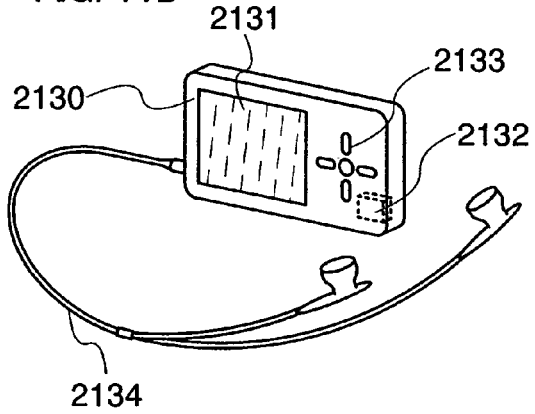

Further, FIG. 11D shows a digital player, which is a typical example of a sound reproduction device. The digital player shown in FIG. 11D includes a main body 2130, a display portion 2131, a memory portion 2132, an operation portion 2133, earphones 2134, and the like. Note that the earphones 2134 can be replaced with headphones or wireless earphones. The memory of the present invention can be used for the memory portion 2132. For example, by operating the operation portion 2133 using a high-capacity memory with a storage capacity of 20 to 200 gigabytes (GB), an image or audio (music) can be recorded and reproduced. Note that power consumption of the display portion 2131 can be suppressed by displaying white characters on a black background. This is particularly effective in a portable type audio device. Also, the memory portion 2132 may be a type that can be taken out.

Figure 11E:
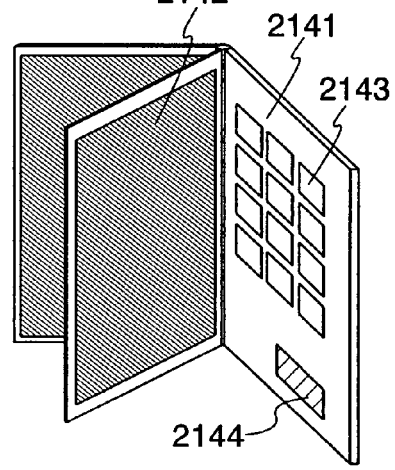

FIG. 11E shows an electronic book (also called electronic paper). This electronic book includes a main body 2141, a display portion 2142, an operation key 2143, and a memory portion 2144. Also, a modem may be incorporated in the main body 2141, or the electronic book may be formed to be capable of transmitting and receiving information wirelessly. For the memory portion 2144, a nonvolatile semiconductor storage device formed using the present invention can be used. For example, by operating the operation key 2143 using a NAND type nonvolatile memory with a storage capacity of 20 to 200 gigabytes (GB), an image or audio (music) can be recorded and reproduced. Note that the memory portion 2144 may be a type that can be taken out.

As described above, an application range of the present invention is extremely wide, and the present invention can be used in electronic appliances of a variety of fields that include memories. Since the memory of the present invention is high-capacity and has low power consumption, it makes it possible to carry around a large amount of data in a battery-driven electronic appliance such as that shown in FIGS. 11A to 11E without influencing driving time of the battery.

EMBODIMENT 4

In this embodiment, an example of forming a static RAM (SRAM), which is one component included in a semiconductor device of the present invention, is described with reference to FIG. 12A to 14B.

Figure 12A:
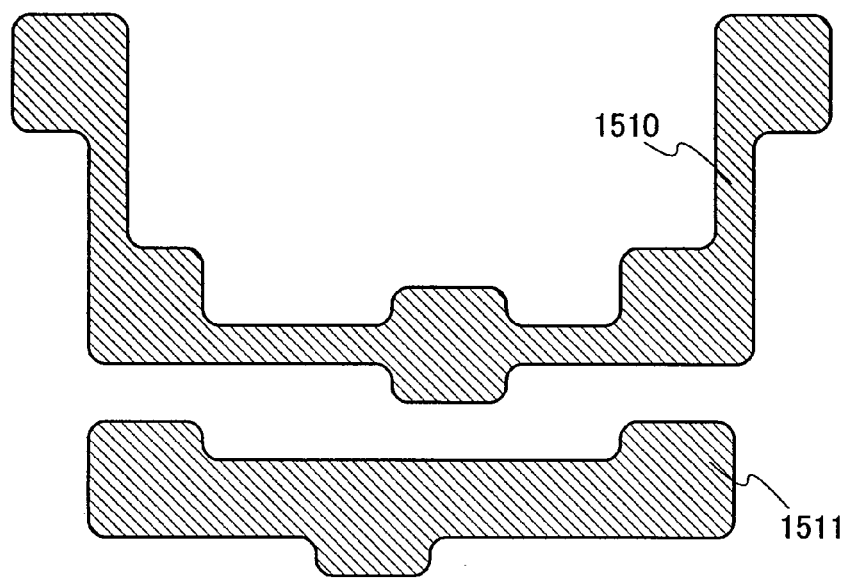
FIGS. 12A and 12B are diagrams of a layout showing a manufacturing method of a semiconductor device of the present invention.

Semiconductor layers 1510 and 1511 shown in FIG. 12A are preferably formed using silicon or a crystalline semiconductor including silicon as a component. For example, polycrystalline silicon obtained by crystallizing a silicon film by laser annealing, monocrystalline silicon, or the like is applied. Alternatively, a metal oxide semiconductor, amorphous silicon, or an organic semiconductor exhibiting a semiconductor characteristic can be applied.

In any case, a semiconductor layer formed first is formed over an entire surface of a substrate having an insulating surface or a portion thereof (a region having a larger area than a region that is set as a semiconductor region of a transistor). Then, a mask pattern is formed over the semiconductor layer by a photolithography technique. By subjecting the semiconductor layer to an etching treatment utilizing the mask pattern, the semiconductor layers 1510 and 1511 that are island-shaped, each including a source region, a drain region and a channel formation region of a TFT, are formed. Shapes of the semiconductor layers 1510 and 1511 are decided in consideration of the appropriateness of a layout.

Figure 12B:
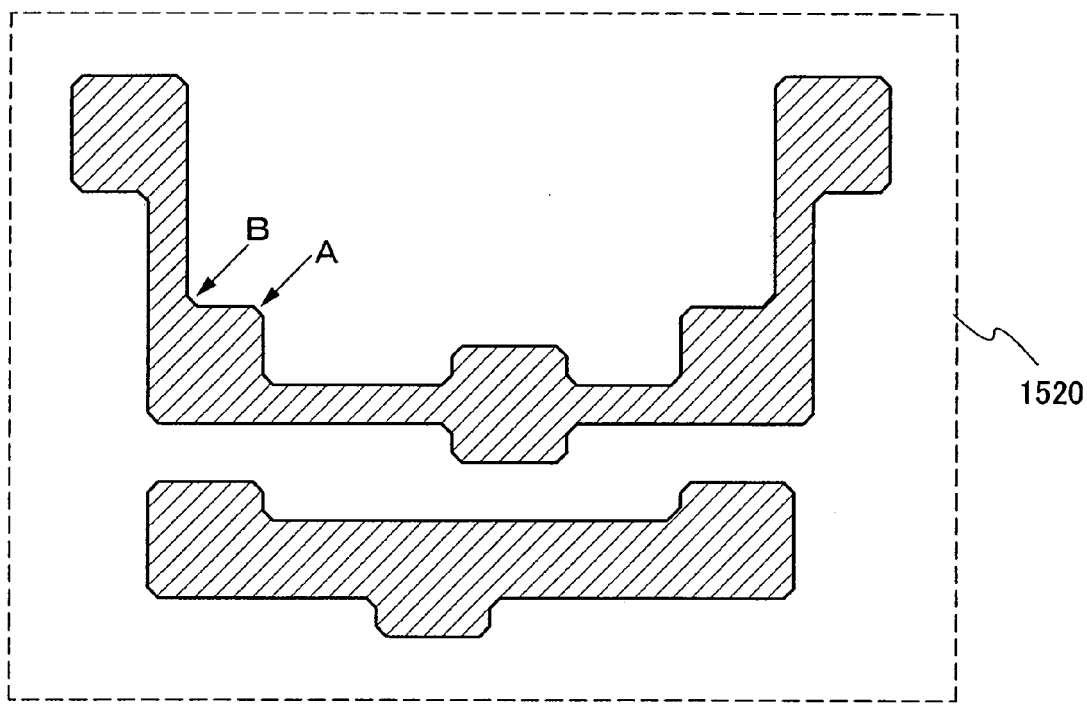

A photomask for forming the semiconductor layers 1510 and 1511 shown in FIG. 12A has a mask pattern 1520 shown in FIG. 12B. This mask pattern 1520 differs depending on whether a resist used in a photolithography step is a positive-type or a negative-type. In a case where a positive-type resist is used, the mask pattern 1520 shown in FIG. 12B is formed as a light-shielding portion. The mask pattern 1520 has a polygonal shape where an apex A is removed. Also, a bend portion B has a bent shape so that a corner portion thereof does not have a right angle. In this photomask pattern, for example, a right triangle with a side of 10 μm or less in a corner portion of the pattern is removed.

A shape of the mask pattern 1520 shown in FIG. 12B is reflected on the semiconductor layers 1510 and 1511 shown in FIG. 12A. In that case, a shape similar to that of the mask pattern 1520 may be transferred, but the transferred shape may be a shape which has a rounder corner portion than that of the mask pattern 1520. In other words, the shape may be a smoother pattern shape than the shape of the mask pattern 1520, with a rounded portion.

Figure 13A:
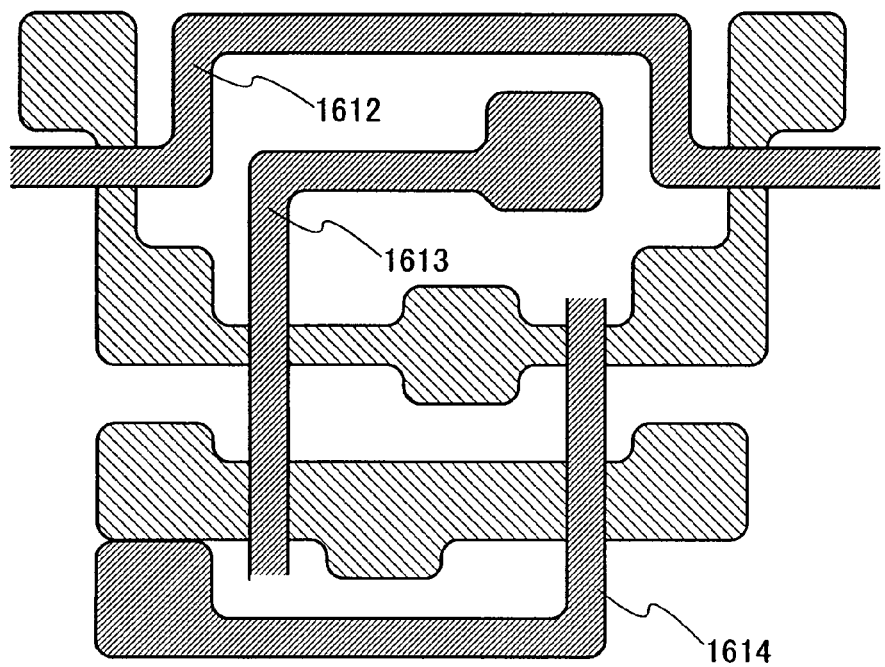
FIGS. 13A and 13B are diagrams of a layout showing a manufacturing method of a semiconductor device of the present invention.

Over the semiconductor layers 1510 and 1511, an insulating layer at least partially including silicon oxide or silicon nitride is formed. One object for forming this insulating layer is to form a gate insulating layer. Then, as shown in FIG. 13A, gate wirings 1612, 1613, and 1614 are formed so as to partially overlap the semiconductor layers. The gate wiring 1612 is formed to correspond to the semiconductor layer 1510, the gate wiring 1613 is formed to correspond to the semiconductor layers 1510 and 1511, and the gate wiring 1614 is formed to correspond to the semiconductor layers 1510 and 1511. The gate wirings are formed by forming a metal layer or a semiconductor layer with high conductivity and then shaping it over an insulating layer by a photolithography technique.

Figure 13B:
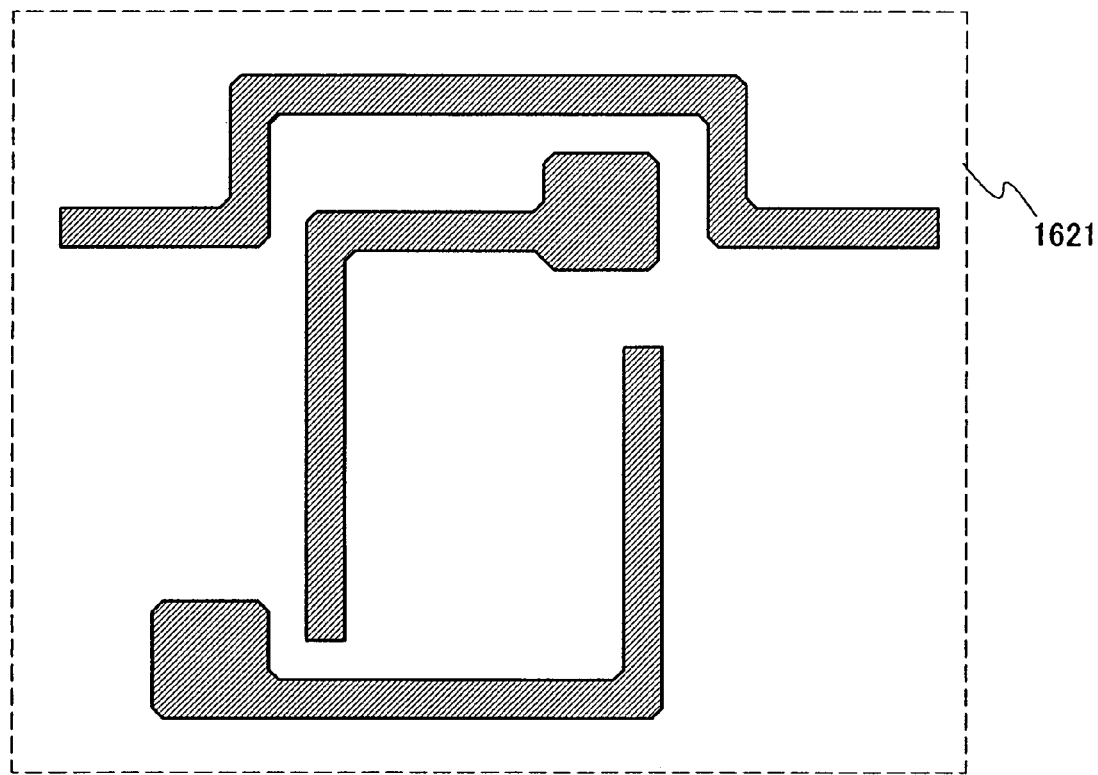

A photomask for forming this gate wiring has a mask pattern 1621 shown in FIG. 13B. A right triangle with a side of 10 μm or less or a triangle with a side having a length that is ⅕ to ½ of a wiring width is removed from a corner portion of this mask pattern 1621. A shape of the mask pattern 1621 shown in FIG. 13B is reflected on the gate wirings 1612, 1613, and 1614 shown in FIG. 13A. In that case, a shape similar to that of the mask pattern 1621 may be transferred, but the transferred shape may be a shape which has a rounder corner portion than that of the mask pattern 1621. In other words, the shape of the gate wirings may be a smoother pattern shape than the shape of the mask pattern 1621, with a rounded portion. That is, a corner portion of each of the gate wirings 1612, 1613, and 1614 is rounded off so that ⅕ to ½ of a wiring width is removed. Accordingly, tremendous improvement in yield can be realized as a result of a convex portion suppressing generation of fine powder due to abnormal electrical discharge when performing dry etching with plasma, and a concave portion washing away the fine powder easily collected at a corner when washing is performed, even if such fine powder is generated.

An interlayer insulating layer is a layer formed after the gate wirings 1612, 1613, and 1614. The interlayer insulating layer is formed using an inorganic insulating material such as silicon oxide, or an organic insulating material that uses polyimide, an acrylic resin, or the like. Between this interlayer insulating layer and the gate wirings 1612, 1613, and 1614, an insulating layer of silicon nitride, silicon nitride oxide, or the like may be provided. Also, an insulating layer of silicon nitride, silicon nitride oxide, or the like may also be provided over the interlayer insulating layer. This insulating layer can prevent contamination of the semiconductor layers or the gate insulating layer by an impurity such as an exogenous metal ion or moisture, which is not good for a TFT.

Figure 14A:
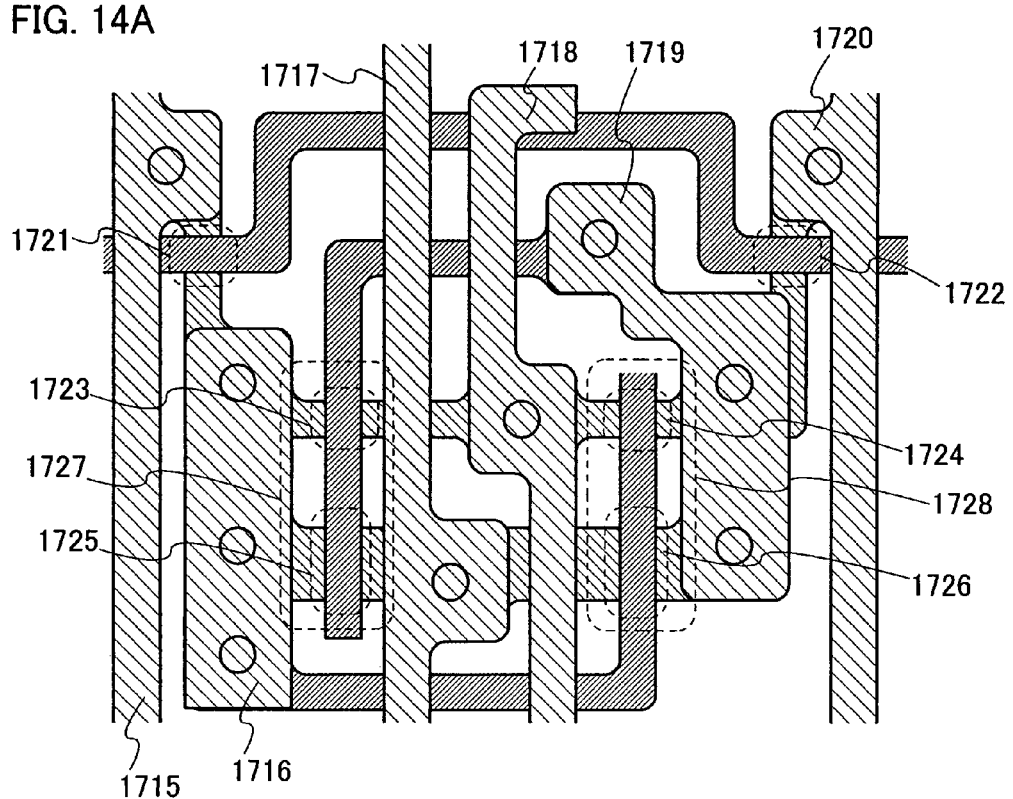
FIGS. 14A and 14B are diagrams of a layout showing a manufacturing method of a semiconductor device of the present invention.

In the interlayer insulating layer, an open portion is formed in a predetermined position. For example, the open portion is provided to correspond to the gate wiring or semiconductor layer that is in a lower layer. A wiring layer, which is formed of a single layer of a metal or a metal compound, or a plurality of layers thereof, is formed to have a prescribed pattern by an etching process using a mask pattern formed by a photolithography technique. Then, as shown in FIG. 14A, wirings 1715 to 1720 are formed so as to partially overlap the semiconductor layers. The wirings link specific elements. The wirings do not link the specific elements in a straight line, and there is a bend portion because of a limitation in terms of layout. Also, a wiring width changes in a contact portion or in another region. In the contact region, in a case where a contact hole is as large as the wiring width or larger, the wiring width changes so as to be wider in the contact portion.

Figure 14B:
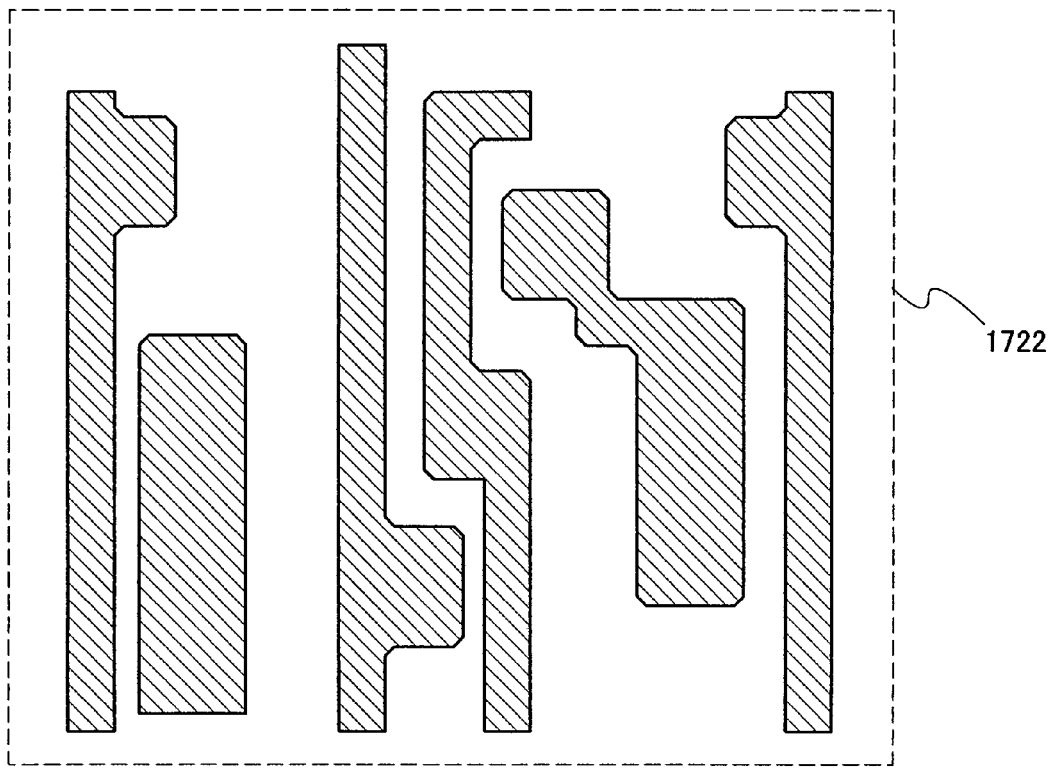

A photomask for forming these wirings 1715 to 1720 has a mask pattern 1722 shown in FIG. 14B. In this case also, a right triangle with a side of 10 μm or less or a triangle with a side having a length that is ⅕ to ½ of a wiring width is removed from a corner portion of each of the wirings so that the corner portion has a rounded pattern. The corner portion is rounded off so that ⅕ to ½ of a wiring width is removed. With such wirings, tremendous improvement in yield can be realized as a result of a convex portion suppressing generation of fine powder due to abnormal electrical discharge when performing dry etching with plasma, and a concave portion washing away the fine powder easily collected at a corner when washing is performed, even if such fine powder is generated. By the corner portions of the wirings being rounded, they can conduct electricity more easily. Further, with a plurality of parallel wirings, it is very convenient in washing away dust.

In FIG. 14A, n-channel thin film transistors 1721 to 1724 and p-channel thin film transistors 1725 and 1726 are formed. The n-channel thin film transistor 1723 and the p-channel thin film transistor 1725 form an inverter, and the n-channel thin film transistor 1724 and the p-channel thin film transistor 1726 also form an inverter. A circuit including these six thin film transistors forms an SRAM. In a layer above these thin film transistors, an insulating layer of silicon nitride, silicon oxide, or the like may be formed.

With such a structure as the above, a high-performance semiconductor element with low power consumption can be provided to be lighter in weight and lower in cost.

EMBODIMENT 5

In this embodiment, a transistor forming a semiconductor device of the present invention is described with reference to FIGS. 15 to 16E.

The transistor forming the semiconductor device of the present invention can include a thin film transistor (TFT) instead of a MOS transistor formed over a monocrystalline substrate. FIG. 15 is a figure showing a cross-sectional structure of a thin film transistor forming such circuits. In FIG. 15, an n-channel thin film transistor 1821, an n-channel thin film transistor 1822, a capacitor 1824, a resistor 1825, and a p-channel thin film transistor 1823 are shown. Each thin film transistor includes a semiconductor layer 1805, an insulating layer 1808, and a gate electrode 1809. The gate electrode 1809 is formed of a stacked-layer structure of a first conductive layer 1803 and a second conductive layer 1802. Also, FIGS. 16A to 16E are top views of the n-channel thin film transistor 1821, the n-channel thin film transistor 1822, the capacitor 1824, the resistor 1825, and the p-channel thin film transistor 1823 shown in FIG. 15, respectively, which can also be referred to.

Figure 15:
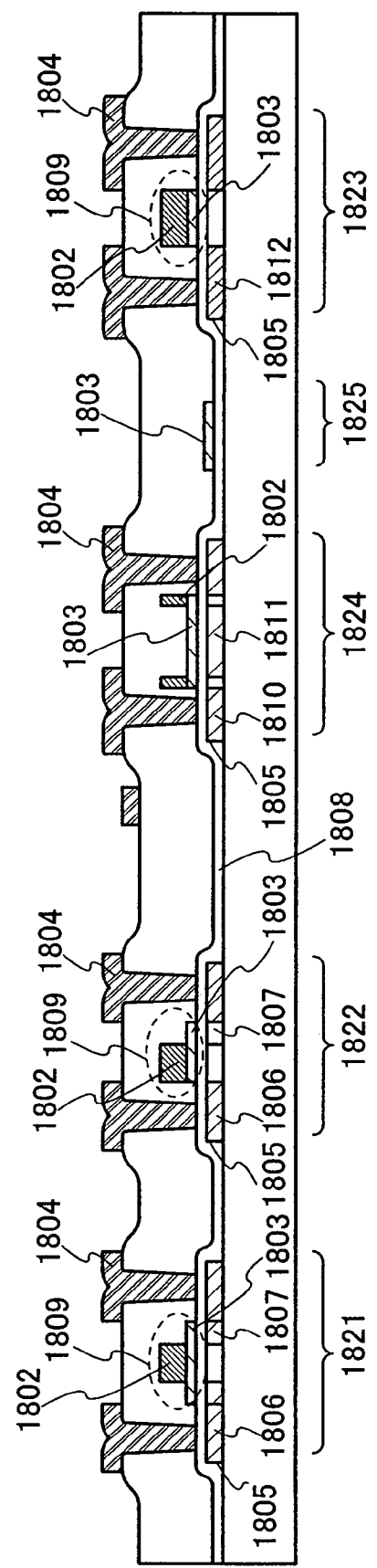
FIG. 15 is a cross-sectional diagram of a thin film transistor forming a semiconductor device of the present invention.

In the n-channel thin film transistor 1821 in FIG. 15, an impurity region 1807 is formed on both sides of a gate electrode in the semiconductor layer 1805. The impurity region 1807 is also called a low-concentration drain (LDD) and is doped at a lower concentration than an impurity concentration of an impurity region 1806 formed as a source region or drain region that form contact with the wiring 1804. In a case of the n-channel thin film transistor 1821, phosphorus or the like is added to the impurity region 1806 and the impurity region 1807 as an impurity imparting n-type. The LDD is formed as a means to suppress hot electron degradation or a short-channel effect.

Figure 16A:
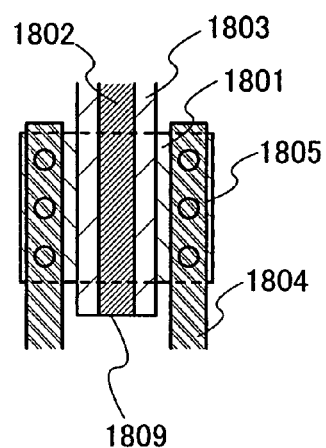
FIGS. 16A to 16E are each a layout diagram of a semiconductor element forming a semiconductor device of the present invention.

As shown in FIG. 16A, in the gate electrode 1809 of the n-channel thin film transistor 1821, the first conductive layer 1803 is formed to expand past both sides of the second conductive layer 1802. In this case, a film thickness of the first conductive layer 1803 is thinner than a film thickness of the second conductive layer. The thickness of the first conductive layer 1803 is a thickness with which ion species that has accelerated in an electric field of 10 to 100 kV can pass through. The impurity region 1807 is formed to overlap the first conductive layer 1803 of the gate electrode 1809. In other words, an LDD region that overlaps with the gate electrode 1809 is formed. In this structure, the impurity region 1807 is formed in a self-aligned manner by adding an impurity imparting one conductivity type to the semiconductor layer 1805 through the first conductive layer 1803 with the second conductive layer 1802 as a mask. That is, the LDD overlapping the gate electrode is formed in a self-aligned manner.

A thin film transistor having an LDD on both sides is applied to a rectifying TFT for a power source circuit or a thin film transistor forming a transmission gate (also called an analog switch) used for a logic circuit. An LDD is preferably provided on both sides of a gate electrode for such TFTs, since both positive and negative voltages are applied to a source electrode or drain electrode.

Also, in a case of forming a gate wiring using the second conductive layer 1802, the first conductive layer 1803 may be patterned so that one side of the first conductive layer 1803 is aligned with one side of the second conductive layer 1802, and another side of the first conductive layer 1803 is aligned with another side of the second conductive layer 1802. As a result, a fine gate wiring can be formed. Also, it is not necessary that the LDD overlapping the gate electrode be formed in a self-aligned manner.

Figure 16B:
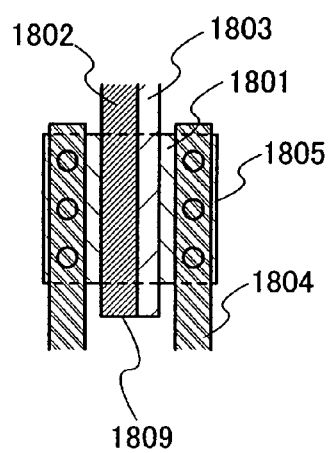

In the n-channel thin film transistor 1822 of FIG. 15, the impurity region 1807 doped at a lower concentration than an impurity concentration of the impurity region 1806 is formed on one side of the gate electrode in the semiconductor layer 1805. As shown in FIG. 16B, in the gate electrode 1809 of the n-channel thin film transistor 1822, the first conductive layer 1803 is formed to expand past one side of the second conductive layer 1802. Similarly, in this case also, the LDD can be formed in a self-aligned manner by adding an impurity imparting one conductivity type through the first conductive layer 1803 with the second conductive layer 1802 as a mask.

A thin film transistor having an LDD on one side may be applied to a thin film transistor in which only a positive voltage or negative voltage is applied between a source electrode and a drain electrode. Specifically, it may be applied to a thin film transistor forming a logic gate such as an inverter circuit, a NAND circuit, a NOR circuit, or a latch circuit; or a thin film transistor forming an analog circuit such as a sense amplifier, a constant-voltage generating circuit, or a VCO.

Figure 16C:
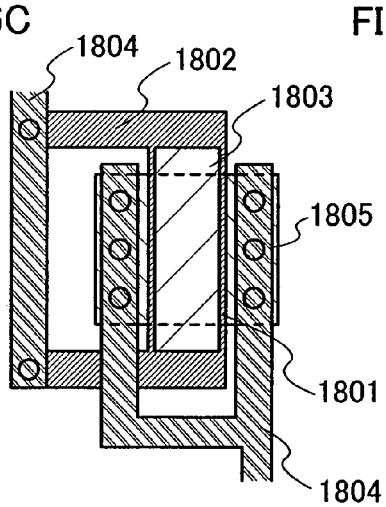

In FIG. 15, the capacitor 1824 is formed by sandwiching the insulating layer 1808 with the first conductive layer 1803 and the semiconductor layer 1805. The semiconductor layer 1805 for forming the capacitor 1824 includes impurity regions 1810 and 1811. The impurity region 1811 is formed in the semiconductor layer 1805 in a position overlapping with the first conductive layer 1803. The impurity region 1810 forms a contact with the wiring 1804. The impurity region 1811 can be formed by adding an impurity imparting one conductivity type through the first conductive layer 1803; therefore, impurity concentrations of the impurity regions 1810 and 1811 can be made to be either the same or different. In either case, since the semiconductor layer 1805 in the capacitor 1824 functions as an electrode, the resistance of the semiconductor layer 1805 is preferably lowered by adding an impurity imparting one conductivity type. Further, the first conductive layer 1803 can fully function as an electrode by utilizing the second conductive layer 1802 as an auxiliary electrode as shown in FIG. 16C. In this manner, by forming a composite electrode structure where the first conductive layer 1803 and the second conductive layer 1802 are combined, the capacitor 1824 can be formed in a self-aligned manner.

The capacitor is used as a storage capacitor included in a power circuit of a wireless chip or a resonant capacitor included in a resonance circuit later described in Embodiment 6. In particular, a resonant capacitor needs to function as a capacitor regardless of whether a voltage between two terminals of the capacitor is positive or negative, since both positive and negative voltages are applied between the two terminals.

Figure 16D:
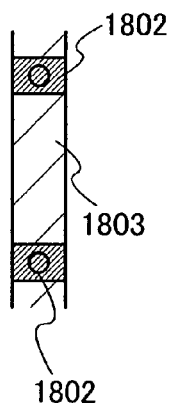

In FIG. 16D, the resistor 1825 is formed of the first conductive layer 1803. Since the first conductive layer 1803 is formed with a thickness of about 30 to 150 nm, the resistor can be formed by appropriately setting width and length of the first conductive layer 1803.

The resistor is used for a resistance load included in a modulation/demodulation circuit of a wireless chip later described in Embodiment 6. Also, the resistor may also be used as a load in a case where current is controlled by a VCO or the like. The resistor may be formed of semiconductor layer containing an impurity element at high concentration or a thin metal layer. The metal layer is preferable because variation in resistors can be small, since a resistance value is determined by few parameters such as film thickness and film quality, as opposed to the semiconductor layer whose resistance value is dependent on film thickness, film quality, impurity concentration, activation rate, and the like.

Figure 16E:
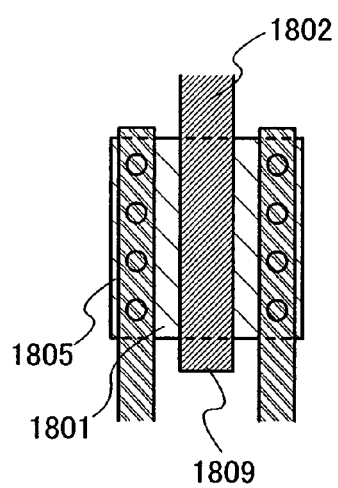

In FIG. 16E, the p-channel thin film transistor 1823 includes an impurity region 1812 in the semiconductor layer 1805. This impurity region 1812 forms a source region and drain region which forms a contact with the wiring 1804. A structure of the gate electrode 1809 is that which the first conductive layer 1803 and the second conductive layer 1802 overlap. The p-channel thin film transistor 1823 has a single drain structure in which an LDD is not provided. When forming the p-channel thin film transistor 1823, boron or the like is added to the impurity region 1812 as an impurity imparting p-type. Alternatively, by adding phosphorus to the impurity region 1812, an n-channel thin film transistor with a single drain structure is formed.

One or both of the semiconductor layer 1805 and the insulating layer 1808 that functions as a gate insulating layer may be oxidized or nitrided by high-density plasma treatment with the conditions of microwave excitation, an electron temperature of less than or equal to 2 eV, an ion energy of less than or equal to 5 eV, and an electron density in the range of $1\times10^{11}$ to $1\times10^{13}$ cm$^3$. At this time, by treating the layer in an oxygen atmosphere (e.g., $O_2$, $N_2O$, or the like) or a nitrogen atmosphere (e.g., $N_2$, $NH_3$, or the like) with the substrate temperature being set at 300 to 450° C., a defect level of an interface between the semiconductor layer 1805 and the insulating layer 1808 that functions as a gate insulating layer can be lowered. By performing such treatment to the insulating layer 1808 that functions as a gate insulating layer, the insulating layer 1808 that functions as a gate insulating layer can be made to be dense. That is, generation of defective charges can be suppressed, and thus fluctuations of the threshold voltage of the transistor can be suppressed. In addition, in the case of driving the transistor with a voltage of less than or equal to 3 V, an insulating layer oxidized or nitrided by the aforementioned plasma treatment can be used as the insulating layer 1808 that functions as a gate insulating layer. Meanwhile, in the case of driving the transistor with a voltage of greater than or equal to 3 V, the insulating layer 1808 that functions as a gate insulating layer can be formed by combining an insulating layer formed on the surface of the semiconductor layer 1805 by the aforementioned plasma treatment with an insulating layer deposited by CVD (plasma CVD or thermal CVD). Similarly, such an insulating layer can be utilized as a dielectric layer of the capacitor 1824 as well. In this case, the insulating layer formed by the plasma treatment is a dense film with a thickness of 1 to 10 nm; therefore, a capacitor with a high capacity can be formed.

As described with reference to FIGS. 15 to 16E, elements with various structures can be formed by combining conductive layers with various thicknesses. A region where only the first conductive layer is formed and a region where both the first conductive layer and the second conductive layer are formed can be formed by using a photomask or a reticle having a diffraction grating pattern or an auxiliary pattern which is formed of a semi-transmissive film and has a function of reducing the light intensity. That is, the thickness of the resist mask to be developed is varied by controlling the quantity of light that the photomask can transmit, at the time of exposing the photoresist to light in the photolithography process. In this case, a resist with the aforementioned complex shape may be formed by providing the photomask or the reticle with slits with a resolution limit or narrower than that. Further, the mask pattern formed of the photoresist material may be transformed by baking at 200° C. after development.

By using a photomask or a reticle having a diffraction grating pattern or an auxiliary pattern which is formed of a semi-transmissive film and has a function of reducing the light intensity, the region where only the first conductive layer is formed and the region where the first conductive layer and the second conductive layer are stacked can be continuously formed. As shown in FIG. 16A, the region where only the first conductive layer is formed can be selectively formed over the semiconductor layer. Whereas such a region is effective over the semiconductor layer, it is not required in other regions (wire regions which are connected to a gate electrode). With such a photomask or reticle, the region where only the first conductive layer is not formed in the wire portion; therefore, the density of the wire can be substantially increased.

In FIGS. 15 to 16E, the first conductive layer is formed with a thickness of 30 to 50 nm, using high-melting-point metals such as tungsten (W), chromium (Cr), tantalum (Ta), tantalum nitride (TaN), or molybdenum (Mo), or alloys or compounds containing such metals as a main component, while the second conductive layer is formed with a thickness of 300 to 600 nm, using high-melting-point metals such as tungsten (W), chromium (Cr), tantalum (Ta), tantalum nitride (TaN), or molybdenum (Mo), or alloys or compounds containing such metals as a main component. For example, the first conductive layer and the second conductive layer are formed with different conductive materials, so that the etching rate of each conductive layer can be varied in the etching process to be performed later. For example, TaN can be used for the first conductive layer, while a tungsten film can be used for the second conductive layer.

This embodiment shows that transistors, a capacitor, and a resistor each having a different electrode structure can be formed concurrently through the same patterning process, using a photomask or a reticle having a diffraction grating pattern or an auxiliary pattern which is formed of a semi-transmissive film and has a function of reducing the light intensity. Accordingly, elements with different modes can be formed and integrated in accordance with the characteristics required of a circuit, without increasing the number of manufacturing steps.

By forming a semiconductor device with such thin film transistor as the foregoing, a high-performance wireless chip with low power consumption can be 3provided to be lighter in weight and lower in cost.

EMBODIMENT 6

In recent years, a compact semiconductor device (hereinafter referred to as a wireless chip) that is a combination of an ultra compact IC chip and an antenna for wireless communication has received a lot of attention. Data can be written to or read from the wireless chip by transferring and receiving a communication signal (operation magnetic field) using a wireless communication device (hereinafter referred to as a reader/writer).

As an application field of the wireless chip, merchandise management in the distribution industry is given as an example. Although merchandise management utilizing a barcode is widely used in general, since data of a barcode is read optically, data cannot be read when there is an interrupting object. Meanwhile, since the wireless chip reads data wirelessly, the data can be read even if there is an interruption object. Consequently, an improvement in efficiency and reduction in cost of merchandise management can be realized. In addition, the wireless chip can be widely applied to, for example, train tickets, airplane tickets, and automatic resets.

As the range of application of wireless chips expands, wireless chips having further advanced functions are increasingly in demand. For example, data can be prevented from being leaked to a third party by encrypting transmitted/received data. For this purpose, there are methods of performing coding/decoding processing using hardware, using software, and using both hardware and software. In the method of processing using hardware, an arithmetic circuit is a circuit dedicated for coding/decoding. In the method of processing using software, an arithmetic circuit includes a CPU (Central Processing Unit) and a large scale memory, and the CPU executes a coding/decoding program. In the method of processing using both hardware and software, an arithmetic circuit includes a coding/decoding dedicated circuit, a CPU, and a memory; the dedicated circuit performs part of arithmetic processing of coding/decoding, and the CPU executes programs other than arithmetic processing. However, in any case, a wireless chip is to be provided with a high-capacity memory. By applying the present invention, rise in power consumption can be avoided even if the capacity of the memory is increased.

Figure 17:
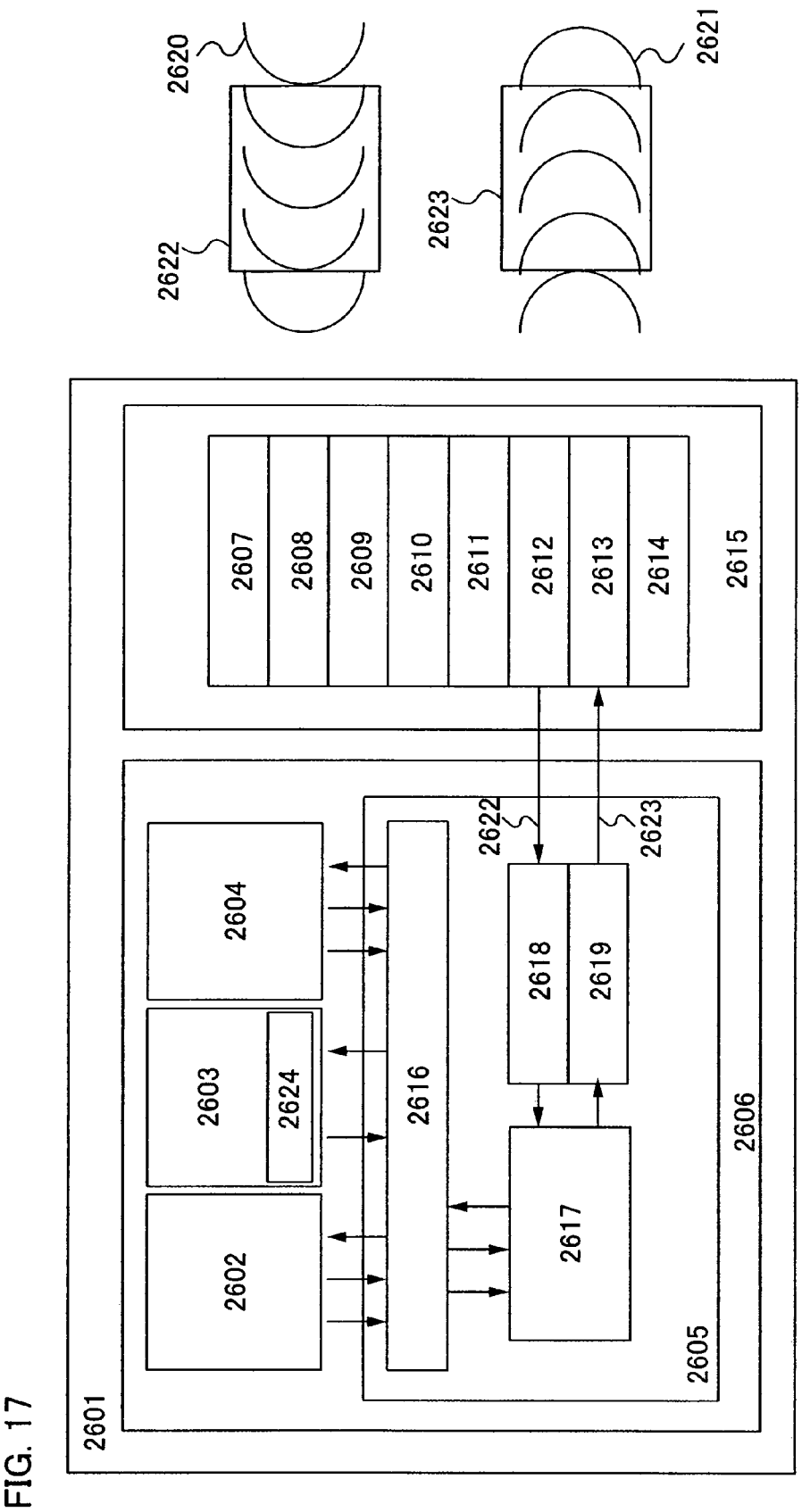
FIG. 17 is a block diagram of a wireless chip of the present invention.
Figure 18:
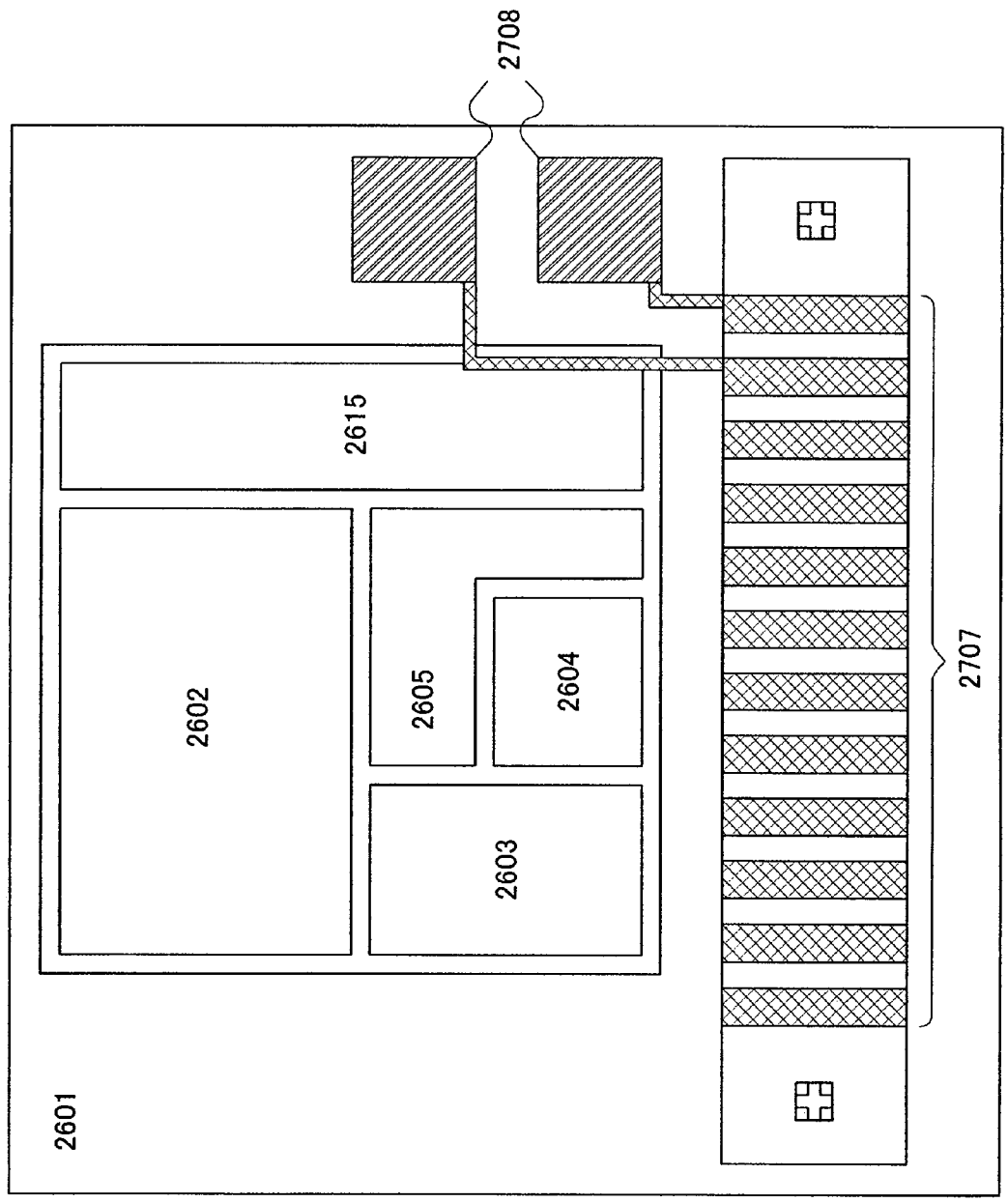
FIG. 18 is a layout diagram of a wireless chip of the present invention.
Figure 19:
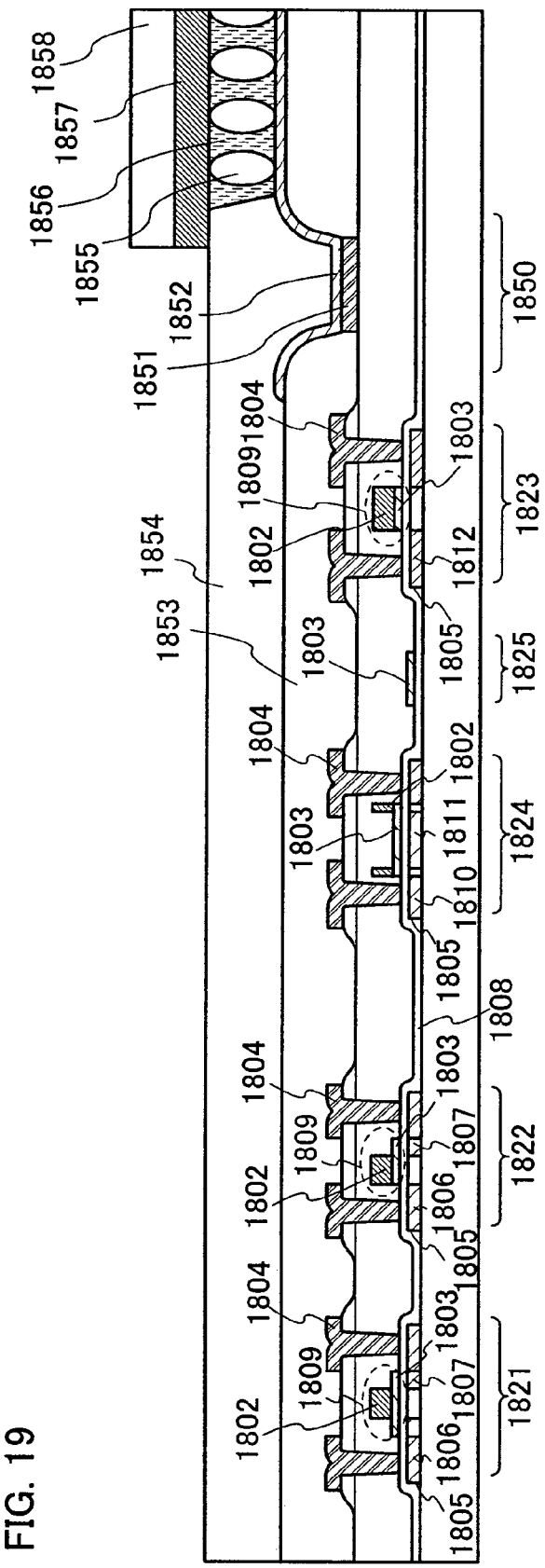
FIG. 19 is a cross-sectional diagram of a wireless chip of the present invention.

In this embodiment, as an example of a semiconductor device according to the present invention, a wireless chip having a cipher processing function is described with reference to FIGS. 17 to 19. FIG. 17 is a block diagram of the wireless chip, FIG. 18 is a layout diagram of the wireless chip, and FIG. 19 is a cross-sectional diagram of the wireless chip.

First, a block structure of the wireless chip is described with reference to FIG. 17. In FIG. 17, a wireless chip 2601 includes an arithmetic circuit 2606 which includes a CPU 2602, a ROM 2603, a RAM 2604 and a controller 2605; and an analog portion 2615 which includes an antenna 2607, a resonance circuit 2608, a power source circuit 2609, a reset circuit 2610, a clock generating circuit 2611, a demodulation circuit 2612, a modulation circuit 2613, and a power source managing circuit 2614. The controller 2605 includes a CPU interface (CPUIF) 2616, a control register 2617, a code extracting circuit 2618, and an encoding circuit 2619. Note that although in FIG. 17, a communication signal is shown separated into a reception signal 2620 and a transmission signal 2621 for simplification of the description, they actually overlap each other and are transmitted and received simultaneously between the wireless chip 2601 and a reader/writer. The reception signal 2620 is demodulated by the demodulation circuit 2612 after they are received by the antennal 2607 and the resonance circuit 2608. Also, the transmission signal 2621 is transmitted from the antenna 2607 after it is modulated by the modulation circuit 2613.

In FIG. 17, when the wireless chip 2601 is placed inside the magnetic field generated by a communication signal, induced electromotive force is produced by the antenna 2607 and the resonance circuit 2608. The induced electromotive force is held by a capacitor in the power source circuit 2609, further, the potential is stabilized by the capacitor, and the induced electromotive force is supplied as power source voltage to each circuit of the wireless chip 2601. The reset circuit 2610 generates an original reset signal for the whole wireless chip 2601. For example, the reset circuit generates a signal which rises after rise in the power source voltage with delay as a reset signal. The clock generating circuit 2611 changes the frequency of a clock signal and the duty ratio in response to a control signal generated by the power source managing circuit 2614. The demodulation circuit 2612 detects amplitude variation of the received signal 2620 of an ASK system as received data 2622 of "0" or "1". The demodulation circuit 2612 is, for example, a low-pass filter. Further, the modulation circuit 2613 transmits transmitted data by varying amplitude of the transmitted signal 2621 of an ASK system. For example, in a case where a transmitted data 2623 is "0", the resonance point of the resonance circuit 2608 is changed, thereby changing amplitude of the communication signal. The power source managing circuit 2614 monitors the power source voltage supplied from the power source circuit 2609 to the arithmetic circuit 2606 or current consumption in the arithmetic circuit 2606, thereby generating a control signal for changing frequency of the clock signal and the duty ratio in the clock generating circuit 2611.

An operation of a wireless chip of this embodiment is described. First, a signal 2622 including cipher text data is received by the wireless chip 2601 from the received signal 2620 transmitted from the reader/write. After the received signal 2620 is demodulated by the demodulation circuit 2612, the received signal 2620 is separated into a control command, cipher text data, and the like by a code extracting circuit 2618, and then it is stored in the control register 2617. Here, the control command is a data for designating response of the wireless chip 2601. For example, transmission of a unique ID number, operation stop, decoding, and the like are designated. Here, assume that a control command for decoding is received.

Subsequently, in the arithmetic circuit 2606, a CPU 2602 decodes a cipher text using a private key 2624 stored in a ROM 2603 in advance in accordance with a decoding program stored in the ROM 2603. The decoded cipher text (decoded text 2623) is stored in the control register 2617. At that time, the RAM 2604 is used as a data storing region. Note that the CPU 2602 accesses the ROM 2603, the RAM 2604, and the control register 2617 via the CPUIF 2616. The CPUIF 2616 has a function of generating an access signal with respect to any one of the ROM 2603, the RAM 2604, and the control register 2617 in accordance with the address which the CPU 2602 demands.

Finally, in the encoding circuit 2619, the transmitted data 2623 is generated from the decoded text and modulated by the modulation circuit 2613, and the transmitted signal 2621 is transmitted to the reader/writer from the antenna 2607.

Note that in this embodiment, a method using software, that is a system in which an arithmetic circuit includes a CPU and a large scale memory, and a program is executed by the CPU has been described as an arithmetic method; however, an arithmetic method may be selected in accordance with the purpose and an arithmetic circuit can be formed based on the method. For example, as another arithmetic method, there are a method using hardware and a method using both hardware and software. In the method of processing using hardware, an arithmetic circuit may be a dedicated circuit. In the method of processing using both hardware and software, an arithmetic circuit may include a dedicated circuit, a CPU, and a memory; the dedicated circuit performs a part of arithmetic processing, and the CPU executes programs other than arithmetic processing.

Next, a layout configuration of a wireless chip is described with reference to FIG. 18. Note that, in FIG. 18, components corresponding to the components shown in FIG. 17 are denoted by the same reference numerals and description thereof is omitted.

In FIG. 18, an FPC pad 2707 is an electrode pad group used for attaching an FPC (Flexible Print Circuit) to the wireless chip 2601, and an antenna bump 2708 is an electrode pad used for attaching the antenna (not shown). Note that when attaching the antenna, excess pressure may be applied to the antenna bump 2708. Therefore, it is desirable that components for forming a circuit such as a transistor are not placed under the antenna bump 2708.

The FPC pad 2707 is mainly effective when used for failure analysis. In the wireless chip, since power source voltage is obtained by a communication signal, for example, the arithmetic circuit does not operate completely when defects are generated in the antenna or the power source circuit. Accordingly, failure analysis is very difficult. However, when power source voltage is supplied to the wireless chip 2601 from the FPC via the FPC pad 2707 and an arbitrary electrical signal is input instead of an electrical signal supplied from the antenna, the arithmetic circuit can be operated. Accordingly, failure analysis can be carried out efficiently.

In addition, it is more effective to place the FPC pad 2707 such that measurement using a prober can be carried out. Specifically, in the FPC pad 2707, when the electrode pad is placed in accordance with a pitch of the prober needle, measurement using a prober is enabled. With the use of a prober, the number of steps for attaching the FPC can be eliminated at a time of failure analysis. Further, measurement can be performed even in the state where a plurality of wireless chips is formed over the substrate; thus, the number of steps for division into individual chips can be eliminated as well. Further, quality inspection of wireless chips can be carried out immediately before the step of attaching an antenna in mass-production. Thus, defectives can be screened out in an earlier stage in the process flow, so that production cost can be reduced.

With the above described configuration, even in the case where power source voltage of a semiconductor device varies and a delay occurs in propagating clock signals, an arithmetic circuit can be operated with stability. Accordingly, a highly reliable semiconductor device having a high-performance arithmetic circuit can be provided. Further, in a wireless chip in which power source voltage is supplied by induced electromotive force from a communication signal and communication data are transmitted/received by an ASK system, even when the communication signal is unstable or power source voltage is unstable, a synchronous circuit can be operated with stability. Therefore, a high-performance and highly reliable wireless chip equipped with a large scale arithmetic circuit can be provided with a suitable structure.

In particular, when a semiconductor device of the present invention is manufactured using a thin film transistor having a semiconductor thin film as an active layer, which is formed over a large substrate having an insulating surface such as a glass substrate, a quartz substrate, or a plastic substrate, manufacturing cost can be substantially reduced. In addition, particularly in the case of using a plastic substrate that has mechanical flexibility, a completed semiconductor device in the present invention can be handled in various forms besides the reduction in manufacturing cost. Also, the semiconductor device of the present invention may be formed using an SOI substrate.

A cross-sectional diagram of such a wireless chip is shown in FIG. 19. First, as described in Embodiment 5 (refer to FIG. 15), steps up to the formation of a wiring 1804 are finished. An insulating layer 1853 is formed so as to cover the wiring 1804. An inorganic material or an organic material can be used for the insulating layer 1853. Silicon oxide or silicon nitride can be used as an inorganic material. Polyimide, acrylic, polyamide, polyimide amide, benzocyclobutene, siloxane, polysilazane, or resist can be used as an organic material. Siloxane is composed of a skeleton formed by the bond of silicon (Si) and oxygen (O), in which an organic group containing at least hydrogen (e.g., an alkyl group or aromatic hydrocarbon) is included as a substituent. Alternatively, a fluoro group may be used as the substituent. Further alternatively, a fluoro group and an organic group containing at least hydrogen may be used as the substituent. Polysilazane is formed with a polymer material having the bond of silicon (Si) and nitrogen (N) as a starting material.

In a connection region 1850, an open portion is formed in the insulating layer 1853 so that a wiring 1851 which is simultaneously formed with the wiring 1804 is exposed. In the open portion, it is preferable that top ends are rounded and the sides are tapered. Thus, breaks in a pattern formed thereafter can be prevented.

In the open portion, the connection wiring 1852 is formed. The connection wiring 1852 can be formed of a film made from an element of aluminum (Al), titanium (Ti), molybdenum (Mo), tungsten (W) or silicon (Si), or of an alloy film using the above-described elements. In addition, a light-transmitting material such as indium tin oxide (ITO), indium tin oxide containing silicon oxide, or indium oxide containing zinc oxide at 2% to 20% can be used. Hereupon, the connection wiring 1852 is provided so as not to overlap with a region such as an n-channel thin film transistor 1821, an n-channel thin film transistor 1822, a capacitor element 1824, a resistor 1825, and a p-channel thin film transistor 1823. Thus, unnecessary parasitic capacitance is prevented from forming.

An insulating layer 1854 is formed so as to cover the insulating layer 1853 and the connection wiring 1852. The insulating layer 1854 can be formed in as similar manner as the insulating layer 1853.

An open portion is formed in the insulating layer 1854 so as to expose the connection wiring 1852 provided over the insulating layer 1853. In the open portion, an anisotropic conductor 1856 containing conductive fine particles 1855 are provided, and an FPC (flexible printed circuit) 1858 including a conductive layer 1857 is connected thereto. In this manner, a wireless chip relating to the present invention can be manufactured.

Note that, as the antenna, an antenna having a size and a shape corresponding to a target frequency may be used under the Radio Law. The frequency of a signal transmitted and received is 125 kHz, 13.56 MHz, 915 MHz, 2.45 GHz or the like, each of which is standardized by ISO or the like. Specifically, a dipole antenna, a patch antenna, a loop antenna, a Yagi antenna, and the like may be used. The shape of an antenna connected to a wireless chip is described hereinafter.

Figure 20A:
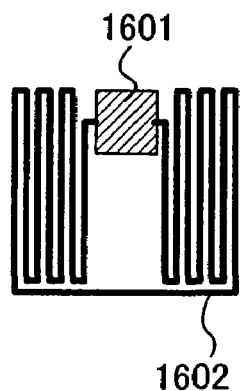
FIGS. 20A to 20D are each a diagram showing an antenna design of a wireless chip of the present invention.

FIG. 20A shows a wireless chip 1601 to which an external antenna 1602 is connected. In FIG. 20A, the wireless chip 1601 is provided at the center portion, and the antenna 1602 is connected to the connection terminal of the wireless chip 1601. The antenna 1602 is bent rectangularly so as to ensure the length of the antenna.

Figure 20B:
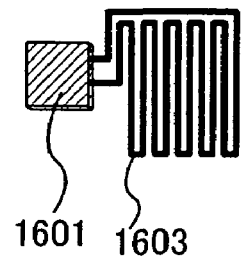

FIG. 20B shows a mode in which an external antenna 1603 is provided on a connection terminal on one side end of the wireless chip 1601. The antenna 1603 is bent rectangularly so as to ensure the length of the antenna.

Figure 20C:
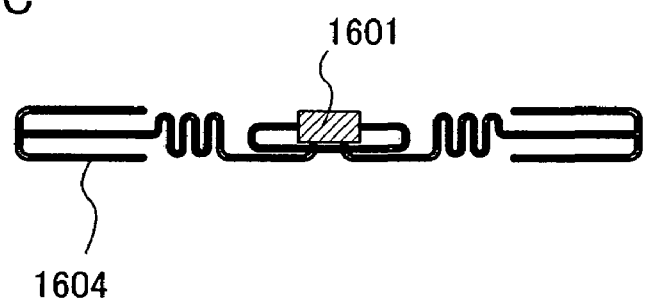

FIG. 20C shows a mode in which an external antenna 1604 bent rectangularly is provided on a side end and another side end of the wireless chip 1601.

Figure 20D:
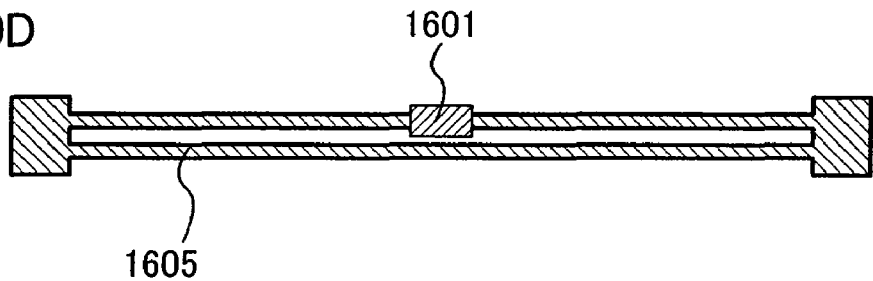

FIG. 20D shows a mode in which the wireless chip 1601 is attached with a linear external antenna 1605 on one side end and another side end.

The shape of an antenna may be selected in accordance with the structure or the polarized wave, or the use of a wireless chip. Specifically, if a dipole antenna is used as the antenna, it may be a folded dipole antenna. If a loop antenna is used as the antenna, it may be a circular loop antenna or a square loop antenna. If a patch antenna is used as the antenna, it may be a circular patch antenna or a square patch antenna.

If a patch antenna is used, the antenna preferably uses a dielectric material such as ceramic. The antenna can be miniaturized by increasing the dielectric constant of a dielectric material used for a substrate of the patch antenna. In addition, the patch antenna has high mechanical strength and thus can be used repeatedly.

A dielectric material of a patch antenna may be formed of ceramic, an organic resin, a mixture of ceramic and an organic resin, or the like. Ceramic is typified by alumina, glass, forsterite, and the like. Further, plural kinds of ceramics may be mixed to be used. In order to obtain a high dielectric constant, a dielectric layer is preferably formed of a ferroelectric material. The ferroelectric material is typified by barium titanate ($BaTiO_3$), lead titanate ($PbTiO_3$), strontium titanate ($SrTiO_3$), lead zirconate ($PbZrO_3$), lithium niobate ($LiNbO_3$), lead zirconate titanate (PZT), and the like. Further, plural kinds of ferroelectric materials may be mixed to be used.

EMBODIMENT 7

In this embodiment, a manufacturing method of a wireless chip is described. Circuits included in a wireless chip according to the present invention can each be manufactured with a thin film transistor. In this embodiment, a method of manufacturing a flexible wireless chip is shown, in which a circuit included in a wireless chip is formed of a thin film transistor, and the circuit is transferred to a flexible substrate from a substrate used in manufacturing the thin film transistor.

In this embodiment, as a circuit included in a wireless chip, a p-channel TFT 326 (also referred to as pch-TFT) included in an inverter or the like, an n-channel TFT 327 (also referred to as nch-TFT), a capacitor 328, and an n-channel TFT of a high withstand voltage type 329 provided for a power source circuit or the like are representatively described. Hereinafter, a manufacturing method of a wireless chip is described with reference to FIGS. 21A to 26.

Figure 21A:
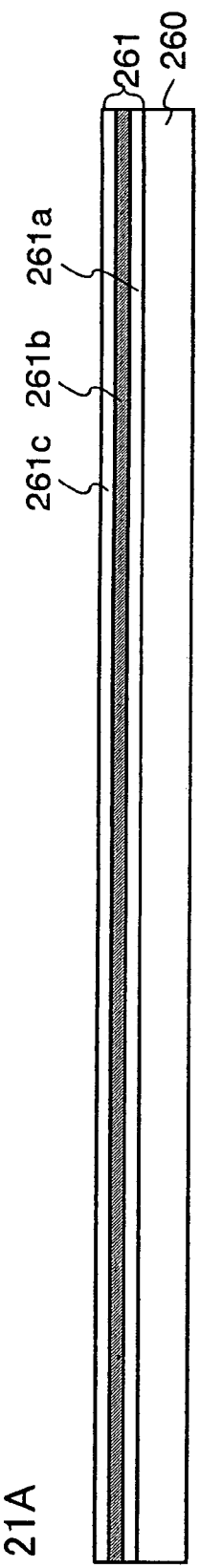
FIGS. 21A to 21D are cross-sectional diagrams for describing manufacturing steps of a wireless chip of the present invention.

A substrate 260 is a glass substrate. As shown in FIG. 21A, a peeling layer 261 including three layers 261a to 261c is formed over the substrate 260. The first layer 261a is formed of a silicon oxynitride film ($SiO_xN_y$, x>y) with a thickness of 100 nm by a parallel plate type plasma CVD apparatus using $SiH_4$ and $N_2O$ as a material gas. The second layer 261b is formed of a tungsten film with a thickness of 30 nm using a sputtering apparatus. The third layer 261c is formed of a silicon oxide film with a thickness of 200 nm using a sputtering apparatus.

By the formation of the third layer 261c (silicon oxide), a surface of the second layer 261b (tungsten) is oxidized to form tungsten oxide at the interface. By the formation of the tungsten oxide, the substrate 261 can be easily separated when an element-forming layer is transferred to another substrate later. The first layer 261a is a layer for keeping close contact with the second layer 261b during the manufacturing of the element-forming layer.

The second layer 261b is preferably formed of a metal film including tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or a film including a compound of such metal. The second layer 261b can have a thickness of 20 nm to 40 nm.

Figure 21B:
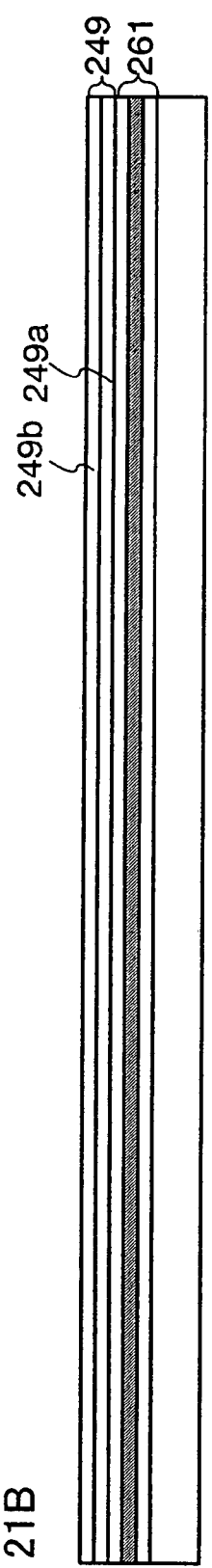

As shown in FIG. 21B, a base insulating layer 249 having a two-layer structure is formed over the peeling layer 261. A first layer 249a is formed of silicon oxynitride ($SiO_xN_y$, x<y) with a thickness of 50 nm by a plasma CVD apparatus using $SiH_4$, $N_2O$, $NH_3$, and $H_2$ as a material gas. The barrier property is increased by setting the composition ratio of nitrogen of the first layer 249a to be 40% or more. The second layer 249b is formed of silicon oxynitride ($SiO_xN_y$, x>y) with a thickness of 100 nm by a plasma CVD apparatus using $SiH_4$ and $N_2O$ as a material gas. The composition ratio of nitrogen of the second layer 249b is set at 0.5% or less.

Figure 21C:
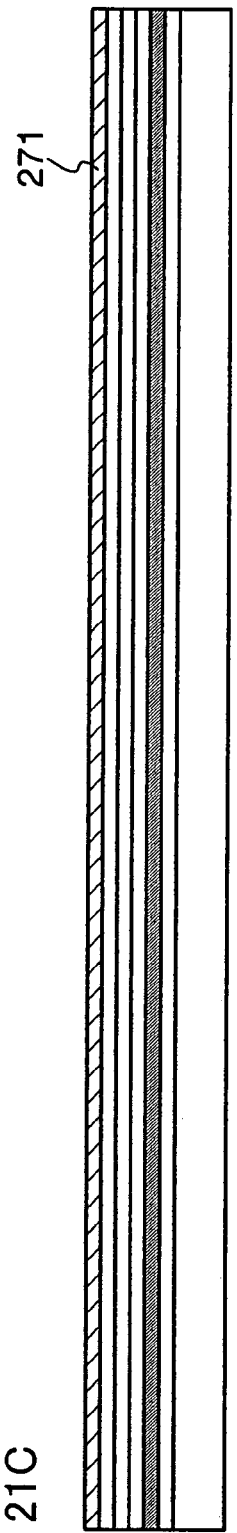

Subsequently, as shown in FIG. 21C, a crystalline silicon film 271 is formed over the base insulating layer 249. The crystalline silicon film 271 is manufactured by the following method. An amorphous silicon film is formed with a thickness of 66 nm by a plasma CVD apparatus using $SiH_4$ and $H_2$ as a material gas. The amorphous silicon film is irradiated with a laser so as to be crystallized; thus, the crystalline silicon film 271 is obtained. An example of a laser irradiation method is shown. A second harmonic (wavelength: 532 nm) of an LD-pumped $YVO_4$ laser is used for the irradiation. It is not necessary to limit to the second harmonic in particular, but the second harmonic is superior to third or higher-order harmonics in point of energy efficiency. An optical system is adjusted so that the beam on the irradiation surface has a linear shape with a length of about 500 μm and a width of about 20 μm and an intensity of 10 to 20 W. The beam is moved relative to the substrate at a speed of 10 to 50 cm/sec.

After forming the crystalline silicon film 271, a p-type impurity is added to the crystalline silicon film 271. Here, diborane ($B_2H_6$) diluted with hydrogen is used as a doping gas in an ion doping apparatus, so that boron is added to the entire crystalline silicon film 271. The crystalline silicon obtained by crystallizing amorphous silicon has a dangling bond; therefore, it is not intrinsic silicon but has a low n-type conductivity. Accordingly, addition of a minute amount of p-type impurities provides an effect of making the amorphous silicon film 271 into intrinsic silicon. This step may be conducted as necessary.

Figure 21D:
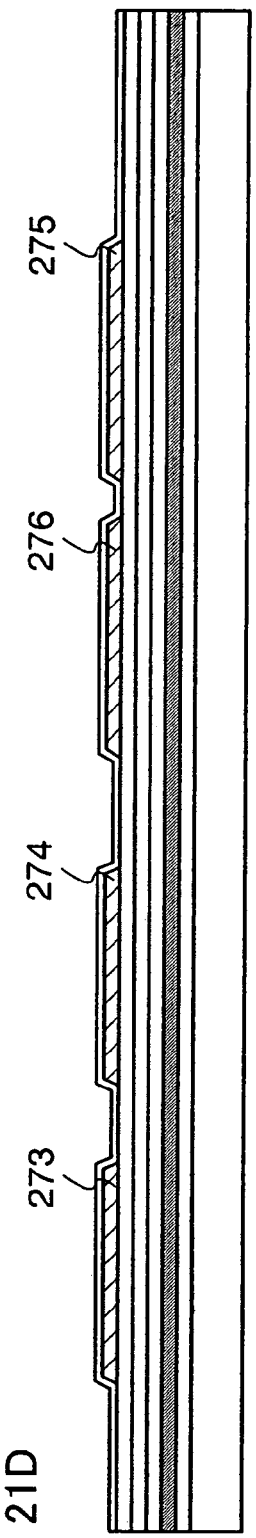

Next, as shown in FIG. 21D, the crystalline silicon film 271 is divided for each element to form semiconductor layers 273 to 276. By the use of the semiconductor layers 273 to 275, channel formation regions, source regions, and drain regions of TFTs are formed. The semiconductor layer 276 forms an electrode of an MIS capacitor. An example of a method for processing the crystalline silicon film 271 is shown. A resist is formed over the crystalline silicon film 271 by a photolithography step, and the crystalline silicon film 271 is etched by using the resist as a mask and using $SF_6$ and $O_2$ as an etchant by a dry etching apparatus; thus, the semiconductor layers 273 to 276 are formed in predetermined shapes.

As shown in FIG. 22A, a resist R31 is formed by a photolithography step and a minute amount of p-type impurities are added to the semiconductor layers 274 and 275 of the n-channel TFTs (see FIGS. 22A to 22D). Here, diborane ($B_2H_6$) diluted with hydrogen is used as a doping gas so that the semiconductor layers 274 and 275 are doped with boron by an ion doping apparatus. The resist R31 is removed after completion of the doping.

The step in FIG. 22A is performed for a purpose of avoiding the threshold voltage of the n-channel TFT becoming negative. Boron may be added to the semiconductor layers 274 and 275 of the n-channel TFTs at a concentration of $5\times10^{15}$ atoms/cm$^3$ to $1\times10^{17}$ atoms/cm$^3$. The step in FIG. 22A may be conducted as necessary.

Next, as shown in FIG. 22B, an insulating film 277 is formed over the entire surface of the substrate 260. The insulating film 277 functions as a gate insulating film for the TFTs and a dielectric for the capacitor. Here, the insulating film 277 is formed by a silicon oxynitride film ($SiO_xN_y$, x>y) with a thickness of 20 nm to 40 nm by a plasma CVD apparatus using. $SiH_4$ and $N_2O$ as a material gas.

As shown in FIG. 22C, a resist R32 is formed by a photolithography step, and an n-type impurity is added to the semiconductor layer 272 of the capacitor. Using phosphine ($PH_3$) diluted with hydrogen as a doping gas, the semiconductor layer 276 is doped with phosphorus by using an ion doping apparatus, and an n-type impurity region 279 is formed over the entire semiconductor layer 276. The resist R32 is removed after completion of the doping step.

As shown in FIG. 22D, a conductive film 281 is formed over the insulating film 277. The conductive film 281 forms a gate electrode of the TFT, and the like. Here, the conductive film 281 has a two-layer structure. A first layer thereof is formed of tantalum nitride (TaN) with a thickness of 30 nm and a second layer thereof is formed of tungsten (W) with a thickness of 370 nm. The tantalum nitride and the tungsten are formed by a sputtering apparatus.

Subsequently, a resist is formed over the conductive film 281 by a photolithography step, and the conductive film 281 is etched by an etching apparatus. Thus, first conductive films 283 to 286 are formed over the semiconductor layers 273 to 276 as shown in FIG. 23A. The first conductive films 283 to 285 serve as gate electrodes or gate wires of the TFTs. In the n-channel TFT of a high withstand voltage type, the conductive film 285 is formed so that the gate width (channel length) is larger than that in the other TFTs. The first conductive film 286 forms one electrode of the capacitor.

The conductive film 281 is etched by a dry etching method. As an etching apparatus, an ICP (Inductively Coupled Plasma) etching apparatus is used. As an etchant, a mixed gas of $Cl_2$, $SF_6$, and $O_2$ is used first in order to etch the tungsten, and then the etchant to be introduced in a process chamber is changed to only a $Cl_2$ gas to etch the tantalum nitride.

As shown in FIG. 23B, a resist R33 is formed by a photolithography step. An n-type impurity is added to the semiconductor layers 274 and 275 of the n-channel TFT. N-type low-concentration impurity regions 288 and 289 are formed in a self-aligning manner in the semiconductor layer 274 by using the first conductive film 284 as a mask, and n-type low-concentration impurity regions 290 and 291 are formed in a self-aligning manner in the semiconductor layer 275 by using the first conductive film 285 as a mask. Phosphine ($PH_3$) diluted with hydrogen is used as a doping gas, and phosphorus is added to the semiconductor layers 274 and 275 by an ion doping apparatus. The step of FIG. 23B is a step for forming an LDD region in the n-channel TFT. The n-type impurity is included in the n-type low-concentration impurity regions 288 and 289 at a concentration of $1\times10^{16}$ atoms/cm$^3$ to $5\times10^{18}$ atoms/cm$^3$.

As shown in FIG. 23C, a resist R34 is formed by a photolithography step, and a p-type impurity is added to the semiconductor layer 273 of the p-channel TFT. Since a part of the semiconductor layer which remains as an n-type impurity region is covered with the resist R34, the exposed semiconductor layer 273 becomes a p-type impurity region. P-type high-concentration impurity regions 273a and 273b are formed in a self-aligning manner in the semiconductor layer 273 by using the first conductive film 283 as a mask. A region 273c covered with the first conductive film 283 is formed in a self-aligning manner as the channel formation region. Doping of the p-type impurity region uses diborane ($B_2H_6$) diluted with hydrogen as a doping gas. The resist R34 is removed after completion of the doping.

As shown in FIG. 23D, insulating layers 293 to 296 are formed on the side surfaces of the first conductive films 283 to 286. The insulating layers 293 to 296 are called sidewalls or side walls. First, a silicon oxynitride film ($SiO_xN_y$, x>y) is to have a thickness of 100 nm by a plasma CVD apparatus using $SiH_4$ and $N_2O$ as a material gas. Subsequently, a silicon oxide film is formed to have a thickness of 200 nm by an LPCVD apparatus using $SiH_4$ and $N_2O$ as a material gas. A resist is formed by a photolithography step. First, using this resist, the silicon oxide film of an upper layer is subjected to a wet etching treatment with buffered hydrochloric acid. Next, the resist is removed, and by subjecting the silicon nitride oxide film of a lower layer to a dry etching treatment, the insulating layers 293 to 296 are formed. In accordance with a sequence of these steps, the insulating film 277 formed of silicon oxynitride is also etched and the insulating film 277 is left only under the first conductive films 283 to 286 and the insulating layers 293 to 296.

As shown in FIG. 24A, a resist R35 is formed by a photolithography step. An n-type impurity is added to the semiconductor layers 274 and 275 of the n-channel TFTs and the semiconductor layer of the capacitor, thereby forming n-type high-concentration impurity regions. In the semiconductor layer 274, the n-type impurity is further added to the n-type low-concentration impurity regions 288 and 289 by using the first conductive film 284 and the insulating layer 294 as masks, thereby forming n-type high-concentration impurity regions 274a and 274b in a self-aligning manner. A region 274c overlapping with the first conductive film 284 is determined as a channel formation region in a self-aligning manner. In addition, regions 274e and 274d of the n-type low-concentration impurity regions 288 and 289 that overlap with the insulating layer 294 remain as n-type low-concentration impurity regions. Similarly to the semiconductor layer 274, n-type high-concentration impurity regions 275a and 275b, a channel formation region 275c, and n-type low-concentration impurity regions 275e and 275d are formed in the semiconductor film 275. Also, an n-type impurity is further added to the n-type impurity region 279 by using the first conductive film 286 and the insulating layer 296 as masks, thereby forming n-type high-concentration impurity regions 276a and 276b in a self-aligning manner. A region of the semiconductor layer 276 that overlaps with the first conductive film 286 and the insulating layer 296 is determined as an n-type impurity region 276c.

In the step of adding the n-type impurity, as aforementioned, an ion doping apparatus may be used and phosphine ($PH_3$) diluted with hydrogen may be used as a doping gas. The n-type high-concentration impurity regions 274a, 274b, 275a, and 275b of the n-channel TFTs are doped with phosphorus so that the concentration of phosphorus ranges from $1 \times 10^{20}$ atoms/cm$^3$ to $2 \times 10^{21}$ atoms/cm$^3$.

The resist R35 is removed to form a cap insulating film 298 as shown in FIG. 24B. The cap insulating film 298 is formed with a silicon oxynitride film ($SiO_xN_y$, x>y) to have a thickness of 50 nm by a plasma CVD apparatus. $SiH_4$ and $N_2O$ are used as a material gas to form the silicon oxynitride film. After forming the cap insulating film 298, heat treatment is performed in a nitrogenous atmosphere of 550° C. to activate the n-type impurity and the p-type impurity added in the semiconductor layers 273 to 276.

As shown in FIG. 24C, a first interlayer insulating film 300 is formed. In this embodiment, the first interlayer insulating film 300 has a two-layer structure. An insulating film of a first layer is formed of silicon oxynitride ($SiO_xN_y$, x<y) with a thickness of 100 nm by a plasma CVD apparatus using $SiH_4$ and $N_2O$ as a material gas. An insulating film of a second layer is formed of silicon oxynitride ($SiO_xN_y$, x>y) with a thickness of 600 nm by using $SiH_4$, $N_2O$, $NH_3$, and $H_2$ as a material gas by a plasma CVD apparatus.

Part of the first interlayer insulating film 300 and the cap insulating film 298 are removed by a photolithography step and a dry etching step, thereby forming contact holes. A conductive film is formed over the first interlayer insulating film 300. Here, the conductive film is formed to have a four-layer structure in which Ti, TiN, pure aluminum, and Ti with a thickness of 60 nm, 40 nm, 500 nm, and 100 nm, respectively, are stacked in order from the bottom. These layers are formed by a sputtering apparatus. The conductive film is processed into a predetermined shape by a photolithography step and a dry etching step, thereby forming second conductive films 303 to 314.

Although the second conductive films and the first conductive films are connected to each other over the semiconductor layer in the drawing in order to explain the connection between the second conductive films and the first conductive films, in practice, the contact portion between the second conductive films and the first conductive films is formed so as to avoid the semiconductor layer.

The n-type high-concentration impurity regions 276a and 276b are connected to each other by the second conductive film 312. Accordingly, an MIS capacitor of a stacked-layer structure including the n-type impurity region 276c, the insulating film 277, and the first conductive film 285 is formed. The second conductive film 314 forms a terminal of an antenna circuit, to which an antenna 322 is connected in a later step.

As shown in FIG. 25A, a second interlayer insulating film 316 is formed. In the second interlayer insulating film 316, contact holes reaching the second conductive films 302 and 316 are formed. An example of forming the second interlayer insulating film 316 using photosensitive polyimide is shown. Polyimide is applied to have a thickness of 1.5 µm by using a spinner. The polyimide is light-exposed by a photolithography step and developed, thereby forming polyimide having the contact holes therein. After the development, the polyimide is baked.

Further, a conductive film is formed over the second interlayer insulating film 316. This conductive film is processed into a predetermined shape by a photolithography step and an etching step, thereby forming a third conductive film 320. The conductive film that forms the third conductive film 320 is formed of Ti to have a thickness of 100 nm by a sputtering apparatus. The third conductive film 320 serves as a bump of the antenna for connecting the antenna 322 with the terminal (second conductive film 314) of the antenna circuit.

As shown in FIG. 25B, a third interlayer insulating film 321 having an open portion is formed. Here, the third interlayer insulating film 321 is formed of photosensitive polyimide by a similar method to the method for forming the second interlayer insulating film 316. The open portion is formed in a region where the antenna 322 is formed.

As shown in FIG. 25B, the antenna 322 is formed. The antenna 322 with a predetermined shape is formed in the open portion by evaporating aluminum using a metal mask with the use of an evaporation apparatus.

Figure 26:
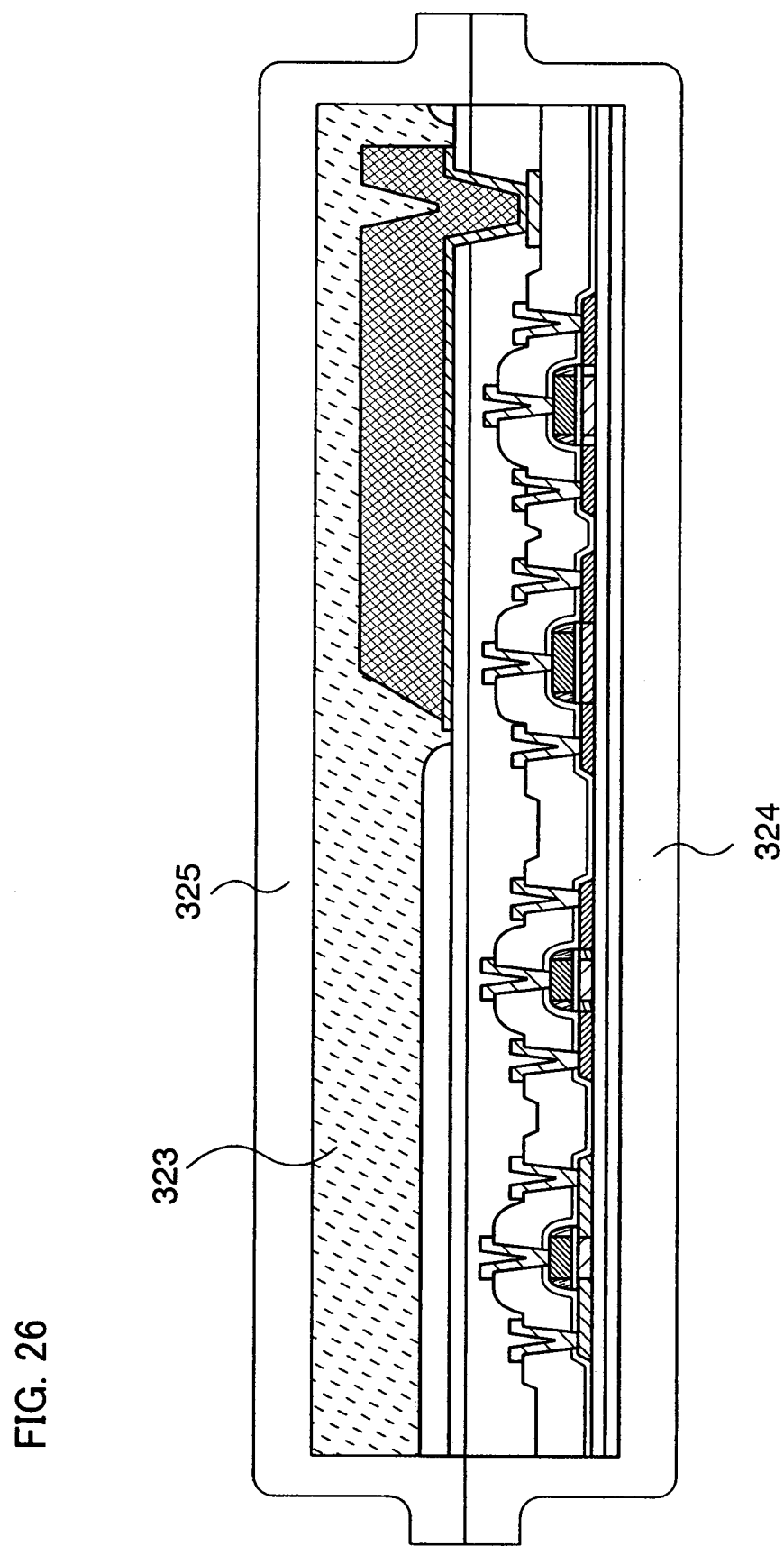
FIG. 26 is a cross-sectional diagram for describing a manufacturing step of a wireless chip of the present invention.
Figure 27A:
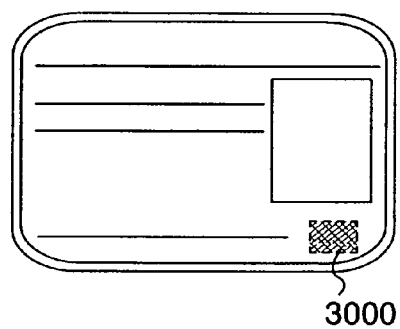
FIGS. 27A to 27F are diagrams for describing usage modes of a wireless chip of the present invention.
Figure 27B:
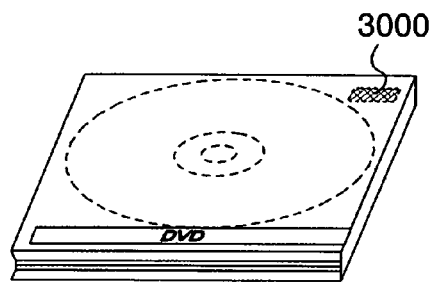
Figure 27C:
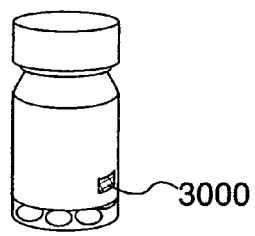
Figure 27D:
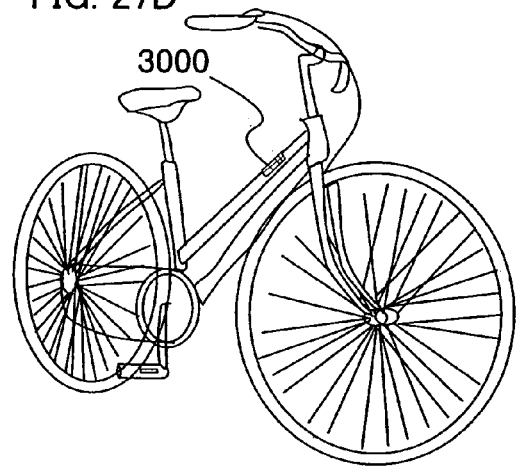
Figure 27E:
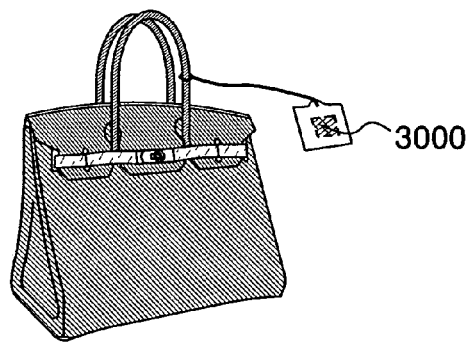
Figure 27F:
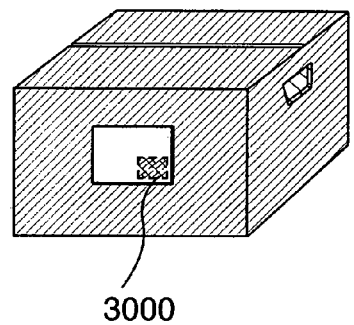

Through the steps shown in FIGS. 21A to 25B, a circuit forming a wireless chip is formed over the substrate 260. Next, a step in which the wireless chip is sealed in between the substrate 260 and a flexible substrate as shown in FIG. 26 is described.

A protective insulating layer 323 for protecting the antenna 322 is formed. Then, the insulating films stacked over the substrate 260 is removed together with the protective insulating layer 323 by a photolithography step and an etching step or by laser irradiation, thereby forming open portions that reach the peeling layer 261. A plurality of the same circuits forming a plurality of wireless chips are formed over the substrate 260. The circuits are formed so that the circuits are separated from each other for every wireless chip.

Subsequently, after temporarily fixing the substrate for transfer onto the protective insulating layer 323, the substrate 260 is peeled off. Since the bond of the second layer 261b and the third layer 261c of the peeling layer 261 at the interface therebetween is weak, the peeling progresses from the end of the open portion by applying physical force, thereby peeling the substrate 260 from the element-forming layer 250. The base insulating layer 249 from which the substrate 260 has been peeled is fixed to the flexible substrate 324 with an adhesive. Then, the substrate for the transfer is detached. Another flexible substrate 325 is fixed to the protective insulating layer 323 with the adhesive. Then, by performing heat treatment while applying pressure from the outside of the flexible substrates 324 and 325, a circuit forming a wireless chip is sealed by the flexible substrate 324 and the flexible substrate 325.

Although an example of forming the antenna 322 with a thin film transistor is described in this embodiment, an external antenna can also be used as in Embodiment 5.

Also, although an example of peeling the substrate 260 used during manufacturing is described in this embodiment, the substrate used during manufacturing can be left. In this case, the substrate may be thinned by polishing or grinding so that substrate bends.

According to this embodiment, a thin and light-weight wireless chip that can be bent can be manufactured. Note that, the peeling method of a substrate described in this embodiment is not limited to a manufacturing method of a wireless chip, and by applying it to another semiconductor device, a semiconductor device that can be bent can be formed.

EMBODIMENT 8

With reference to FIGS. 27A to 27F, use of a semiconductor device 3000 that functions as the wireless chip described in the above embodiment is described.

A wireless chip can be applied to a wide range of purposes. For example, the wireless chip can be attached to bank notes, coins, documents of value, bearer bonds, identification certificates (such as a driver's license or a residence card, refer to FIG. 27A), pack cases (such as package paper or a bottle, refer to FIG. 27C), recording media (such as DVD software or a video tape, refer to FIG. 27B), vehicles (such as a bicycle, refer to FIG. 27D), personal belongings (such as a bag or glasses), foods, plants, animals, human bodies, clothes, general merchandise, products such as electronic appliances, luggage tags (refer to FIGS. 27E and 27F), and the like. The electronic appliances include a liquid crystal display device, an EL display device, a television device (also referred to as a TV, a TV receiver, or a television receiver), a mobile phone, and the like.

The semiconductor device 3000 of the present invention has a memory element of the present invention and is fixed to a product by mounting the device onto a printed board, attaching the device to a surface of the product, or embedding the device inside the product. For example, if the product is a book, the device is fixed to the book by embedding the device inside paper, and if the product is a package made of an organic resin, the device is fixed to the package by embedding the device inside the organic resin. Since the semiconductor device 3000 of the present invention can be compact, thin, and lightweight, it does not degrade the quality of design even after the device is fixed to a product. When the semiconductor device 3000 of the present invention is provided to bank notes, coins, documents of value, bearer bonds, identification certificates, and the like, an authentication function can be provided. With the use of this authentication function, the forgery can be prevented. Further, when the semiconductor device of the present invention is attached to pack cases, recording media, personal belongings, foods, clothes, general merchandise, electronic appliances, and the like, systems such as an inspection system can be made efficient.

This application is based on Japanese Patent Application serial no. 2006-145970 filed in Japan Patent Office on May 25 in 2006, the entire contents of which are hereby incorporated by reference.

The invention claimed is:

1. A semiconductor device comprising:
a memory;
a memory input bus signal line through which a signal is input to the memory; and
a memory output bus signal line through which a signal from the memory is output,
wherein the memory comprises:
a first memory block, a second memory block, a third memory block and a fourth memory block each of which comprises a plurality of memory cells;
a control circuit comprising an operation control circuit, an input signal control circuit, and an output signal control circuit,
wherein the operation control circuit selects one of the memory blocks to be operated,
wherein the input signal control circuit generates a signal input to the one of the memory blocks,
wherein the output signal control circuit selects an output from the one of the memory blocks and outputs a signal based on the obtained signal from the one of the memory blocks,
wherein the second memory block is placed to be axisymmetric to the first memory block with respect to a vertical axis and is placed to be axisymmetric to the fourth memory block with respect to a horizontal axis,
wherein the third memory block is placed to be axisymmetric to the fourth memory block with respect to a vertical axis and is placed to be axisymmetric to the first memory block with respect to a horizontal axis, and
wherein the first memory block is placed to be axisymmetric to the third memory block with respect to a horizontal axis.

2. The semiconductor device according to claim 1, wherein the memory comprises a thin film transistor having as an active layer a semiconductor thin film formed over a substrate with an insulating surface.

3. The semiconductor device according to claim 2, wherein the substrate having the insulating surface is any of a glass substrate, a quartz substrate, and a plastic substrate.

4. The semiconductor device according to claim 1, wherein the semiconductor device is formed using an SOI substrate.

5. A semiconductor device comprising:
a memory;
a memory input bus signal line through which a signal is input to the memory; and
a memory output bus signal line through which a signal from the memory is output,
wherein the memory comprises:
a first memory block, a second memory block, a third memory block and a fourth memory block each of which comprises a plurality of memory cells;
a control circuit comprising an operation control circuit, an input signal control circuit, and an output signal control circuit,
wherein the operation control circuit selects one of the memory blocks to be operated,
wherein the input signal control circuit generates a signal input to the one of the memory blocks,
wherein the output signal control circuit selects an output from the one of the memory blocks and outputs a signal based on the obtained signal from the one of the memory blocks,
wherein the second memory block is placed to be axisymmetric to the first memory block with respect to a vertical axis and is placed to be axisymmetric to the fourth memory block with respect to a horizontal axis,
wherein the third memory block is placed to be axisymmetric to the fourth memory block with respect to a vertical axis and is placed to be axisymmetric to the first memory block with respect to a horizontal axis,
wherein the first memory block is placed to be axisymmetric to the third memory block with respect to a horizontal axis, and
wherein each of the memory cells comprises one selected from the group consisting of an SRAM and a mask ROM.

6. The semiconductor device according to claim 5, wherein the memory comprises a thin film transistor having as an active layer a semiconductor thin film formed over a substrate with an insulating surface.

7. The semiconductor device according to claim 6, wherein the substrate having the insulating surface is any of a glass substrate, a quartz substrate, and a plastic substrate.

8. The semiconductor device according to claim 5, wherein the semiconductor device is formed using an SOI substrate.

9. A semiconductor device comprising:
a memory;
a memory input bus signal line through which a signal is input to the memory; and
a memory output bus signal line through which a signal from the memory is output,
wherein the memory comprises:
  a first memory block, a second memory block, a third memory block and a fourth memory block each of which comprises a plurality of memory cells;
  a control circuit comprising an operation control circuit, an input signal control circuit, and an output signal control circuit; and
  a plurality of memory block input bus lines and a plurality of memory block output bus lines each of which connects one of the memory blocks and the control circuit,
wherein the operation control circuit selects one of the memory blocks to be operated,
wherein the input signal control circuit generates a signal input to the one of the memory blocks,
wherein the output signal control circuit selects an output from the one of the memory blocks and outputs a signal based on the obtained signal from the one of the memory blocks,
wherein the plurality of memory block input bus lines and the plurality of memory block output bus lines have substantially the same length,
wherein the second memory block is placed to be axisymmetric to the first memory block with respect to a vertical axis and is placed to be axisymmetric to the fourth memory block with respect to a horizontal axis,
wherein the third memory block is placed to be axisymmetric to the fourth memory block with respect to a vertical axis and is placed to be axisymmetric to the first memory block with respect to a horizontal axis, and
wherein the first memory block is placed to be axisymmetric to the third memory block with respect to a horizontal axis.

10. The semiconductor device according to claim 9, wherein the memory comprises a thin film transistor having as an active layer a semiconductor thin film formed over a substrate with an insulating surface.

11. The semiconductor device according to claim 10, wherein the substrate having the insulating surface is any of a glass substrate, a quartz substrate, and a plastic substrate.

12. The semiconductor device according to claim 9, wherein the semiconductor device is formed using an SOI substrate.

* * * * *